(12) United States Patent
Matsuo et al.

(10) Patent No.: US 9,450,108 B2
(45) Date of Patent: *Sep. 20, 2016

(54) NONVOLATILE SEMICONDUCTOR MEMORY DEVICE PROVIDED WITH CHARGE STORAGE LAYER IN MEMORY CELL

(71) Applicant: Kabushiki Kaisha Toshiba, Minato-ku (JP)

(72) Inventors: Kazuhiro Matsuo, Yokkaichi (JP); Masayuki Tanaka, Yokohama (JP); Takeo Furuhata, Takarazuka (JP); Koji Nakahara, Ama-gun (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/697,121

(22) Filed: Apr. 27, 2015

(65) Prior Publication Data

US 2015/0228662 A1 Aug. 13, 2015

Related U.S. Application Data

(63) Continuation of application No. 14/273,162, filed on May 8, 2014, now Pat. No. 9,142,685, which is a continuation of application No. 13/207,149, filed on Aug. 10, 2011, now Pat. No. 8,742,487, which is a continuation of application No. 12/333,983, filed on Dec. 12, 2008, now Pat. No. 8,008,707.

(30) Foreign Application Priority Data

Dec. 14, 2007 (JP) ................................. 2007-323317
Jan. 17, 2008 (JP) ................................. 2008-008301
May 14, 2008 (JP) ................................. 2008-127125
May 26, 2008 (JP) ................................. 2008-136568

(51) Int. Cl.
*H01L 29/792* (2006.01)
*H01L 27/115* (2006.01)
(Continued)

(52) U.S. Cl.
CPC ........... *H01L 29/792* (2013.01); *H01L 27/115* (2013.01); *H01L 27/11521* (2013.01); *H01L 27/11568* (2013.01); *H01L 29/513* (2013.01); *H01L 29/7881* (2013.01)

(58) Field of Classification Search
CPC . H01L 27/115; H01L 29/513; H01L 29/792; G11C 16/0466
USPC ................................. 257/316–318, 321, 324
See application file for complete search history.

(56) References Cited

U.S. PATENT DOCUMENTS 6,784,508 B2   8/2004   Tsunashima et al.
6,933,218 B1   8/2005   Lee et al.
(Continued)

FOREIGN PATENT DOCUMENTS

JP   H04-257226   9/1992
JP   5-129625     5/1993
(Continued)

OTHER PUBLICATIONS

Notification of Reasons for Refusal issued in Japanese Patent Application No. 2008-127125 mailed on Oct. 26, 2012 (with English translation).

(Continued)

*Primary Examiner* — Thomas L Dickey
(74) *Attorney, Agent, or Firm* — Oblon, McClelland, Maier & Neustadt, L.L.P.

(57) ABSTRACT

A nonvolatile semiconductor memory device includes a semiconductor portion, a first oxygen-containing portion provided on the semiconductor portion, a silicon-containing portion provided on the first oxygen-containing portion, a first film provided on the silicon-containing portion and including a lamination of a first portion containing silicon and oxygen and a second portion containing silicon and nitrogen, a first high dielectric insulating portion provided on the first film and having an oxide-containing yttrium, hafnium or aluminum, a second oxygen-containing portion provided on the first high dielectric insulating portion, a second high dielectric insulating portion provided on the second oxygen-containing insulating portion and having an oxide-containing yttrium, hafnium or aluminum, a third oxygen-containing portion provided on the second high dielectric insulating portion, and a second film provided on the third oxygen-containing portion.

2 Claims, 51 Drawing Sheets

(51) Int. Cl.
*H01L 29/51* (2006.01)
*H01L 29/788* (2006.01)

(56) References Cited

U.S. PATENT DOCUMENTS

| | | |
|---|---|---|
| 7,414,285 B2 | 8/2008 | Akahori et al. |
| 7,547,942 B2 | 6/2009 | Jeon et al. |
| 7,696,552 B2 | 4/2010 | Youn et al. |
| 7,910,446 B2 | 3/2011 | Ma et al. |
| 8,008,152 B2 | 8/2011 | Fujitsuka et al. |
| 8,742,487 B2 | 6/2014 | Matsuo et al. |
| 9,142,685 B2 * | 9/2015 | Matsuo ............... H01L 27/115 |
| 2006/0255396 A1 | 11/2006 | Nara |
| 2006/0284235 A1 | 12/2006 | Forbes |
| 2007/0004154 A1 | 1/2007 | Hong et al. |
| 2007/0029601 A1 | 2/2007 | Orimoto et al. |
| 2007/0045718 A1 | 3/2007 | Bhattacharyya |
| 2007/0051998 A1 | 3/2007 | Kil et al. |
| 2007/0075357 A1 | 4/2007 | Tanaka et al. |
| 2007/0235799 A1 | 10/2007 | Tanaka et al. |
| 2007/0241360 A1 | 10/2007 | Slater, Jr. et al. |
| 2007/0241389 A1 | 10/2007 | Ozawa et al. |
| 2007/0241390 A1 | 10/2007 | Tanaka et al. |
| 2007/0249125 A1 | 10/2007 | Lee et al. |
| 2008/0006871 A1 | 1/2008 | Liao |
| 2008/0087937 A1 | 4/2008 | Akahori et al. |
| 2008/0116506 A1 | 5/2008 | Lue |
| 2009/0020802 A1 | 1/2009 | Ma et al. |
| 2009/0057749 A1 | 3/2009 | Gomikawa et al. |
| 2009/0242957 A1 | 10/2009 | Ma et al. |

FOREIGN PATENT DOCUMENTS

| | | |
|---|---|---|
| JP | 2003-289114 | 10/2003 |
| JP | 2004-363329 | 12/2004 |
| JP | 2006-086525 | 3/2006 |
| JP | 2007-73926 | 3/2007 |
| JP | 2007-287859 | 11/2007 |
| JP | 2007-305966 | 11/2007 |
| JP | 2008-098510 | 4/2008 |
| JP | 2008-118144 | 5/2008 |
| JP | 2009-021608 | 1/2009 |
| JP | 2009-054942 | 3/2009 |
| JP | 2010-080646 | 4/2010 |

OTHER PUBLICATIONS

Notification of Reasons for Refusal issued in Japanese Patent Application No. 2008-136568 mailed on Oct. 15, 2013 (with English translation).
Notification of Reasons for Refusal mailed on Feb. 5, 2013 in corresponding Japanese Patent Application No. 2008-136568 (English language translation only).
Notification of Reasons for Refusal mailed on Feb. 22, 2013 in corresponding Japanese Patent Application No. 2008-127125 (English language translation only).
Office Action issued Jun. 26, 2012 in Japanese Application No. 2008-008301 (English Translation).

* cited by examiner

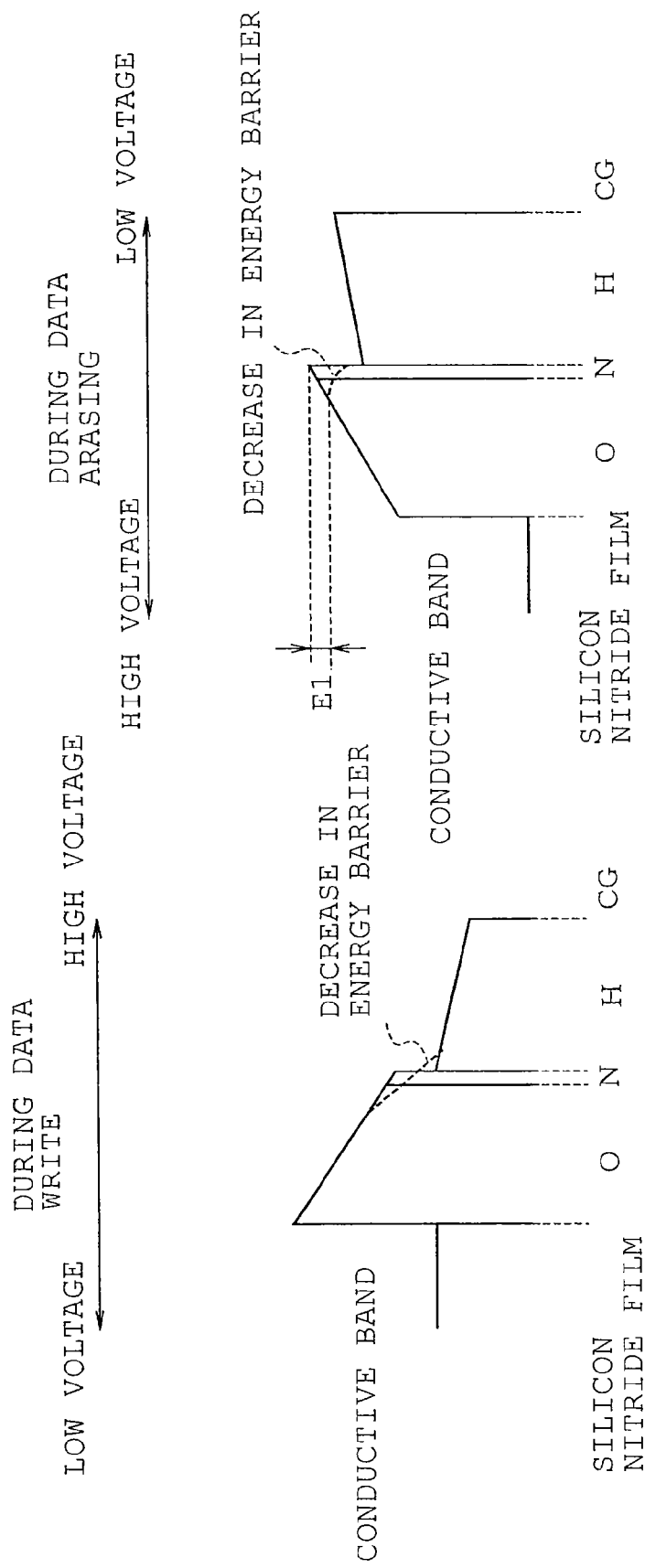

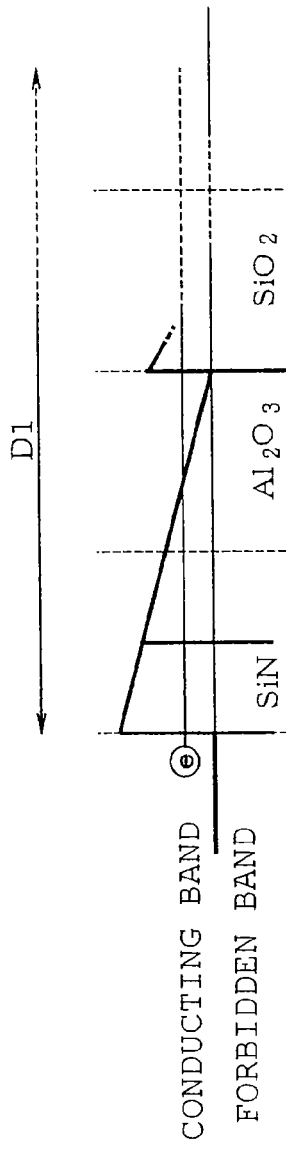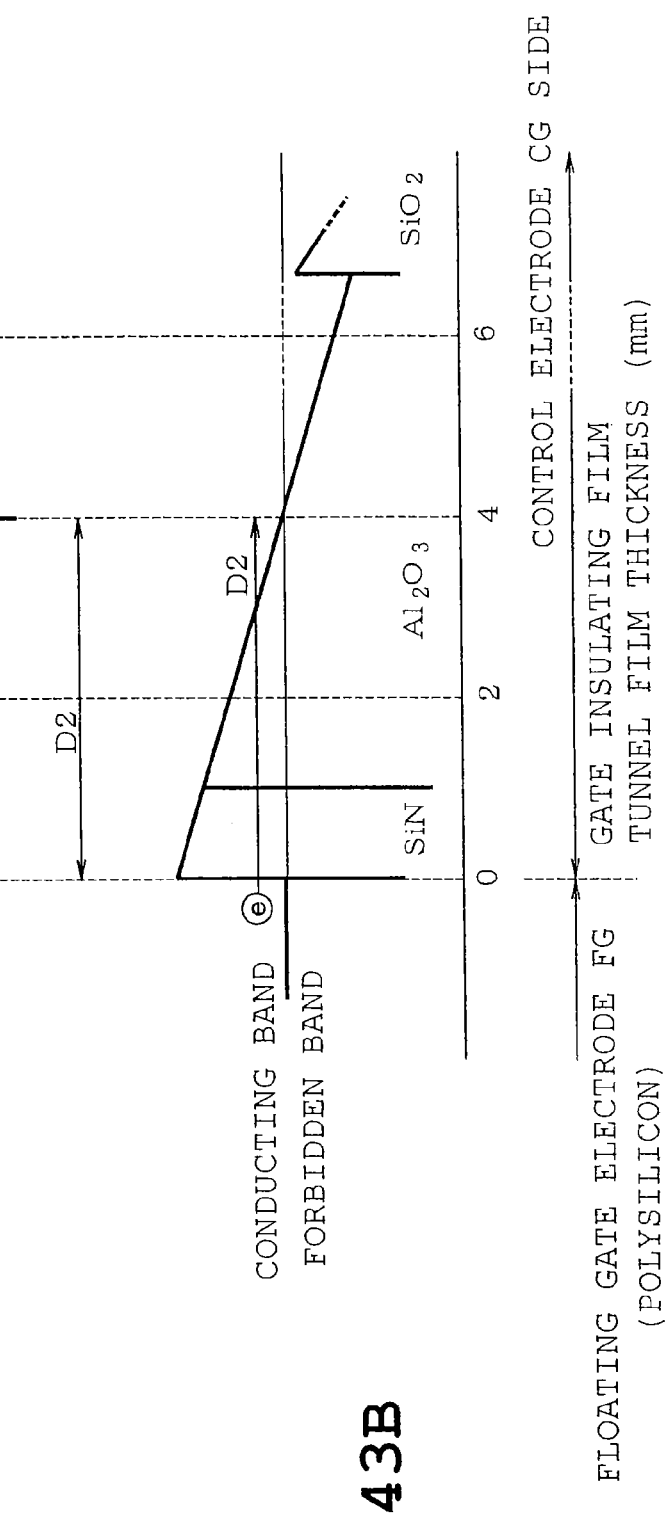
FIG. 43A
FIG. 43B

NONVOLATILE SEMICONDUCTOR MEMORY DEVICE PROVIDED WITH CHARGE STORAGE LAYER IN MEMORY CELL

CROSS-REFERENCE TO RELATED APPLICATIONS

This application is a continuation of U.S. Ser. No. 14/273,162 filed May 8, 2014 which is a continuation of U.S. Ser. No. 13/207,149 filed Aug. 10, 2011, now U.S. Pat. No. 8,742,487. U.S. Ser. No. 13/207,149 is a continuation of U.S. Ser. No. 12/333,983 filed Dec. 12, 2008, now U.S. Pat. No. 8,008,707, claims priority under 35 U.S.C. §119 to Japanese Application Nos. 2007-323317, filed on Dec. 14, 2007, 2008-8301, filed on Jan. 17, 2008, 2008-127125, filed on May 14, 2008, and 2008-136568, filed on May 26, 2008, the entire contents of all of which are incorporated herein by reference.

BACKGROUND OF THE INVENTION

1. Field of the Invention

The present invention relates to a nonvolatile semiconductor memory device including a memory cell in which a charge storage layer and a control gate electrode are configured with an intergate insulating film being interposed therebetween and a method of fabricating the same.

2. Description of the Related Art

A conventional nonvolatile semiconductor memory device comprises a number of memory cells arranged in directions of word lines and bit lines for the purpose of achieving a higher degree of integration. With a recent tendency of higher integration, reductions have been outstanding in a width and length of a memory cell and intervals between adjacent memory cells, whereupon interference is increased between the adjacent cells. An increase in the interference between the adjacent cells results in malfunction of elements and a reduction in a writing/erasing speed.

In order that the interference between adjacent cells may be reduced, a parasitic capacitance between the adjacent cells needs to be reduced, and a facing area of the adjacent cells needs to be reduced, and a height of charge storage layer needs to be reduced. A reduction in the height of the charge storage layer results in a reduction in a coupling ratio that is an index representative of a memory characteristic. In view of this problem, for example, Japanese patent application publication, JP-A-2003-289114 discloses a semiconductor storage device in which a control gate electrode layer is formed so as to face a sidewall of the charge storage layer with an intergate insulating film being interposed therebetween while the height of the charge storage layer is adjusted to a suitable low value, whereby the coupling ratio is improved. Furthermore, when an electrical thickness of the intergate insulating film is reduced, a capacity value between the charge storage layer and the control gate electrode layer can be increased, whereupon a desired value of coupling ratio can be ensured.

However, an electric field applied to an intergate insulating film is increased as the intergate insulating film is thinned. Accordingly, when a high electric field is applied to the intergate insulating film during writing and/or erasing, a leak current of the intergate insulating film is increased to a value substantially equal to a current flowing into a tunnel insulating film. As a result, since the cumulative electron dose is saturated in a charge storage layer, a threshold of memory cell transistor is saturated in a high threshold region.

In order that a capacity value between a control electrode and the charge storage layer may be increased in the nonvolatile semiconductor storage device, for example, Japanese patent application publication, JP-A-H05-129625 proposes provision of a high dielectric insulating film between the control electrode and the charge storage layer. However, sufficient research has not conventionally been made about the insulating film provided between the control electrode and the charge storage layer.

BRIEF SUMMARY OF THE INVENTION

According to one aspect of the invention, a nonvolatile semiconductor memory device includes a semiconductor portion. A first oxygen-containing portion is provided on the semiconductor portion. A silicon-containing portion is provided on the first oxygen-containing portion. A first film is provided on the silicon-containing portion and includes a lamination of a first portion containing silicon and oxygen and a second portion containing silicon and nitrogen. A first high dielectric insulating portion is provided on the first film and has an oxide-containing yttrium, hafnium or aluminum. A second oxygen-containing portion is provided on the first high dielectric insulating portion. A second high dielectric insulating portion is provided on the second oxygen-containing insulating portion and has an oxide-containing yttrium, hafnium or aluminum. A third oxygen-containing portion is provided on the second high dielectric insulating film. A second film is provided on the third oxygen-containing portion.

BRIEF DESCRIPTION OF THE DRAWINGS

In the accompanying drawings:

FIGS. 6A and 6B show energy band models during data write and data erasing respectively;

FIGS. 43A and 43B schematically show band models of the floating gate electrode in the intergate insulating film (Nos. 1 and 2);

DETAILED DESCRIPTION OF THE INVENTION

Figure 1:
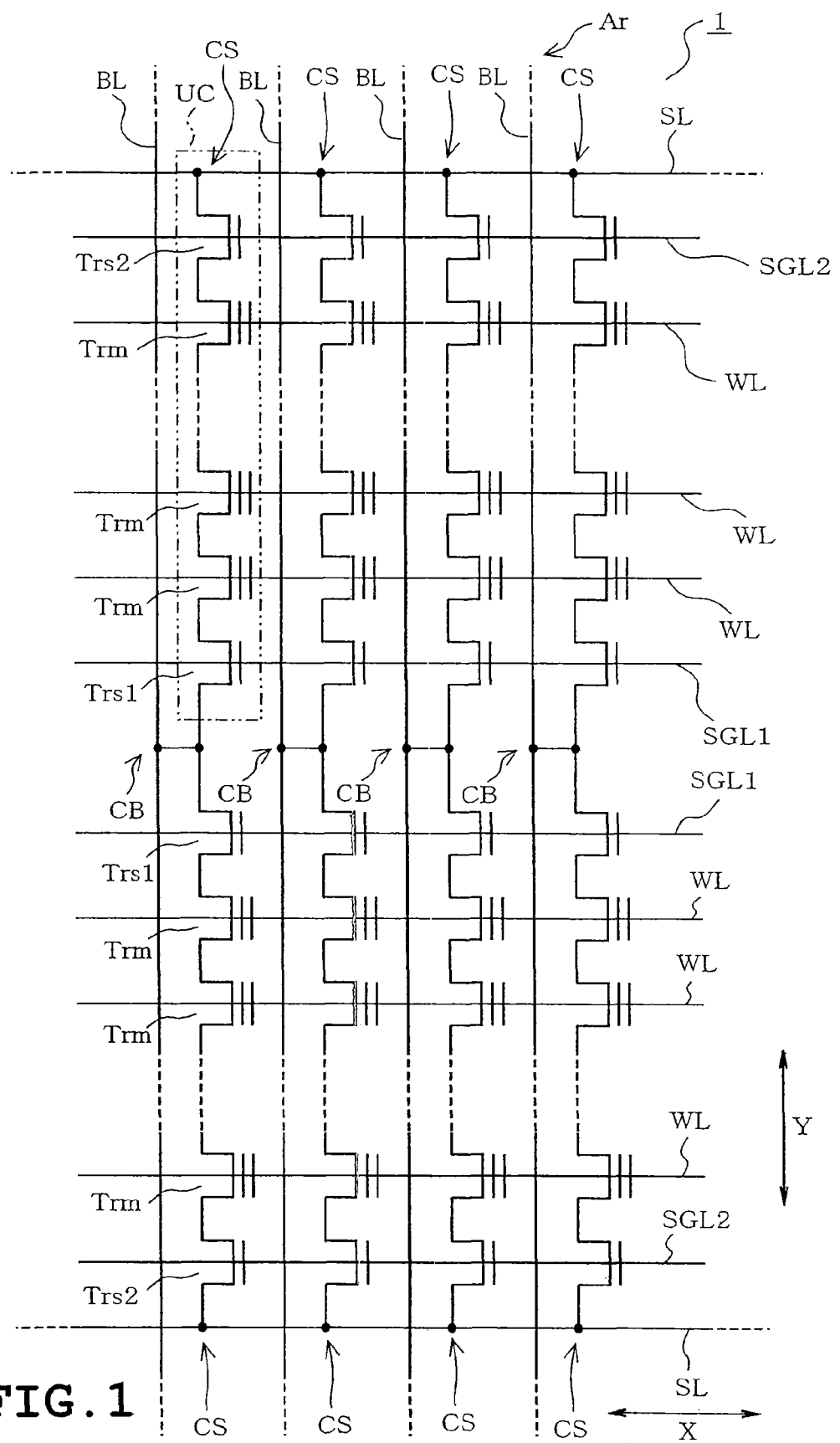
FIG. 1 shows an electrical arrangement of a nonvolatile semiconductor memory device of one embodiment in accordance with the present invention.

A first embodiment of the present invention will be described with reference to FIGS. 1 to 14. In the following description, identical or similar parts are labeled by the same reference numerals throughout the embodiments. The drawings typically illustrate the invention, and the relationship between a thickness and plane dimension, layer thickness ratio and the like differ from natural size.

Referring to FIG. 1, an equivalent circuit of a part of a memory cell array Ar of a NAND flash memory 1 of the embodiment is shown. The memory cell array Ar includes a number of NAND cell units UC arranged in rows and columns. Each NAND cell unit UC includes two selective gate transistors Trs1 and Trs2 and a plurality of, for example, 32 memory cell transistors Trm series-connected between the selective gate transistors Trs1 and Trs2. The memory cell transistors Trm adjacent to each other have commonly used source/drain regions respectively.

The memory cell transistors Trm aligned in the X direction (word line direction or channel width direction) are connected commonly to a word line (a control gate line) WL. The selective gate transistors Trs1 aligned in the X direction in FIG. 1 are connected to a common selective gate line SGL1. Furthermore, the selective gate transistors Trs2 are connected to a common selective gate line SGL2. The selective gate transistors Trs2 are connected via bit line contacts CB (see FIG. 2) to bit lines BL extending in the Y direction (a bit line direction or a channel length direction) perpendicular to the X direction as shown in FIG. 1.

Figure 2:
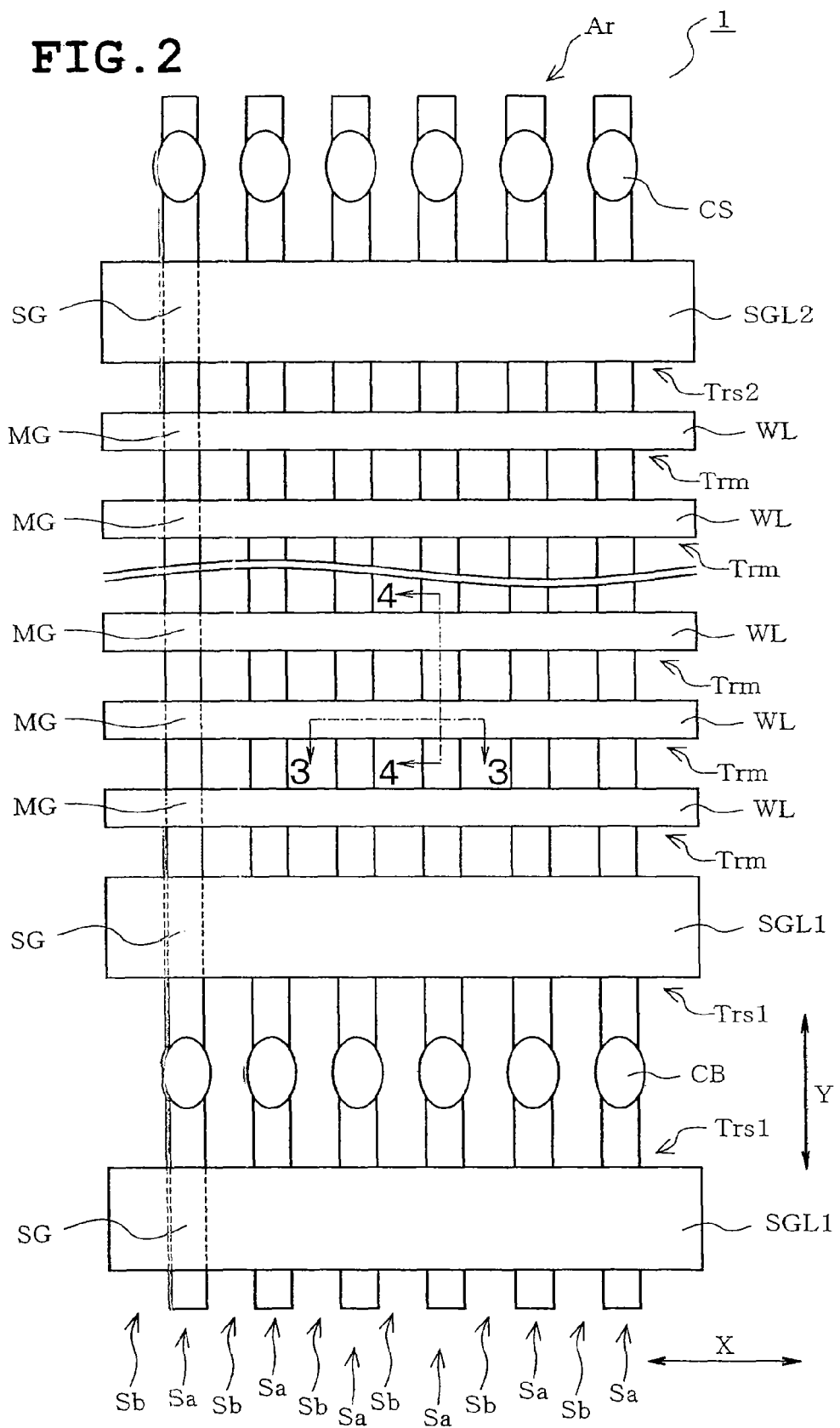
FIG. 2 is a schematic plan view showing a layout pattern of part of structure of a memory cell region.

Referring now to FIG. 2, the NAND cell units UC are formed in and on a plurality of active areas Sa isolated by element isolation regions Sb extending in the Y direction and having a shallow isolation trench (STI) structure. Each memory cell transistor Trm has a gate electrode MG formed in an area where the active area Sa extending in the Y direction intersects each word line WL which is formed at predetermined intervals so as to extend in the X direction. Each word line is configured by connecting the gate electrodes MG (control electrodes CG in FIG. 3; and gate electrode) to one another in the X direction.

Each selective gate transistor Trs1 has a gate electrode SG formed in an area where the active area Sa extending in the Y direction intersects each selective gate line SGL1 extending in the X direction. Each selective gate line SGL1 is configured by connecting selective gate electrodes SG of the selective gate transistor Trs1 to one another in the X direction. Each selective gate transistor Trs2 has a gate electrode SG formed in an area where the active area Sa extending in the Y direction intersects each selective gate line SGL2 extending in the X direction. Each selective gate line SGL2 is configured by connecting the selective gate electrodes SG of the selective gate transistor Trs2 to one another in the X direction.

Figure 3:
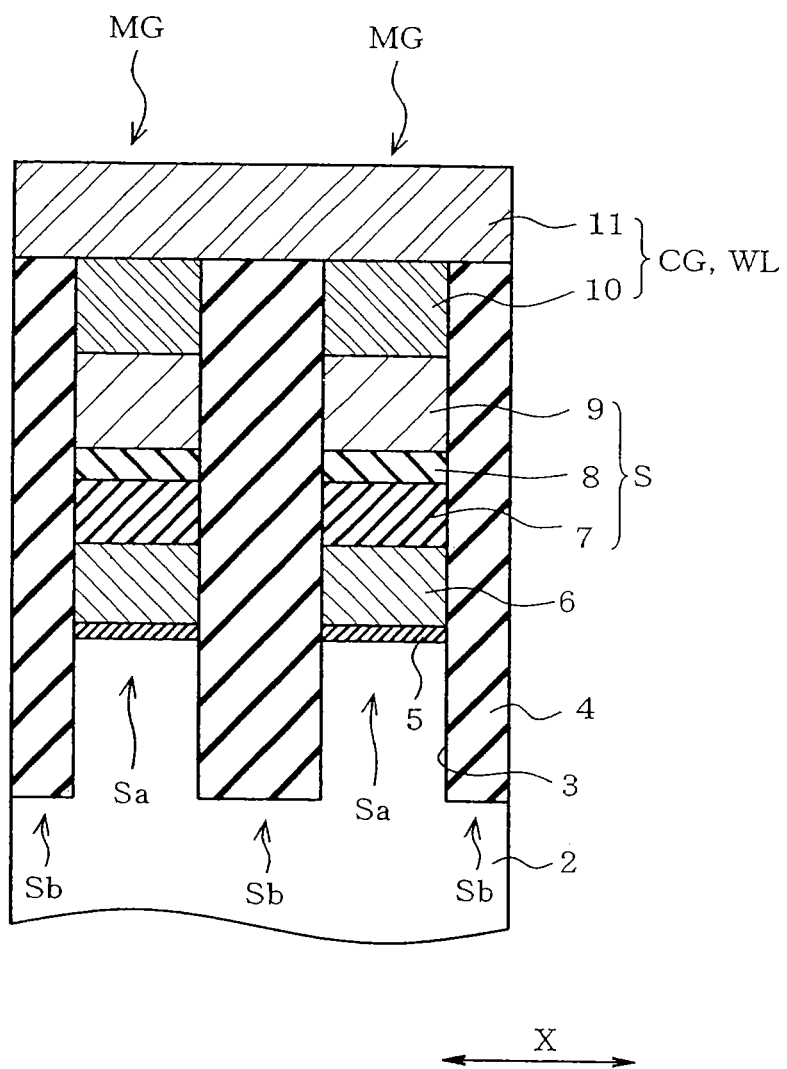
FIG. 3 is a schematic sectional view of the structure of a memory cell (No. 1)

Referring now to FIG. 3, a schematic section taken along the X direction (the word line direction). A well (not shown) is formed in an upper part of a p-silicon substrate 2 as shown in FIG. 3. A plurality of element isolation trenches 3 is formed in the well so as to be spaced from each other. The element isolation trenches 3 isolate the active areas Sa from each other in the word line direction in FIG. 2. Element isolation insulating films 4 constituting element isolation regions Sb are formed in the respective element isolation trenches 3. On the other hand, tunnel insulating films 5 are formed on the active areas Sa divided by the element isolation regions Sb. Each tunnel insulating film 5 is formed from a silicon oxide film, for example. Each tunnel insulating film 5 has both side ends which are in contact with side surfaces of the element isolation insulating films 4 as shown in FIG. 3. On an upper surface of each tunnel insulating film 5 are deposited a multilayer structure including a silicon nitride film 6 (a charge trap layer or charge storage layer), a silicon oxide film 7 a silicon nitride film 8, a metal oxide film 9 and an impurity-doped polycrystalline silicon layer 10. These films and layer 5 to 10 have substantially the same width or dimension in the X direction as viewed in FIG. 3. The films and layer 5 to 10 have respective both X-direction side surfaces confronting the side surfaces of the element isolation insulating films 4.

Each element isolation insulating film 4 comprises an oxide insulating film, for example, and includes a part buried in the element isolation trench 3 and the other part protruding upward from the upper surface of the silicon substrate 2. Each element isolation insulating film 4 has an upper surface located higher than the upper surfaces of the silicon substrate 2 and the tunnel insulating film 5. The upper surface of each element isolation insulating film 4 is substantially flush with an upper surface of each adjacent polycrystalline silicon layer 10. An impurity-doped polycrystalline silicon layer 11 is formed over the upper surfaces of the element isolation insulating films 4 and the polycrystalline silicon layers 10. The polycrystalline silicon layers 10 and 11 serve as control electrodes CG and word lines WL respectively.

Figure 4:
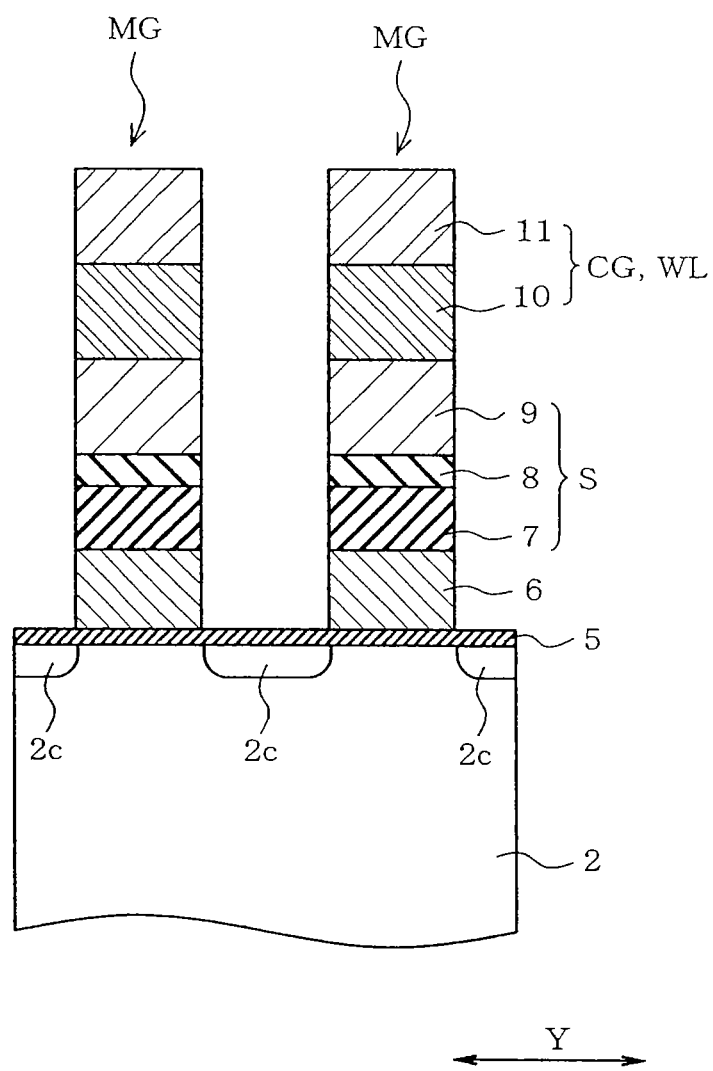
FIG. 4 is also a schematic sectional view of the structure of the memory cell (No. 2)

Referring now to FIG. 4, a Y direction section is shown. On the upper surface of the tunnel insulating film 5 are deposited the silicon nitride film 6, the silicon oxide film 7, the silicon nitride film 8, the metal oxide film 9 and the polycrystalline silicon layers 10 and 11. The films and layers 6 to 11 are divided in the Y direction into a plurality of parts. A plurality of source/drain regions 2c is formed in a surface layer of the silicon substrate 2. Each source/drain region 2c is located under a part of the tunnel insulating film 5 further located between opposite sides of the adjacent divided parts or opposed to the trench. Interelectrode insulating films (not shown) formed from an oxide are buried in each divided region of the films and layers 6 to 11. Thus, the memory cell gate electrodes MG are formed by the films and layers 6 to 11. A multilayer film S comprising the silicon oxide film 7, the silicon nitride film 8 and the metal oxide film 9 is located between the silicon nitride film 6 serving as the charge storage layer and the polycrystalline silicon layer 10 serving as the control gate CG.

Figure 5A:
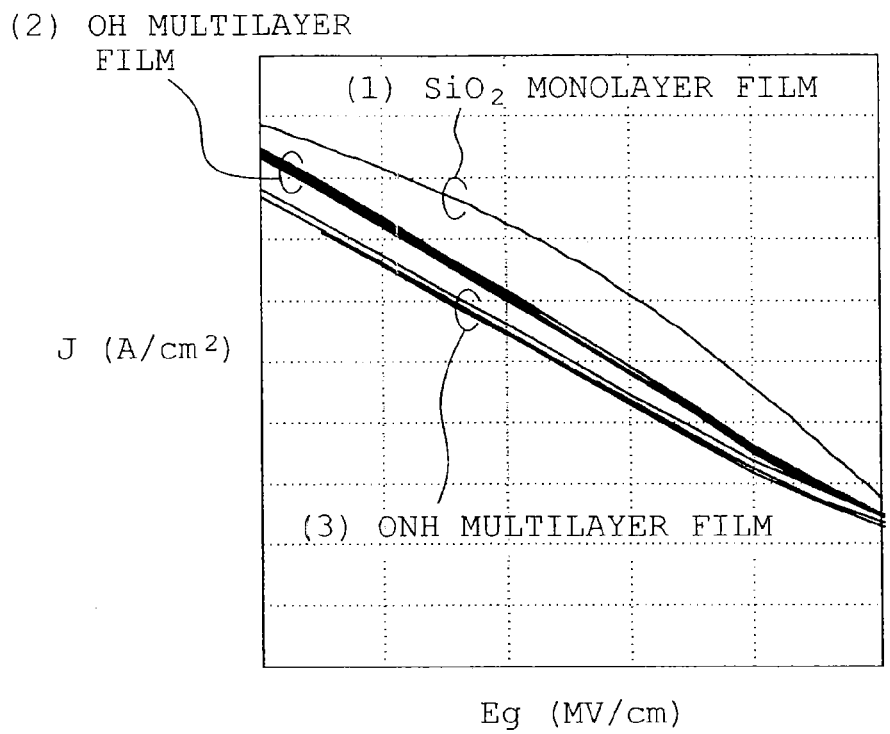
FIGS. 5A and 5B show leak current characteristics during data erasing and data write respectively.
Figure 5B:
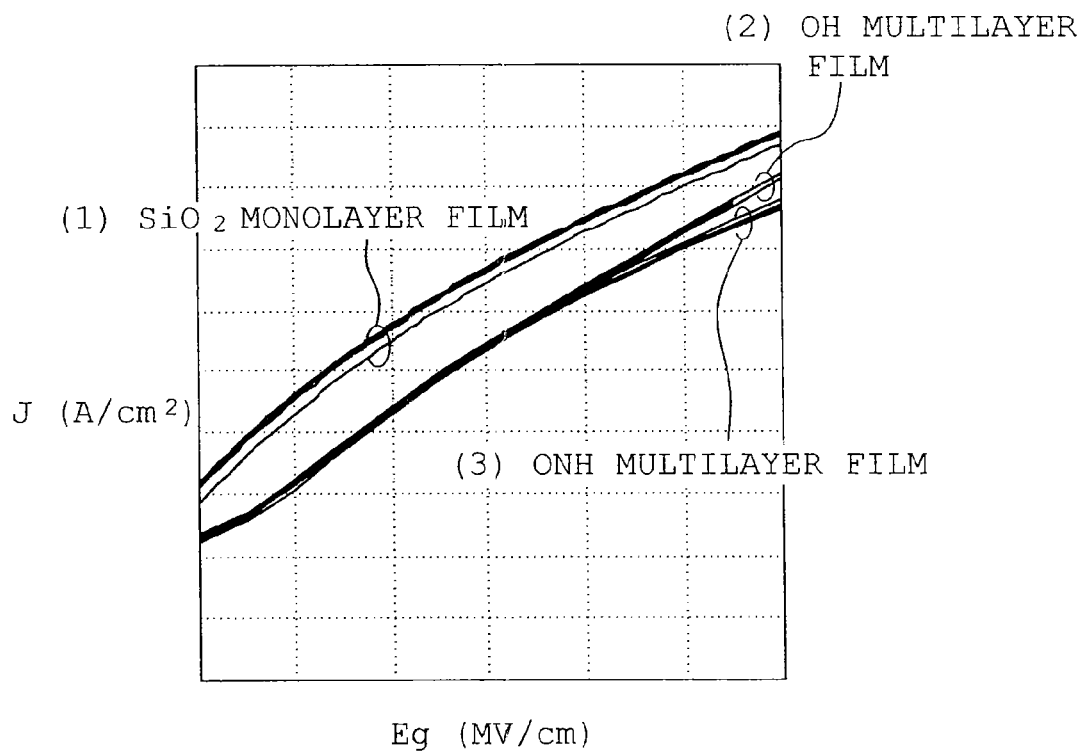

FIGS. 5A and 5B show the results of experiments regarding leak current characteristics in the case where various types of multilayer film S are applied. When the above-described structure is employed, a positive high electric field is applied between the control gate CG and the silicon substrate 2 during data write by a peripheral circuit. In this case, electrons (electric charge) flow from the channel region of the silicon substrate via the tunnel insulating film 5 thereby to be trapped by the silicon nitride film 6. In this regard, leakage of the electrons to the control electrode CG side needs to be suppressed as much as possible in order that a charge storage characteristic may be adjusted to a desired one. Furthermore, when a negative high electric field is applied between the control gate CG and the silicon substrate 2 during data erasing, electrons are emitted from the silicon nitride film 6 via the tunnel insulating film 5 to the silicon substrate 2. In this case, the electrons introduced from the control electrode CG to the silicon nitride film 6 need to be suppressed as much as possible in order that a charge discharge characteristic may be adjusted to a desired one. Accordingly, the charge storage and emission characteristics need to be adjusted by the multilayer film S formed between the control electrode CG and the silicon nitride film 6, and leak current flowing through the multilayer film S needs to be suppressed as much as possible.

FIGS. 5A and 5B show the experimental results regarding the leak current characteristics during data erasing and data write respectively. The multilayer structures to be compared include (1) a monolayer film of a silicon oxide film ($SiO_2$), (2) a multilayer film (OH depositional film in FIGS. 5A and 5B) of a silicon oxide film ($SiO_2$) and a metal oxide film, and (3) the multilayer film S (an ONH depositional film in FIGS. 5A and 5B) in the embodiment (the multilayer film of the silicon oxide film 7, silicon nitride film 8 and the metal oxide film 9). The experimental results show that the characteristic of leak current density J ($A/cm^2$) is improved better in the sequence of (1), (2) and (3) during each of data erasing and data write. For example, when the structure (2) is applied, it is presumed that an amount of leak current is rendered larger in structure (2) than in structure (3) since a chemical reaction or mutual diffusion occurs in a boundary between the silicon oxide film (O) and the metal oxide film (H).

FIGS. 6A and 6B show energy band model structures in the vicinity of a conductive band. When the aforesaid structure (2) is employed, it is presumed that an energy barrier is decreased in the vicinity of a boundary between the silicon oxide film ($SiO_2$; and shown by "O" in FIGS. 6A and 6b) and a metal oxide film (shown by "H" in FIGS. 6A and 6B). The reason for this is that metal atoms are diffused from the metal oxide film H side to the silicon oxide film H side such that a physical property corresponding to a mixture of the two types of films is obtained. In contrast, when the aforesaid structure (2) is employed, the silicon nitride film 8 is formed as a barrier between the silicon oxide film 7 ($SiO_2$) and the metal oxide film 9. As a result, a chemical reaction and mutual diffusion can be suppressed between the silicon oxide film 7 ($SiO_2$) and the metal oxide film 9, whereupon the decrease in the energy barrier can be suppressed.

Furthermore, it is considered that an improvement in the energy band has a larger effect in the data erasing, as shown in FIGS. 6A and 6B (see energy E1 in FIG. 6B). Accordingly, an amount of high electric field leak current can be reduced during data write and can be reduced to a higher degree during data erasing. As a result, a desired boundary state and an ideal energy band structure can be realized, whereby leak current can be suppressed.

A method of fabricating the aforesaid structure will now be described. In the following description of the fabricating method, the description of a method of fabricating the region of the memory other than shown in the drawings will be eliminated. Furthermore, one or more ordinary processes may be added to the following method or may be substituted for the following processes, if necessary.

Figure 7:
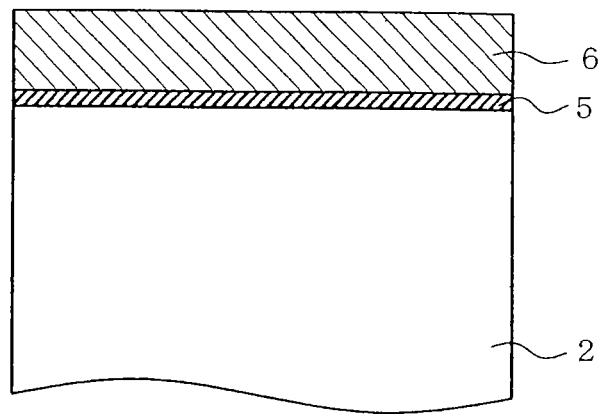
FIGS. 7 to 14 are sectional views of the structure of FIG. 3 in sequential fabrication steps (Nos. 1 to 8)

Referring to FIG. 7, a silicon oxide film is formed on the upper surface of the silicon substrate 2 by a thermal oxidation method after impurities have been implanted into the surface layer of the silicon substrate 2 for the purpose of forming wells and channels. The silicon oxide film serves as the tunnel insulating film 5. Subsequently, the silicon nitride film 6 is deposited on the upper surface of the tunnel insulating film 5. The silicon nitride film 6 is deposited on the tunnel insulating film 5 by a low pressure chemical vapor deposition method (LPCVD) in which dichlorosilane ($SiH_2Cl_2$) gas and ammonia ($NH_3$) gas are caused to react with each other at a temperature of not more than about 800° C.

Figure 8:
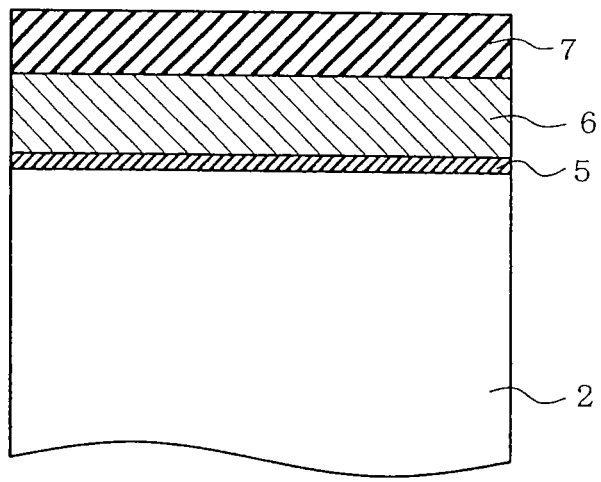
Figure 9:
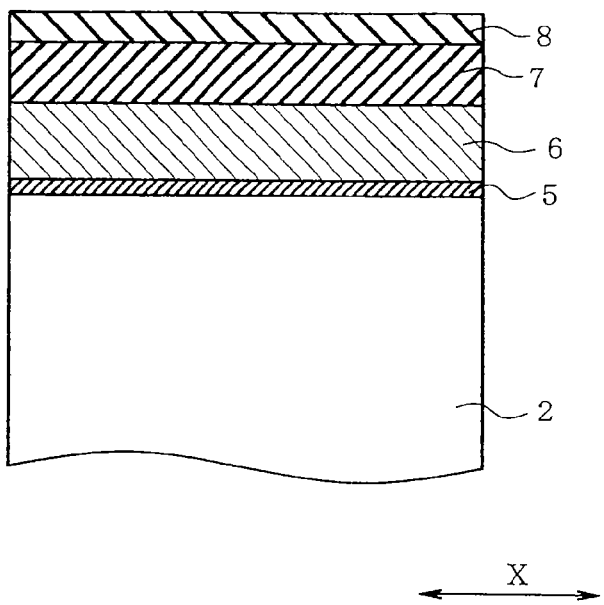

Subsequently, the silicon oxide film 7 is formed on the upper surface of the silicon nitride film 6 as shown in FIG. 8. The silicon oxide film 7 is formed on the tunnel insulating film 5 by a low pressure chemical vapor deposition method (LPCVD) in which dichlorosilane ($SiH_2Cl_2$) gas and dinitrogen monoxide ($N_2O$) gas are caused to react with each other at a temperature of not more than about 800° C. Subsequently, the silicon nitride film 8 is formed on the upper surface of the silicon oxide film 7 as shown in FIG. 9. The silicon nitride film 8 is formed by nitriding the upper surface of the silicon oxide film 7. More specifically, the nitriding treatment is carried out using radical nitriding, plasma nitriding or nitriding ions produced in excited nitrogen molecule.

The silicon nitride film 8 may be formed by carrying out the nitriding treatment at a relatively lower temperature (at or below surface temperature of about 500° C. with the use of a physical excitation method. In this case, a nitriding treatment may be carried out under a high temperature (700° C. or above) condition with the use of ammonia ($NH_3$) when a foundation layer has a large thermal tolerance in the nitriding process and is hard to be influenced by a reducing atmosphere or hydrogen. Regarding elements affected by thermal diffusion of impurities or the like, the nitriding treatment may be carried out by a physical excitation at a relatively lower temperature or under a condition where a reducing source gas or another source gas not containing hydrogen is allowed.

Figure 10:
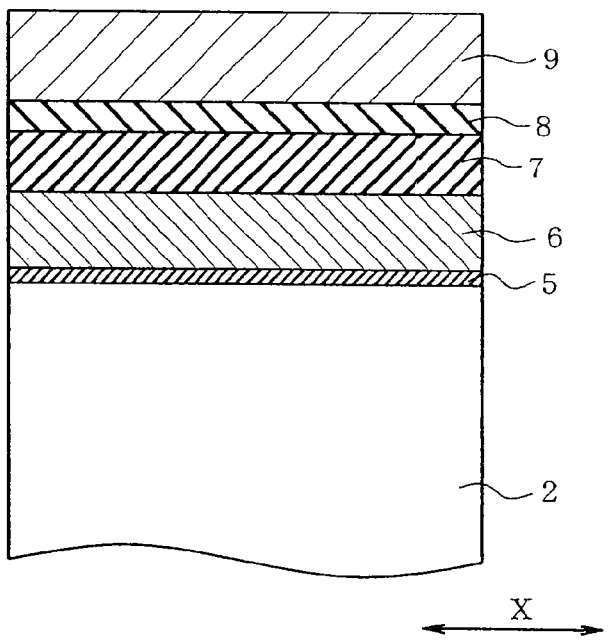

Subsequently, the metal oxide film 9 is formed on the upper surface of the silicon nitride film 8 as shown in FIG. 10. When, for example, an aluminum oxide ($Al_2O_3$) film having a relative permittivity of about 10 is formed as the metal oxide film 9, aluminum trimethyl (($CH_3)_3Al$) and an oxidizing agent (for example, $O_2$, $O_3$ or $H_2O$) are introduced into a furnace to be caused to react against each other at or below about 600° C., whereby the metal oxide film 9 may be formed. After the forming of the metal oxide film 9, an annealing treatment is carried out for high densification, and an oxidation treatment is carried out for compensation of oxygen defect.

Figure 11:
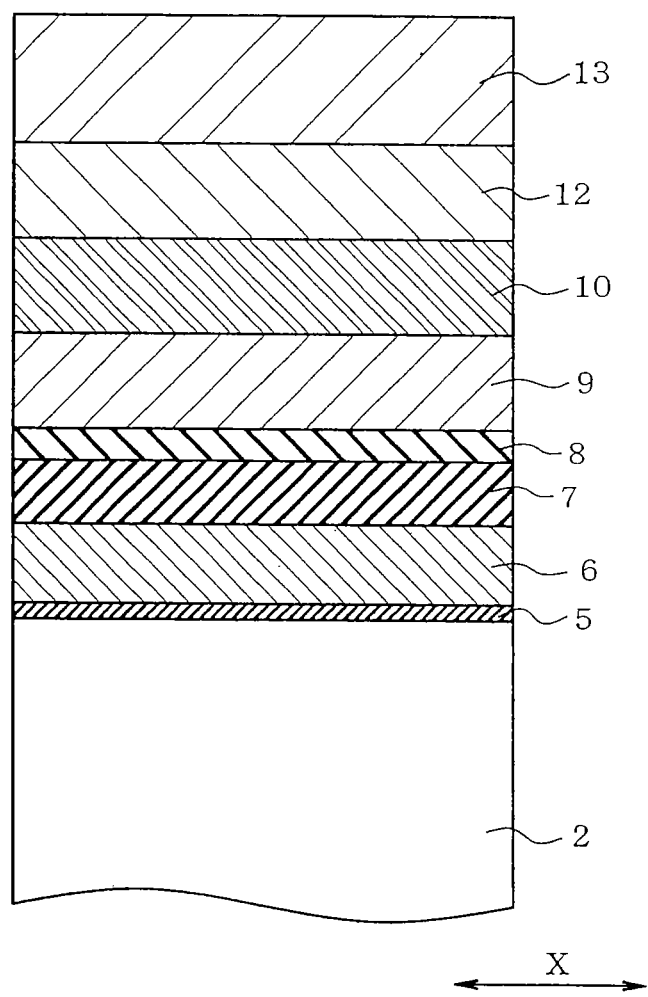
Figure 12:
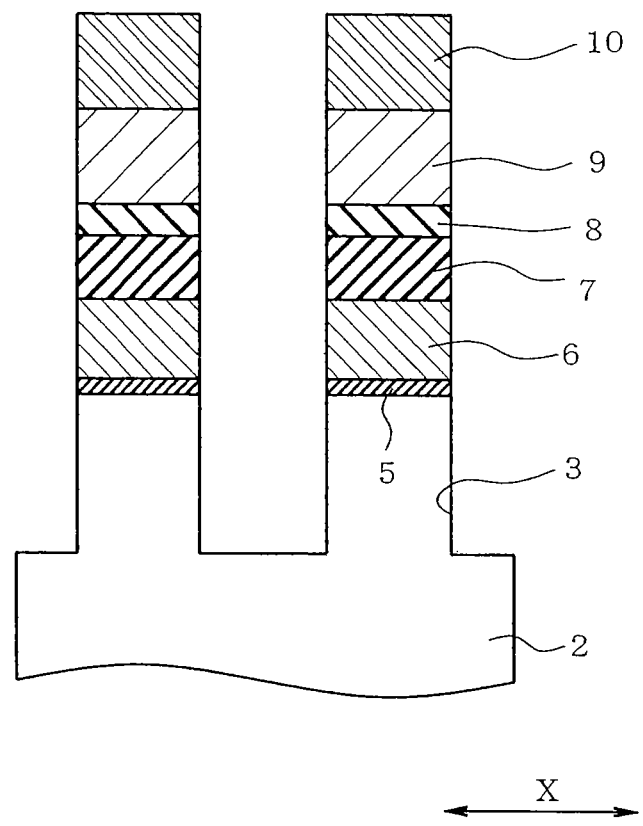

Subsequently, the polycrystalline silicon layer 10 to which impurities such as phosphor (P) are added is formed on the upper surface of the metal oxide film 9, as shown in FIG. 11. The polycrystalline silicon layer 10 is formed at about 500° C. by the LPCVD method by introducing silane ($SiH_4$) and phosphine ($PH_3$) into a furnace. Masks 12 and 13 are thereafter formed on an upper surface of the polycrystalline silicon layer 10. Subsequently, the mask 13 is patterned by a photolithography technique, and an anisotropic etching is carried out so that the element isolation trenches 3 are formed so as to extend through the films and layers 5 to 12 and into an upper portion of the silicon substrate 2, as shown in FIG. 12.

Figure 13:
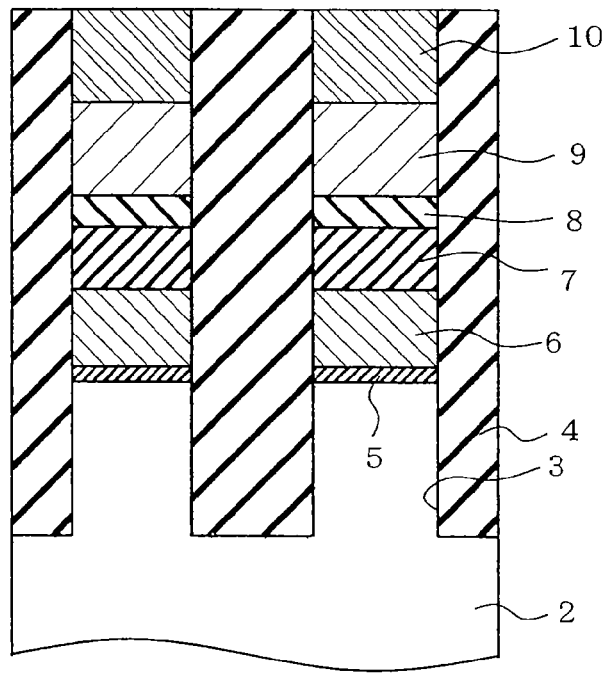
Figure 14:
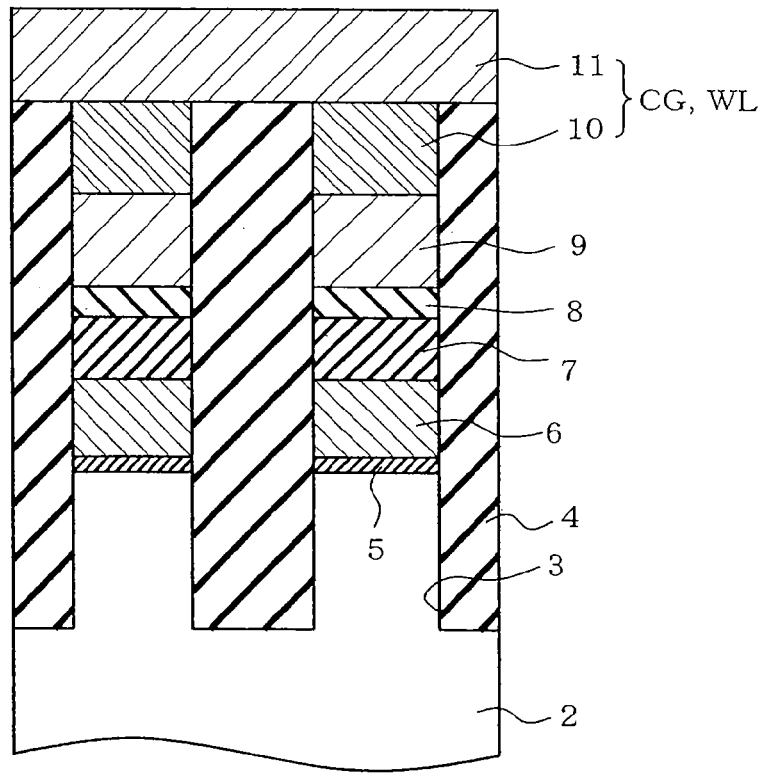

Subsequently, the element isolation insulating films 4 are formed in the element isolation trenches 3 respectively as shown in FIG. 13. The impurity-added polycrystalline silicon layer 11 is then formed over the upper surfaces of the element isolation insulating films 4 and polycrystalline silicon layers 10 as shown in FIG. 14. The polycrystalline silicon layers 10 and 11 serve as the control electrodes CG and the word lines WL respectively. Thereafter, an anisotropic etching is carried out so that the layers 10 and 11 and the films 6 to 9 are divided in the Y direction into a plurality of portions, whereby a plurality of memory cell gate electrodes MG are formed. Thereafter, impurities are ion-implanted so that the source/drain regions are formed under the tunnel insulating film 5 so as to be located between lower portions of the opposite sides of the adjacent memory cell gate electrodes MG. Insulating films are thereafter formed between the adjacent gate electrodes MG, and bit line contacts, source line contacts and upper layer wiring such as bit lines BL are formed in wiring fabricating steps. However, detailed description of these steps will be eliminated since the steps have no direct relation with the features of the embodiment.

According to the foregoing embodiment, the multilayer film S comprises the silicon oxide film 7, the silicon nitride film 8 and the metal oxide film 9 formed into the multilayer structure. Since the multilayer film S is formed between the control electrode CG and the silicon nitride film 6, the leak current can be suppressed during data writing/data erasing. Consequently, data writing/data erasing speeds can be increased and the writing/erasing characteristic can be improved. Furthermore, since breakdown voltage is improved, the multilayer film S can be rendered thinner, whereupon high speed operation of the elements can be realized.

Figure 15:
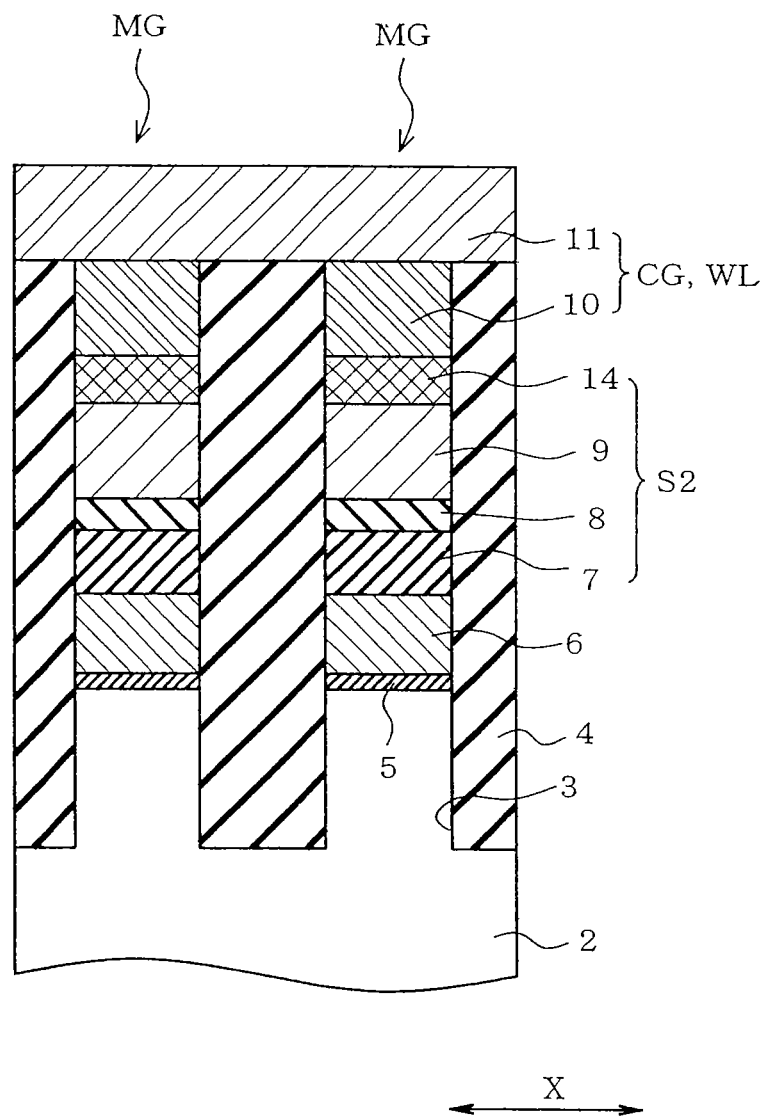
FIG. 15 is a view similar to FIG. 3, showing a second embodiment in accordance with the invention.

FIG. 15 illustrates a second embodiment of the invention. The second embodiment differs from the foregoing embodiment in that a barrier film containing silicon nitride is formed on the metal oxide film. In the second embodiment, identical or similar parts are labeled by the same reference symbols as those in the first embodiment and detailed description of these parts will be eliminated. Only the difference of the second embodiment from the first embodiment will be described in the following.

The silicon nitride film 14 is formed on the metal oxide film 9 to serve as a barrier layer or film as shown in FIG. 15. The control electrode CG is formed on an upper surface of the silicon nitride film 14. Between the control electrode CG and the silicon nitride film 6 is formed a multilayer film S2 comprising the silicon oxide film 7, the silicon nitride film 8, the metal oxide film 9 and the silicon nitride film 14 deposited sequentially into the multilayer structure. The control electrode CG comprises impurity-added silicon, metal electrode and silicide. A reducing atmosphere such as silane, a nitrogen-containing source gas or chloride-containing source gas is used as an atmosphere in which the control electrode CG is formed. Accordingly, there is a possibility that the control electrode may be damaged when exposed to the above-described atmospheres. The silicon nitride film 14 is provided in view of the problem in the embodiment.

The silicon nitride film 14 has a role in preventing characteristic degradation due to a chemical reaction or mutual diffusion between a lower layer structure of the silicon nitride film 14 and the control electrode CG. Furthermore, the silicon nitride film 14 is also effective when there is a possibility of deterioration due to an atmosphere, heat or physical damage in forming an upper layer electrode or the like located higher than the polycrystalline silicon layer 10. Thus, the silicon nitride film 14 can suppress damage due to an atmosphere or heat and realize ideal composition or energy band state, thereby improving device characteristics.

Any one of low pressure chemical vapor deposition (LPCVD), atomic layer deposition (ALD) and sputtering may be employed in forming the silicon nitride film 14. The silicon nitride film 14 may preferably be formed using a silicon source not containing chloride when formed at a relatively higher temperature (at or above 700° C., for example). In contrast, the silicon nitride film 14 may preferably be formed using a chloride-containing silicon source when formed at a relatively lower temperature (below about 700° C., for example). When the silicon nitride film 14 is formed at a lower temperature, deterioration thereof can be suppressed to minimum.

When the silicon nitride film 14 is formed under a higher temperature condition, for example, bis-tertiary butyl amino silane (BTBAS) as a silicon source not containing chloride and ammonia as a nitriding agent are introduced into a furnace to be formed into the silicon nitride film at or below about 800° C. by LPCVD. On the other hand, when the silicon nitride film 14 is formed under a lower temperature condition, dichlorosilane as a chloride-containing silicon source and ammonia as a nitriding agent are introduced into a furnace to be formed into the silicon nitride film at or below 700° C. by LPCVD. As a result, the silicon nitride film 14 can be formed with an underlayer not being adversely affected.

According to the second embodiment, damage due to atmosphere or heat is suppressed since the silicon nitride film 14 is formed between the metal oxide film 9 and the control gate CG. Consequently, an ideal composition or energy band state can be realized, which can improve the device characteristics.

The invention should not be limited by the foregoing embodiments. The embodiments can be modified or expanded as follows. The silicon nitride film 8 is formed between the silicon oxide film 7 and the metal oxide film 9 in each of the foregoing embodiments. However, any nitride-containing film may be used, instead of the silicon nitride film 8. For example, boron nitride (BN) or aluminum nitride (AlN) may be used.

The invention is applied to the NAND flash memory 1 in the foregoing embodiments. However, the invention may be applied to other types of semiconductor memory devices in which a number of memory cell transistors Trm are arranged in the bit line and word line directions into a matrix and data is capable of storing data in a nonvolatile manner.

The control electrode CG and the word line WL may include silicide layers obtained by silicifying upper portions of the polycrystalline silicon layers (polygates) 10 and 11 with the use of a metal such as tungsten (W), nickel (Ni) or cobalt (Co) respectively. Alternatively, each of the control electrode CG and the word line WL may comprise a metal layer of tantalum nitride (TaN) or tungsten (W) or a multilayer structure of the aforementioned metal layers.

Although alumina ($Al_2O_3$) is used as the metal oxide film 9 in the foregoing embodiments, the metal oxide film 9 may comprise any metal oxide film that has a relative permittivity higher than 7. For example, the metal oxide film 9 may comprise any one of a magnesium oxide (MgO) film having a relative permittivity of about 10, a yttrium oxide ($Y_2O_3$) film having a relative permittivity of about 16, a hafnium oxide ($HfO_2$) film having a relative permittivity of about 22, a zirconium oxide ($ZrO_2$) film and a lanthanum ($La_2O_3$) film. Furthermore, the metal oxide film 9 may be an insulating film comprising a ternary compound, such as a hafnium silicate (HfSiO) film or a hafnium aluminate (HfAlO) film. Additionally, the metal oxide film 9 may comprise an oxide film including at least any one of silicon (Si), aluminum (Al), magnesium (Mg), yttrium (Y), hafnium (Hf), zirconium (Zr) and lanthanum (La).

Figure 16A:
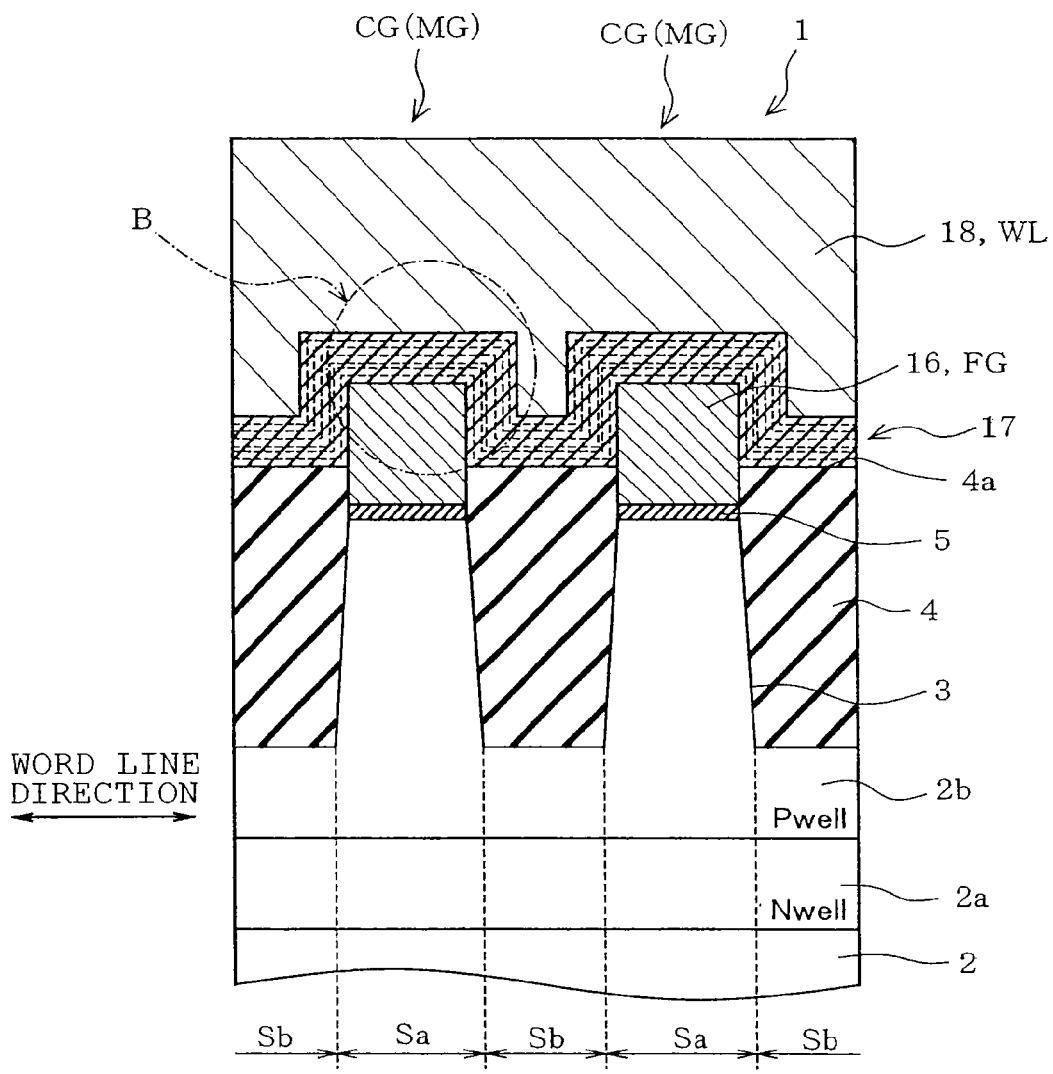
FIG. 16A is a view similar to FIG. 3, showing a third embodiment in accordance with the invention.

FIGS. 16A to 33 illustrate a third embodiment of the invention. The third embodiment differs from the foregoing embodiments in the configuration of the memory cell transistor. FIG. 16A schematically shows a section of a plurality of memory cells taken along the word line direction. The p-silicon substrate 2 has a surface layer in which an n-well 2a is formed. A p-well 2b is further formed in a surface layer located over the n-well 2a. A plurality of element isolation trenches 3 is formed in the surface layer of the p-well 2b. The element isolation trenches 3 provide a plurality of active areas Sa divided in the word line direction.

The element isolation insulating films 4 are formed in the element isolation trenches 3 respectively. Each element isolation insulating film 4 includes a lower part buried in the element isolation trench 3 and an upper part protruding from the surface of the silicon substrate 2. Each element isolation insulating film 4 has an upper end located in the vicinity of the surface of the silicon substrate 2 and a lower end located below the surface of the silicon substrate 2. On the other hand, a plurality of gate insulating films 5 is formed on the active areas Sa divided by the element isolation areas Sb. The gate insulating films 5 serve as a first insulation layer and a first gate insulating film. Each gate insulating film 5 is formed from a silicon oxide film, for example. Each gate insulating film 5 has opposite ends which are in contact with portions of the upper side surfaces of the adjacent element isolation insulating film 4.

A plurality of floating gate electrodes FG serving as charge storage layers is formed on the gate insulating films 5 respectively. Each floating gate electrode FG is made of a polycrystalline silicon layer 16 doped with impurities such as phosphor (P) and serves as a conductive layer and a semiconductor layer. Each polycrystalline silicon layer 16 includes a lower side serving as a contact surface that is in contact with the upper side surfaces of the adjacent element isolation insulating films 4 and an upper side protruding upward from the upper surfaces 4a of the adjacent element isolation insulating films 4. The upper side surface of each element isolation insulating film 4 is flush against the side surfaces of the adjacent gate insulating films 5 and the lower side surfaces of the adjacent polycrystalline silicon layers 16. Each element isolation insulating film 4 is made of a silicon oxide film, for example.

An intergate insulating film 17 is formed along the upper surfaces of the element isolation insulating films 4, the upper side surfaces and upper surfaces of the floating gate electrodes FG. The intergate insulating film 17 serves as an interpoly insulating film, an inter-conductive layer insulating film and a second insulating layer. The intergate insulating film 17 comprises a lower layer insulating film 17a, a high dielectric constant film 17b and an upper layer insulating film 17c, all of which are sequentially formed into a multilayer structure. The lower layer insulating film 17a further comprises a lower silicon nitride film 17aa, a lower silicon oxide film 17ab, a boundary layer 17ac and a lower layer silicon oxide film 17ad, all of which are sequentially formed into a multilayer structure. The boundary layer 17ac is a discontinuous plane formed by interrupting the forming of the silicon oxide film, exposing the film to an atmosphere and thereafter restating the forming of the silicon oxide film. The boundary layer 17ac has a smaller film thickness than the other films constituting the lower layer insulating film 17a. The boundary layer 17ac has a higher concentration of carbon (C) than the other layers constituting the intergate insulating film 17 and serves as a charge trap layer.

The high dielectric constant film 17b comprises an aluminum oxide ($Al_2O_3$) film and serves as an intermediate insulating film. The upper layer insulating film 17c comprises an upper layer silicon oxide film 17ca and an upper layer silicon nitride film 17cb, both of which are in turn deposited into a depositional structure. The provision of the lower layer silicon nitride film 17aa effectively prevents diffusion to the insulating films 4 and 5 of metal elements contained in the insulating film 17b and an oxidizing agent used during the forming of the silicon oxide films 17ab, 17ad and 17ca and the like. Furthermore, since the upper layer silicon nitride film 17cb is provided, metal elements contained in the high dielectric constant film 17b and the like are effectively prevented from being diffused upward.

A conductive layer 18 is formed on the intergate insulating film 17 so as to extend in the word line direction. The conductive layer 18 serves as the word lines WL connecting the control electrodes CG of the memory cell transistors Trm one another. The conductive layer 18 comprises a metal silicide obtained by silicifying the polycrystalline silicon layer and a metal such as tungsten or cobalt formed directly on the polycrystalline silicon layer. Thus, the gate electrode MG of each memory cell transistor Trm comprises the floating gate electrode FG, the intergate insulating film 17 and the control gate CG, all of which are formed into a two-layer multilayer gate structure.

Figure 16B:
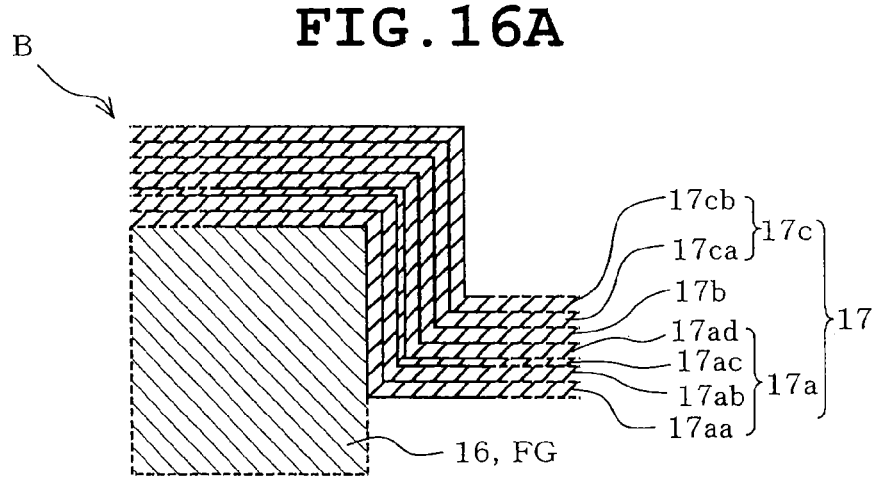
FIG. 16B is an enlarged sectional view of part B as shown in FIG. 16A.
Figure 16C:
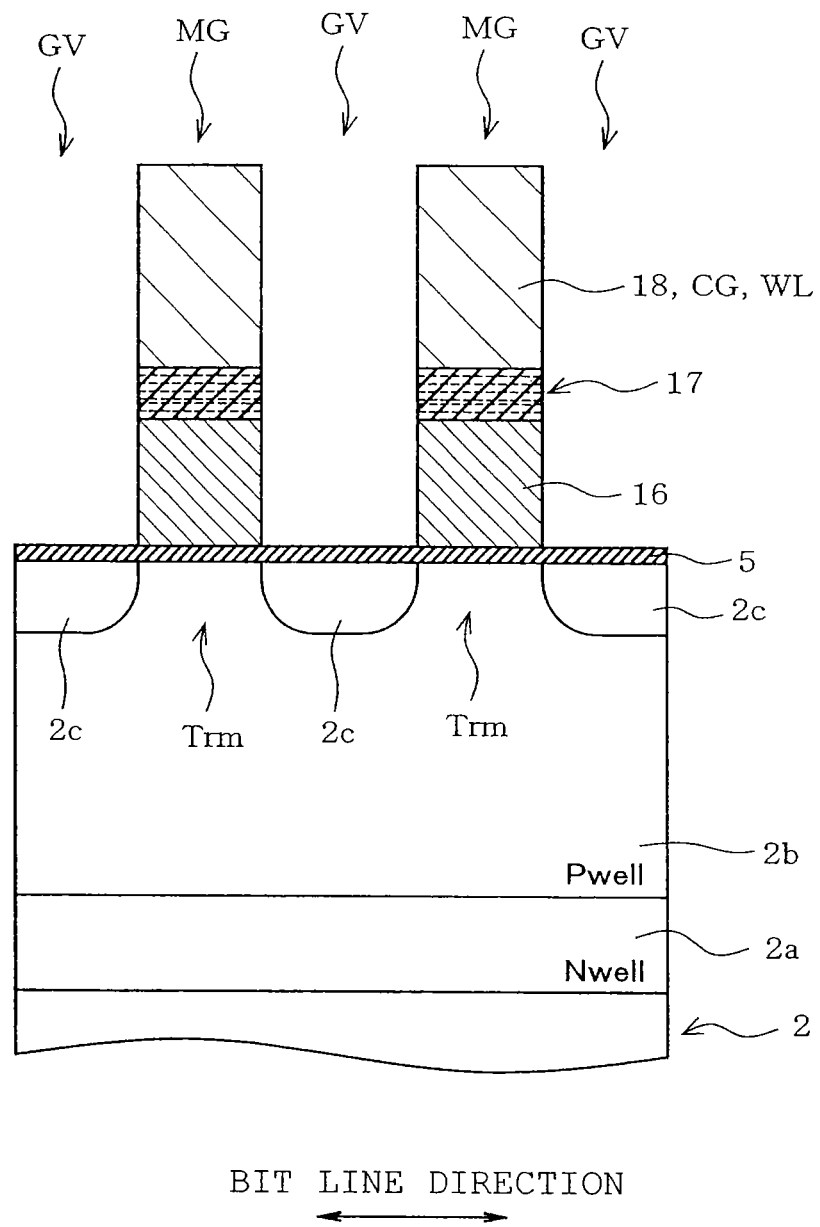
FIG. 16C is a view similar to FIG. 4.

The gate electrodes MG of the memory cell transistors Trm are arranged in the Y (bit line) direction as shown in FIG. 16C. The gate electrodes MG are electrically divided by dividing regions GV. Interlayer insulating films and the like are provided in the dividing regions GV although not shown in the drawings. The diffusion layers (source/drain regions) 2c are formed in the surface layer of the silicon substrate 2 so as to be located between lower ends of the adjacent gate electrodes MG. Each memory cell transistor Trm includes the gate insulating film 5, the gate electrode MG and the source/drain region 2c.

The flash memory 1 of the embodiment is writable/erasable when a peripheral circuit (not shown) applies a high electric field between the word line WL and the p-well 2b. In the writing, the peripheral circuit applies high voltage (20 V, for example) to the word line WL selected for the writing and low voltage (0 to intermediate voltage 10 V, for example) to the p-well 2b. As a result, Fowler-Nordheim tunneling current flows through the gate insulating film 5 such that electrons are injected into the charge storage layer FG, whereupon a threshold voltage of the memory cell transistor Trm is shifted in a positive direction. Furthermore, in the erasing, the peripheral circuit applies low voltage (0 to 2.5 V, for example) to the word line WL corresponding to data to be erased and high voltage to the p-well 2b. As a result, electrons go through the charge storage layer FG into the p-well 2b, so that the threshold voltage of the memory cell transistor Trm in a negative direction, whereby data is erased.

In particular, when positive high electric field is applied between the word line WL and the p-well 2b in the writing, leak current results from electrons going from the floating gate electrode FG through intergate insulating film 17 to the word line WL side. As a result, an amount of electrons stored in the floating gate electrode FG is saturated and accordingly, the threshold voltage of the memory cell transistor Trm is also saturated. In view of this, the above-described multilayer structure of intergate insulating film 17 is employed in the embodiment.

Figure 17:
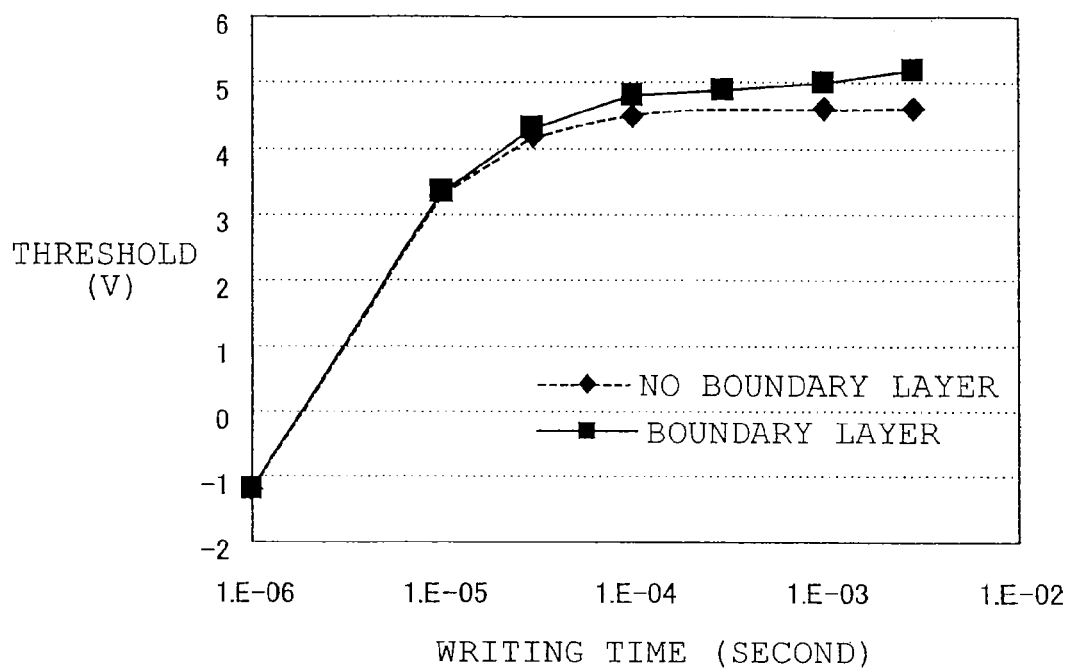
FIG. 17 is a graph showing dependency of threshold voltage on the writing time.

FIG. 17 shows dependency of the threshold voltage of the memory cell transistor on the writing time in the case where the above-described structure of intergate insulating film 17 is employed. As shown, in the case where no boundary layer 17ac is provided, the threshold voltage is saturated even when the writing time is increased. However, in the case where the boundary layer 17ac is interposed between the silicon oxide film 17ab and the silicon oxide film 17ad, the saturated condition of the threshold voltage is suppressed when the writing time is increased, whereupon the saturation voltage is increased.

The reason for saturation of threshold voltage is described as follows. When the positive bias during the writing is applied between the control gate electrode CG and the substrate 2, electrons are injected through the intergate insulating film 17 into the control gate electrode CG side. When the control gate electrode CG side is saturated, the electrons flows through the intergate insulating film 17 to the control gate electrode CG side, whereupon a tunnel current flowing through the gate insulating film 5 is balanced with a leak current flowing through the gate insulating film 17. In this case, the tunnel probability is reduced concerning the electrons flowing from the floating gate electrode FG to the control gate electrode CG side, whereupon the threshold voltage is saturated. When the boundary layer 7ac is provided, saturation of the threshold voltage cannot be confirmed even if the writing time is increased. The reason for this can be that electrons are trapped by the boundary layer 7ac such that an amount of electrons flowing from the floating gate electrode FG to the control gate electrode CG can be suppressed, whereby high electric field can be reduced.

Figure 18:
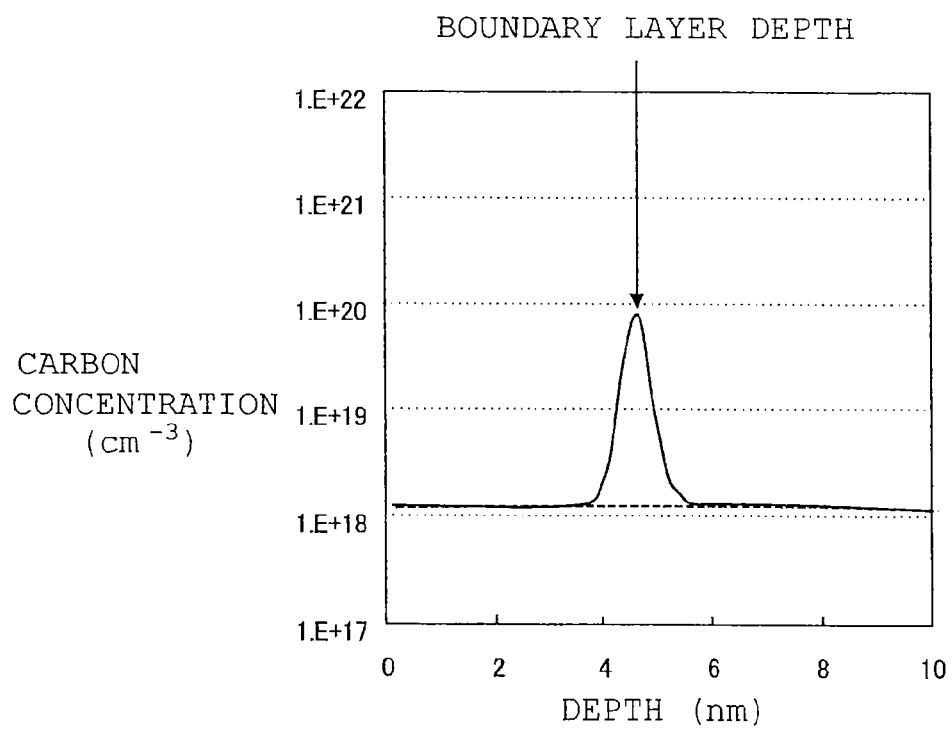
FIG. 18 is a graph showing results of analysis of carbon concentration.

FIG. 18 shows the results of analysis of carbon concentration in the depositional structure of the intergate insulating film. As shown, carbon contained in a region near the boundary layer 17ac has a concentration exceeding $10^{19}$ atoms/cm$^3$. In this region, the film is formed so as to have a higher concentration than the peripheral films (the silicon oxide films 17ab and 17ad). The reason for unsaturation of the threshold voltage would be that carbon which is contained in the boundary layer 17ac and has a larger amount than the peripheral films forms a trap level. Alternatively, the presence of carbon would be a factor increasing dangling bond near the boundary layer 17ac.

Figure 21:
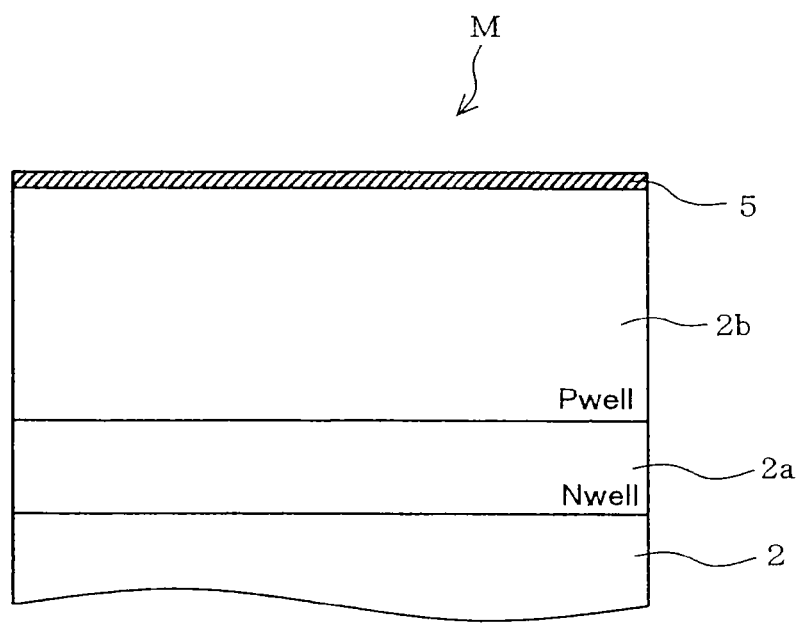
FIGS. 21 to 33 are sectional views of the structure of FIG. 16A in sequential fabrication steps (Nos. 1 to 13)
Figure 22:
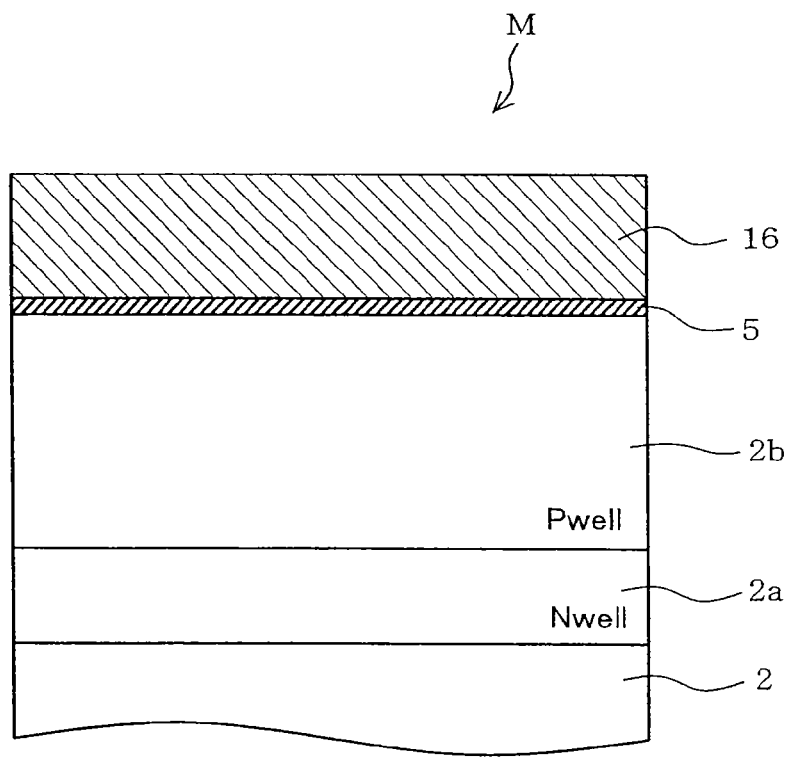
Figure 23:
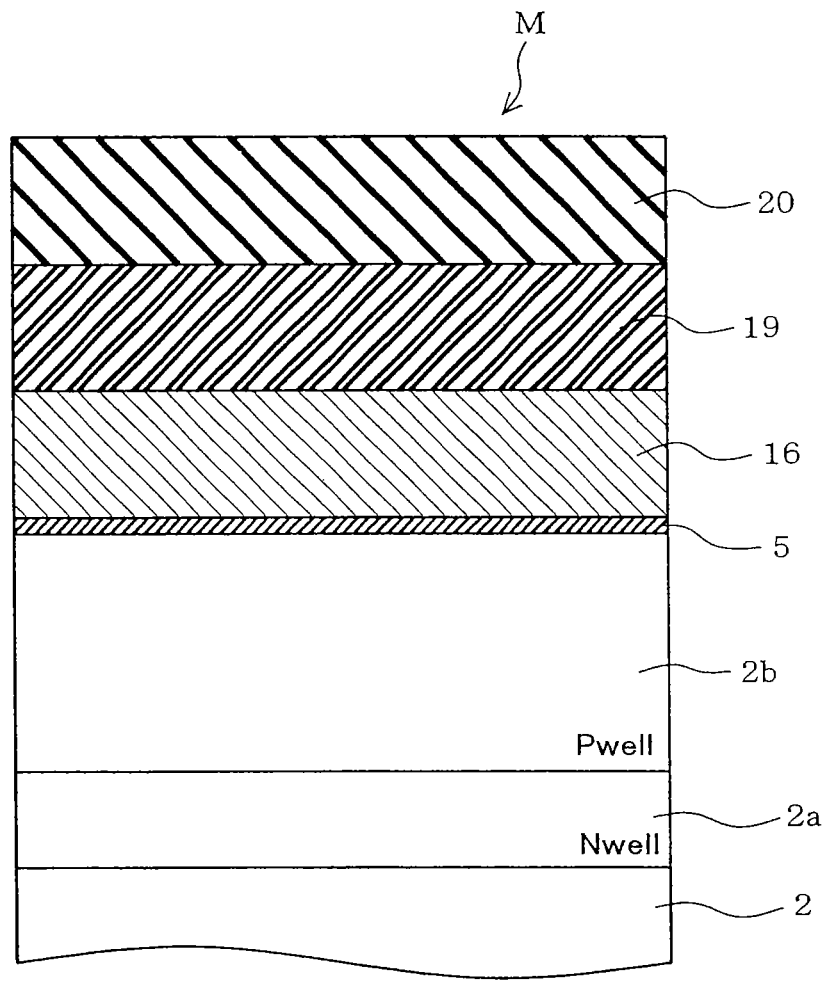

A method of fabricating the foregoing flash memory 1 will now be described. An n-well 2a and a p-well 2b are formed in turn in a surface layer of the p-type single-crystal silicon substrate 2 as shown in FIG. 21. The gate insulating film 5 (insulating film) is then formed on the silicon substrate 2. Subsequently, amorphous silicon is deposited on the gate insulating film 5 by a chemical vapor deposition (CVD) process as shown in FIG. 22. The amorphous silicon will thereafter be thermally-treated thereby to be polycrystallized into polycrystalline silicon. The polycrystalline silicon is configured into the conductive layer 16 (the conductive layer and floating gate electrode FG). Subsequently, the silicon nitride film 19 is deposited by the CVD process and the silicon oxide film 20 is deposited as a hard mask also by the CVD process, as shown in FIG. 23.

Figure 24:
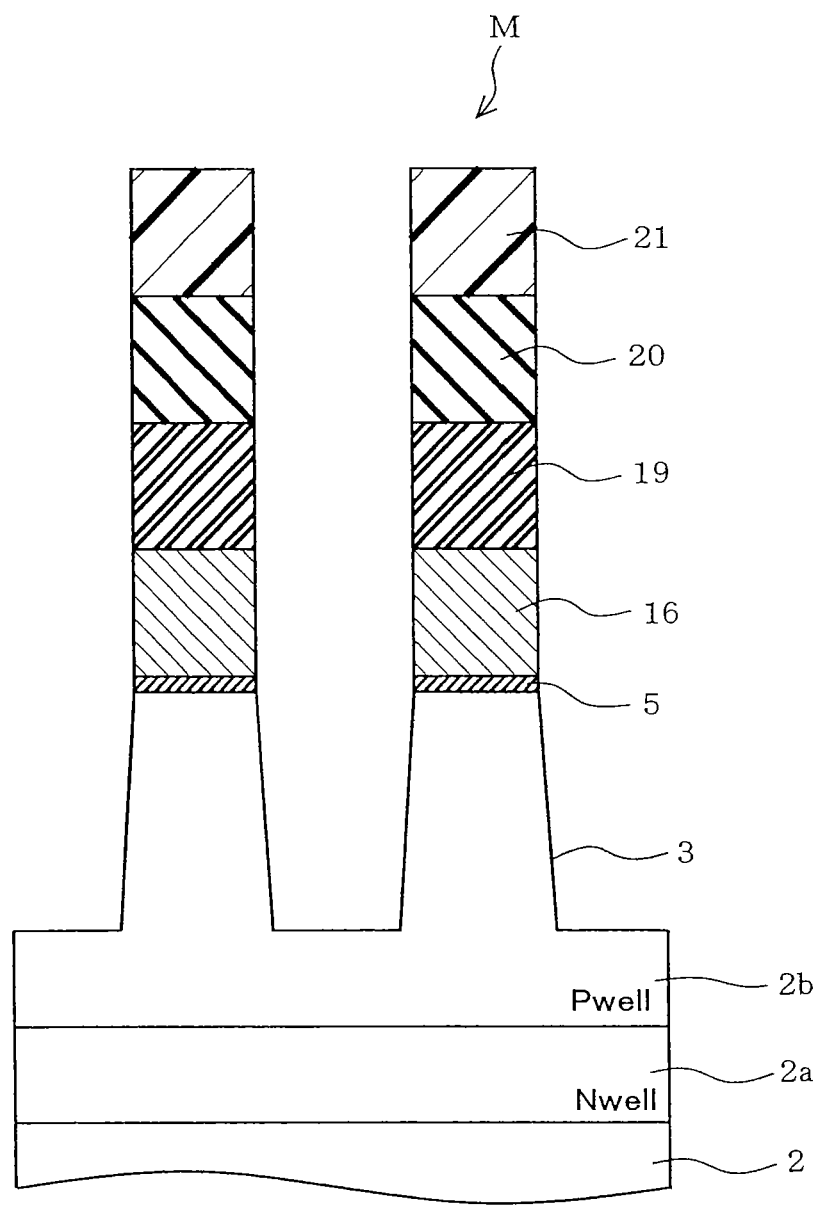

Subsequently, the photoresist 21 is applied and thereafter patterned by a lithography technique as shown in FIG. 24. The silicon oxide film 20 is anisotropically etched by a reactive ion etching (RIE) process with the resist 21 serving as a mask. The resist 21 is thereafter peeled off by an ashing method. Subsequently, the silicon nitride film 19 is anisotropically etched by the RIE method with the silicon oxide film 20 serving as a mask. The conductive layer 16, gate insulating film 5 and an upper part of the silicon substrate 2 are also anisotropically etched by the RIE method. As a result, element isolation trenches 3 are formed in the surface layer of the silicon substrate 2.

Figure 25:
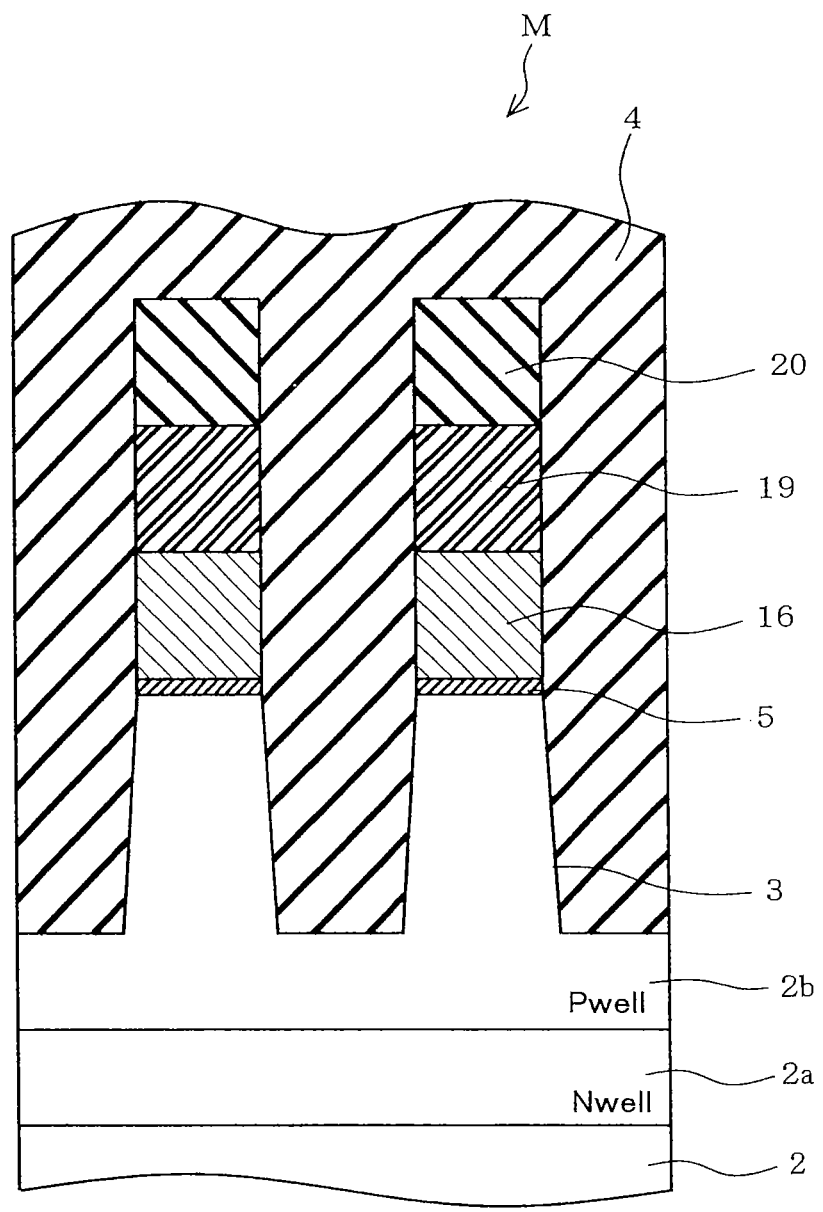

Subsequently, silicon oxide films 4 serving as an insulating film are buried in the respective element isolation trenches 3 by a coating technique or an insulating film forming technique such as a high density plasma chemical vapor deposition (HDPCVD) as shown in FIG. 25. In this case, when the insulating film is formed by coating a polysilazane solvent by the coating technique, the polysilazane solvent is thermally-treated in the atmosphere of oxygen or steam thereby to be high-densified. As a result, the polysilazane solvent is converted into a coating-type insulating film thereby to be formed into a silicon oxide film. The silicon oxide film serves as the element isolation insulating film 4.

Figure 26:
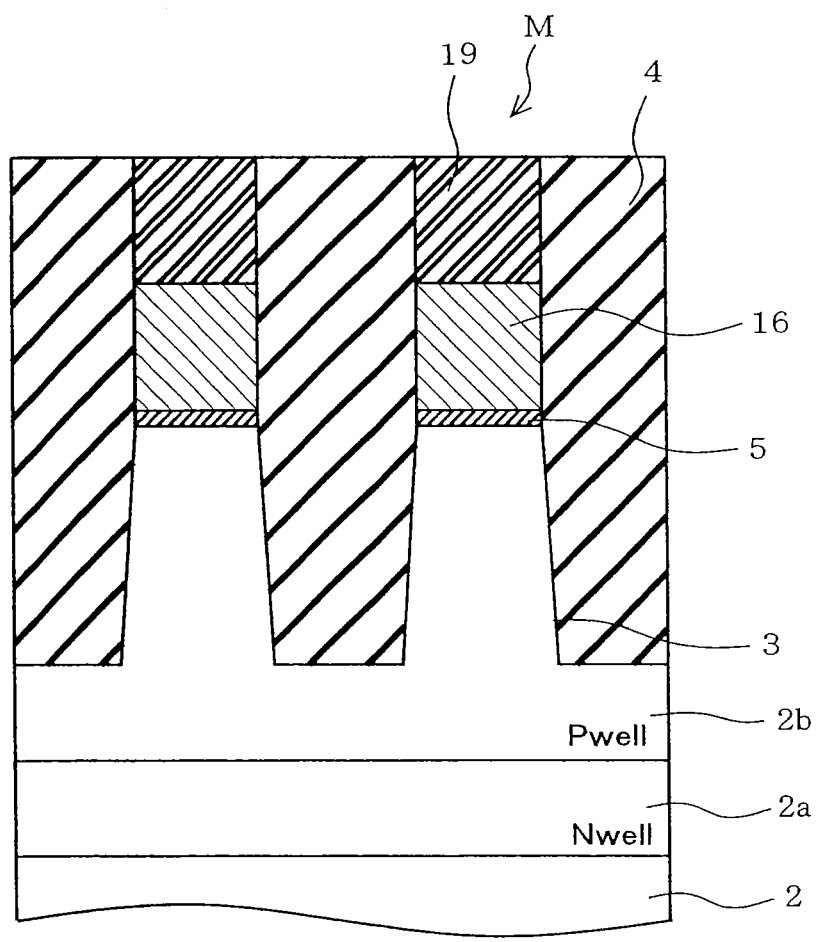
Figure 27:
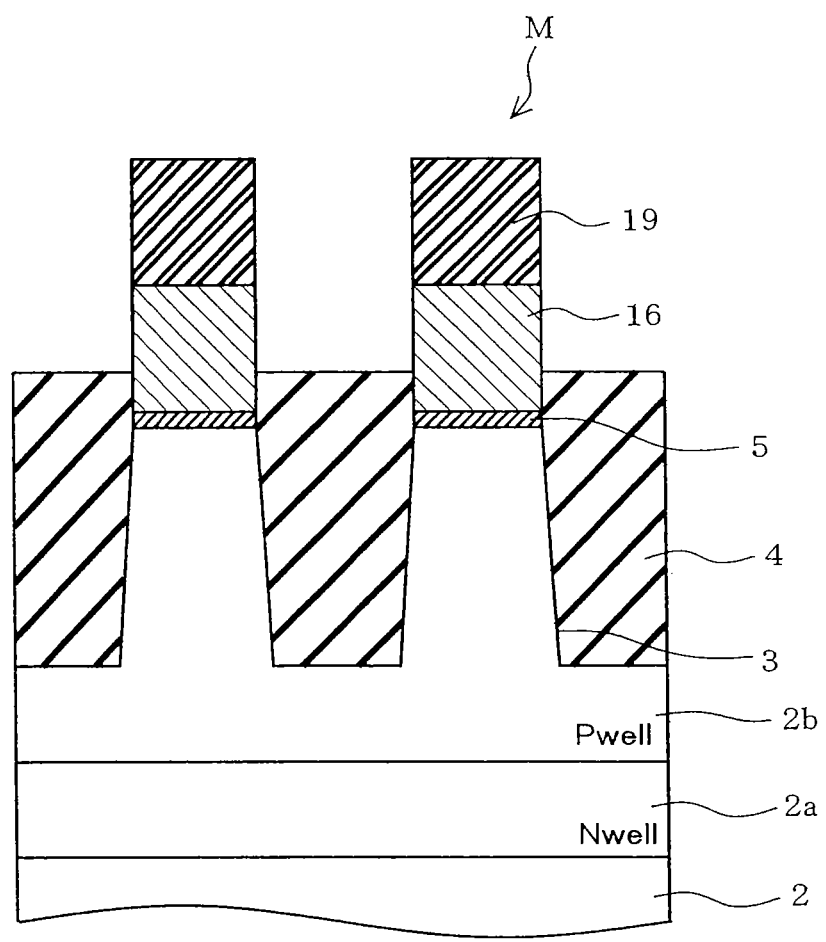
Figure 28:
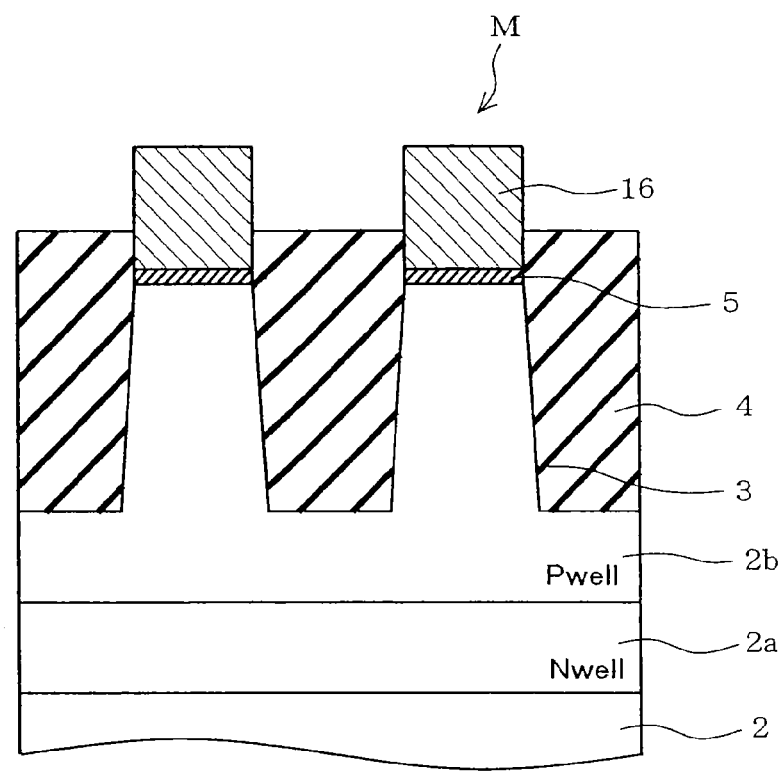

Subsequently, an upper surface of the silicon oxide film 4 is planarized by a chemical mechanical polishing (CMP) method with the silicon nitride film 19 serving as a stopper as shown in FIG. 26. Next, an upper surface of the silicon oxide film 4 is treated by a solution of hydrofluoric acid (HF) diluted with water under the condition where the silicon oxide film 4 has a higher selectivity than the silicon nitride film 9, as shown in FIG. 27. As a result, the upper surface of the silicon oxide film 4 is eliminated by an etchback process so that a predetermined depth is reached above the upper surface of the gate insulating film 5 and below the upper surface of the polycrystalline silicon layer 16. Subsequently, the silicon nitride film 19 is etched by medicinal solution or the like thereby to be removed such that the upper surface of the polycrystalline silicon layer 16 is exposed, as shown in FIG. 28.

Figure 29:
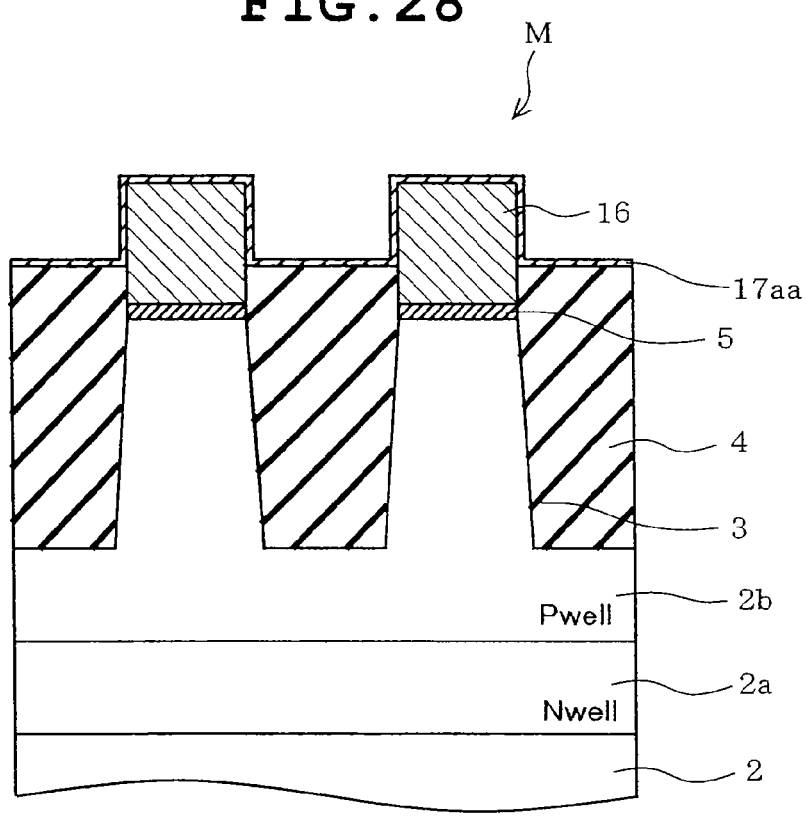

Subsequently, the silicon nitride film 17aa is formed by plasma nitridation (radical nitridation) as shown in FIG. 29.

Figure 30:
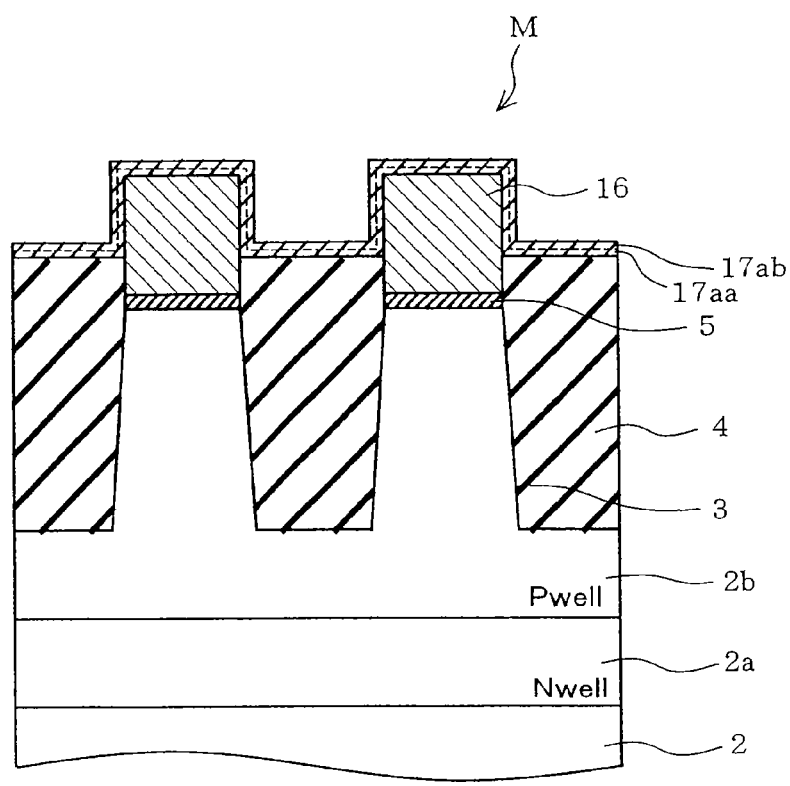

The silicon nitride film 17aa is formed in a region along an upper surface of the silicon oxide film 4, an upper side surface and upper surface of the polycrystalline silicon layer 16. Subsequently, dichlorosilane ($SiH_2Cl_2$) and nitrous oxide ($N_2O$) are caused to react on each other at about 800° C. so that a silicon oxide film 17ab is deposited on the silicon nitride film 17aa by the CVD method, as shown in FIG. 30.

Figure 31:
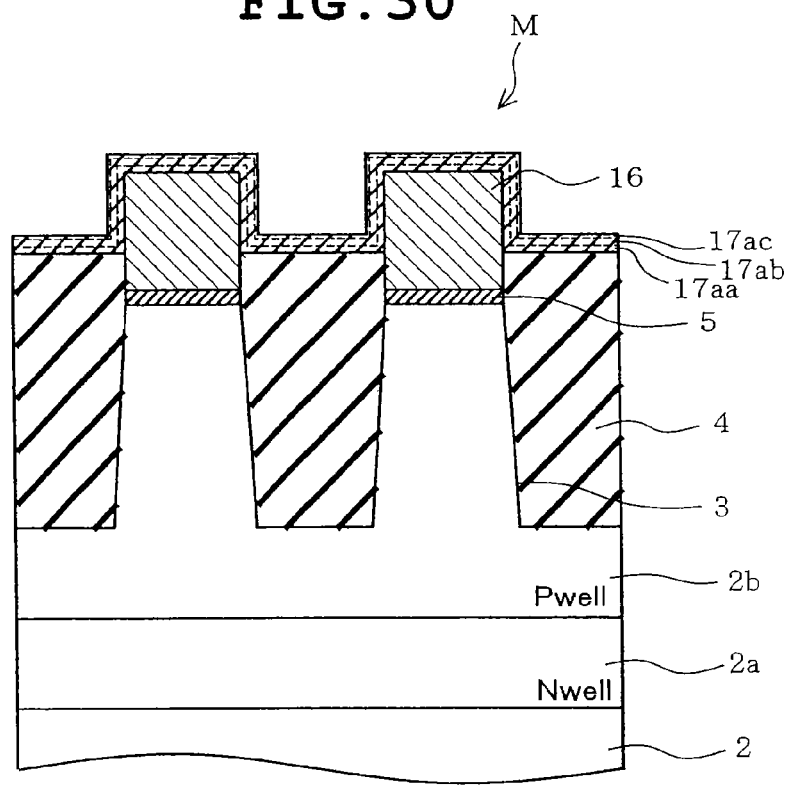
Figure 32:
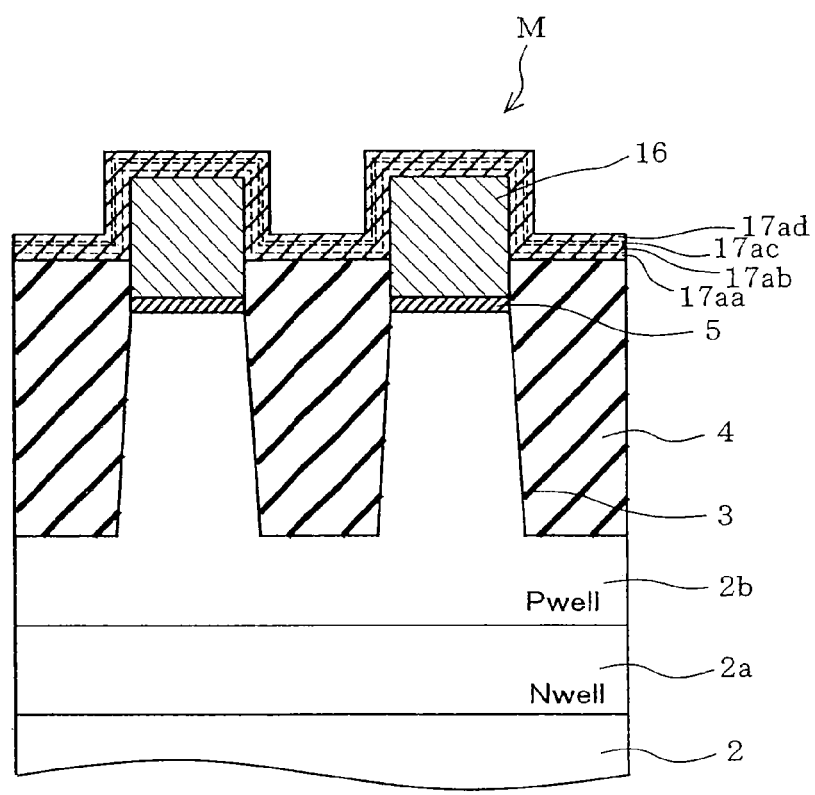

Subsequently, the process of forming the silicon oxide film 17ab is interrupted, and the silicon substrate 2 is returned to the condition under the normal pressure thereby to be exposed to atmosphere. As the result of exposure of the substrate 2 to atmosphere, carbon dioxide ($CO_2$) in the atmosphere or carbon in organic matter is adsorbed to the surface of the silicon oxide film 17ab, whereupon the boundary layer 17ac is formed on the silicon oxide film 17ab as shown in FIG. 31. Subsequently, the process of forming the silicon oxide film 17ab is restarted so that dichlorosilane ($SiH_2Cl_2$) and nitrous oxide ($N_2O$) are caused to react on each other at about 800° C. so that a silicon oxide film 17ad is deposited on the interface layer 7ac by the CVD method, as shown in FIG. 32. As obvious from the foregoing, the boundary layer 17ac can be defined as a region where the carbon concentration in the film is higher than in other regions when the silicon oxide films 17ab and 17ad are regarded as integral.

Figure 33:
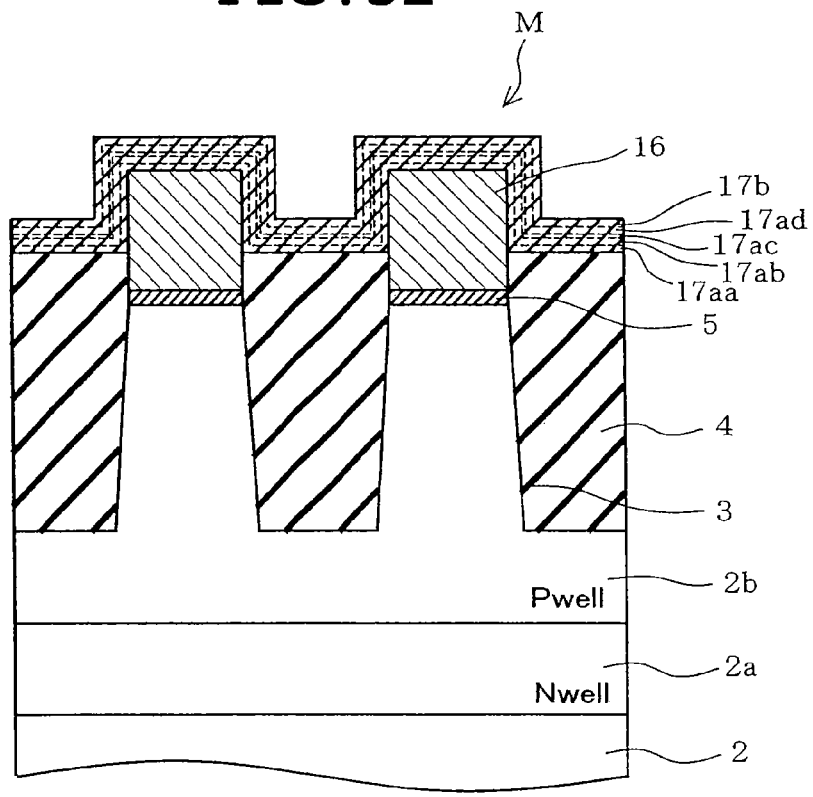

The leak current suppressing effect by the boundary layer 17ac is reduced when the boundary layer 17ac is located excessively near to or away from the polycrystalline silicon layer 16. An optimum location of the boundary layer 17ac depends upon a multilayer structure, film thickness and electric field during element operation. Accordingly, the film thickness is preferably adjusted arbitrarily. Subsequently, an aluminum oxide ($Al_2O_3$) film 17b is formed by an atomic layer deposition (ALD) method as shown in FIG. 33. An ordinary CVD method, sputtering method or the like may be employed, instead of the ALD method. The aluminum oxide film 17b has a relative permittivity higher than a relative permittivity of a silicon nitride film ($Si_3N_4$) which is about 7. Subsequently, the silicon oxide film 17ca is deposited on the aluminum oxide film 17b by the CVD method. Subsequently, the silicon nitride film 17cb is formed by plasma nitridation (radical nitridation) as shown in FIG. 16B, and the conductive layer 18 is then formed on the silicon nitride film 17cb.

Subsequently, a mask pattern is formed on the conductive layer 18. The conductive layer 18, intergate insulating film 17 and polycrystalline silicon layer 16 are etched along the X direction by an anisotropic etching technique such as the RIE method, whereby the layers and film 18, 17 and 16 are divided in the direction perpendicular to the sheet of FIG. 16A into a plurality of parts. As a result, a plurality of divided gate electrodes MG is obtained as shown in FIG. 16C.

Subsequently, impurities are ion-implanted in order that the source/drain regions 2c are formed in the surface layer of the silicon substrate 2 by way of dividing regions GV, as shown in FIG. 16C. Thereafter, interlayer insulating films (not shown) are deposited in the respective dividing regions GV, and various wiring contacts are formed in the interlayer insulating films. Although the fabrication sequence then moves to a step of forming upper layer wiring, the description of the step will be eliminated since the step has no direct relation to the features of the embodiment. The conductive layer 18 comprises a silicon layer and a metal silicide formed on an upper portion of the silicon layer. Although the silicon layer is deposited before the forming of the dividing regions GV, the siliciding step may be carried out before or after the division of the gate electrodes MG by the dividing regions GV depending upon a metal material used in the step.

According to the foregoing embodiment, the lower layer insulating film 17a comprises the silicon nitride film 17aa, silicon oxide film 17ab, boundary layer 17ac and silicon oxide film 17ad formed into the multilayer structure. The boundary layer 17ac is interposed between the silicon oxide films 17ab and 17ad thereby to serve as the charge trap layer. Accordingly, since an amount of leak current is suppressed particularly during data writing, the characteristics of the flash memory 1 can be improved. Since the boundary layer 17ac is located nearer to the polycrystalline silicon layer 16 than the high dielectric constant film 17b is, the threshold voltage characteristic in the data writing can be improved. The leak current can be suppressed since the boundary layer 17ac has a higher carbon concentration than the silicon oxide films 17ab and 17ad. Since carbon contained in the region near the boundary layer 17ac particularly has a concentration not less than $10^{19}$ atoms/cm$^3$, the leak current can be suppressed. Furthermore, in forming the lower layer insulating film 17a, one layer of the silicon oxide film 17ab is formed and thereafter exposed to the atmosphere at normal pressure such that the boundary layer 17ac is formed. Consequently, the charge trap layer can easily be formed without provision of complicated station.

In the foregoing embodiment, dichlorosilane ($SiH_2Cl_2$) and dinitrogen monoxide ($N_2O$) are caused to react with each other at about 800° C. so that both silicon oxide films 17ab and 17ad are formed from the same silicon oxide film source (reactive gas). However, dichlorosilane and dinitrogen may be caused to react with each other so that the silicon oxide film 17ab is formed by the CVD method, and thereafter, tridimethylaminosilane ((($CH_3$)2N)3SiH) and ozone may be caused to react with each other so that the silicon oxide film 17ad is formed by the CVD method. In other words, the silicon oxide films 17ab and 17ad may be formed using different reactive gases.

Figure 19:
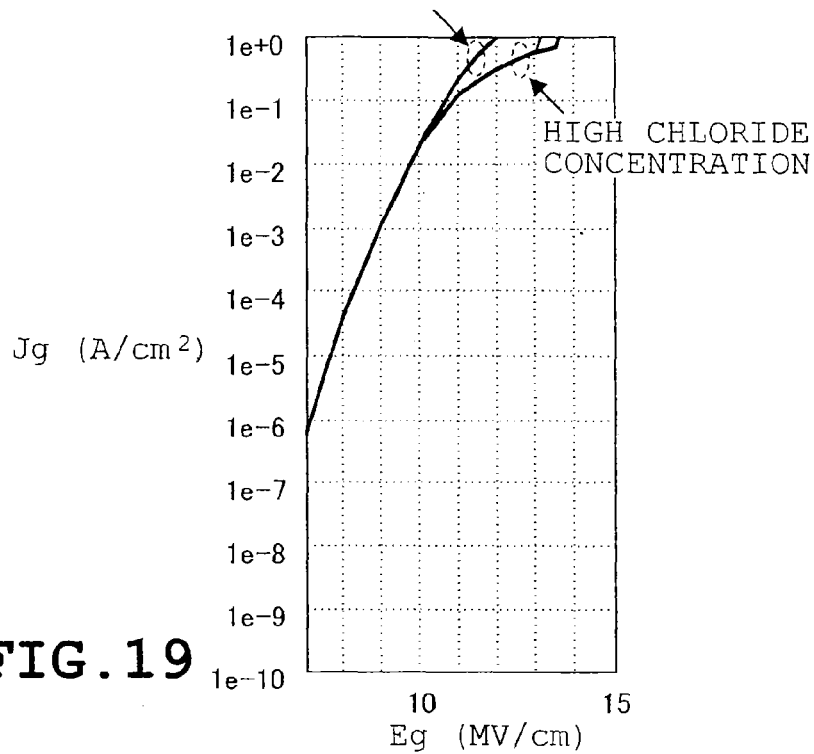
FIG. 19 is a graph showing dependency of the chloride-concentration-dependent leak current on the applied electric field.
Figure 20:
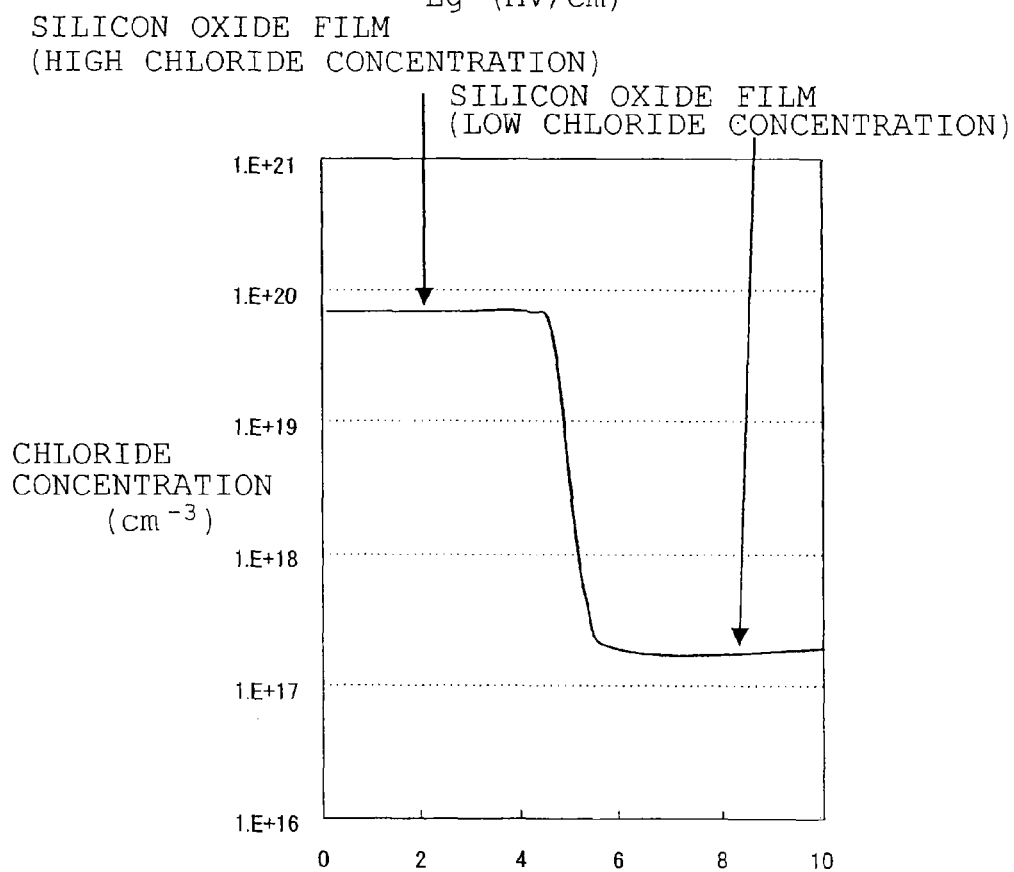
FIG. 20 is a graph schematically showing a chloride concentration in a silicon oxide film.

FIG. 19 shows leak current characteristics of the silicon oxide films according to an amount of chloride measured by the inventors. More specifically, FIG. 19 shows leak current characteristics both in the case where the silicon oxide film contains chloride with concentration of not less than $10^{19}$ atoms/cm$^3$ and in the case where the silicon oxide film contains no chloride. FIG. 20 shows chloride concentrations of silicon oxide films used in the experiment by the inventors.

FIG. 19 shows that an increase in leak current can be suppressed particularly during application of high electric field. The reason for the suppression can be presumed that leak current is suppressed by the presence of chloride in the silicon oxide film as in the above-described case of carbon. Accordingly, it is preferable that each of the silicon oxide films 17ab, 17ad and 17ca constituting the intergate insulating film 17 contains chloride. In particular, it is preferable that the chloride concentration ranges from $10^{19}$ to $10^{20}$ atoms/cm$^3$.

Furthermore, the leak current can be suppressed since each of the silicon oxide films 17ab, 17ad and 17ca contains chloride whose concentration is not less than $10^{19}$ atoms/cm$^3$. More specifically, leak current can be suppressed when any one of the silicon oxide films 17ab, 17ad and 17ca contains chloride. In this case, the silicon oxide films 17ab and 17ad each of which can trap a larger amount of electrons can be formed between the high dielectric constant film 17b and the floating gate electrode FG. An electron trapping efficiency can be improved particularly during data writing. Consequently, a write threshold characteristic can be improved while reduction in the charge holding characteristic is maintained at minimum.

Figure 34:
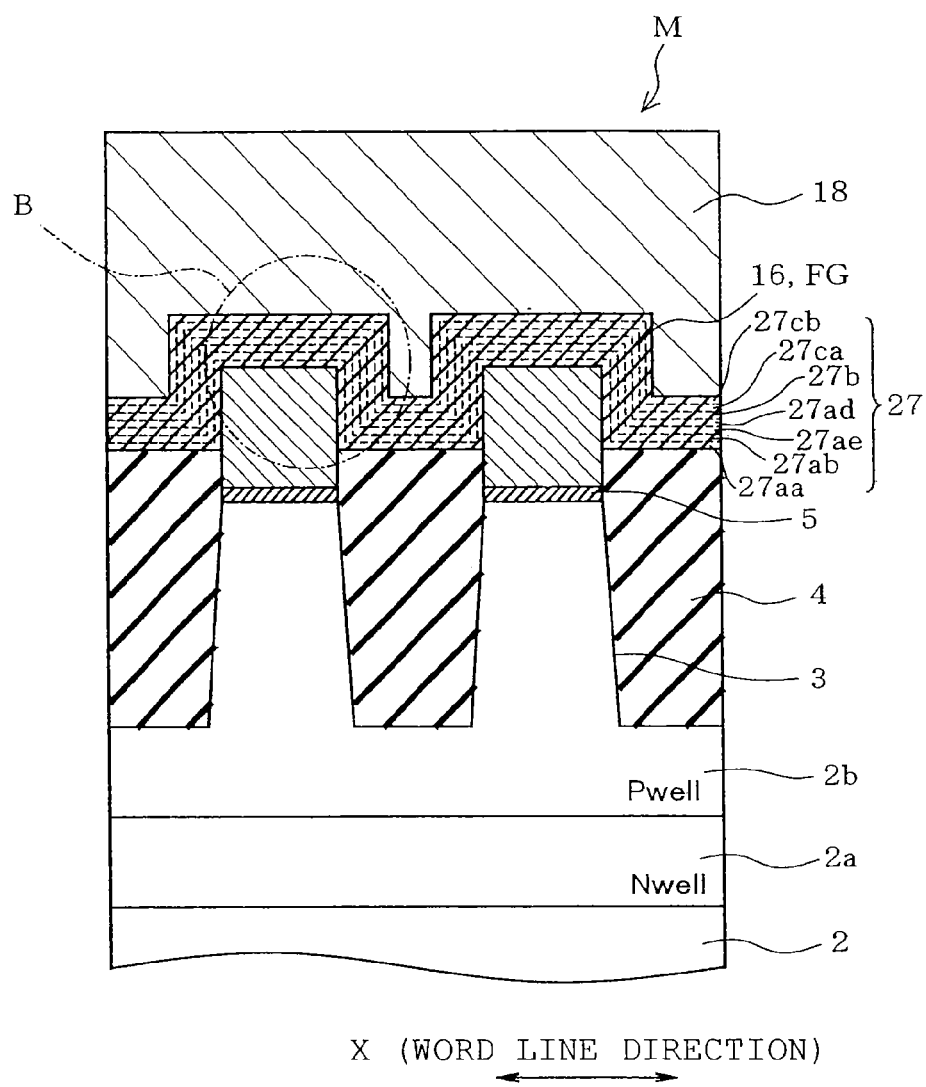
FIG. 34 is a view similar to FIG. 16A, showing a fourth embodiment in accordance with the invention.
Figure 35:
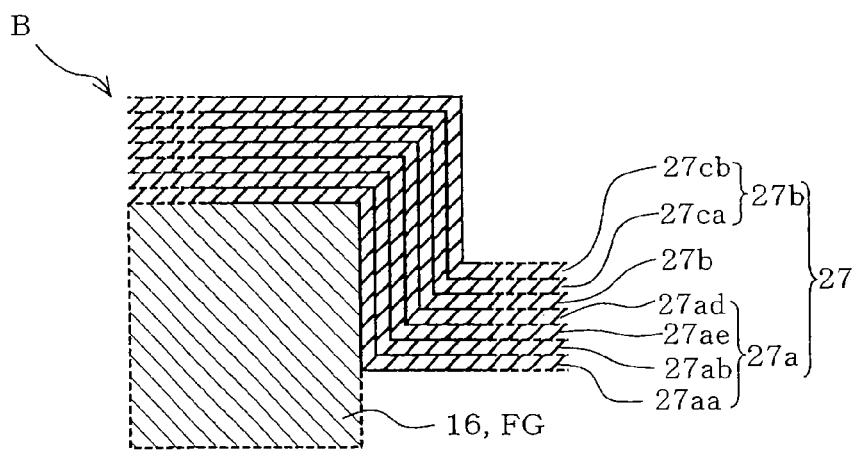
FIG. 35 is a view similar to FIG. 16B.

FIGS. 34 to 37 illustrate a fourth embodiment of the invention. The fourth embodiment differs from the foregoing embodiment in the provision of a silicon nitride film, instead of the boundary layer 17*ac*. As shown in FIGS. 34 and 35, an intergate insulating film 27 is provided instead of the intergate insulating film 17. The intergate insulating film 27 comprises a lower layer insulating film 27*a*, instead of the lower layer insulating film 17*a*, a high dielectric constant film 27*b* serving as the intermediate insulating film and an upper layer insulating film 27*c*, instead of the upper layer insulating film 17*c*, all of which are formed sequentially into a multilayer structure. The lower layer insulating film 27*a* comprises a lower layer silicon nitride film 27*aa*, a lower layer silicon oxide film 27*ab*, a silicon nitride film 27*ae* and a lower layer silicon oxide film 27*ad*, all of which are formed sequentially into a multilayer structure. The upper layer insulating film 27*c* comprises an upper layer oxide film 27*ca* and an upper layer silicon nitride film 27*cb* both of which are formed in turn into a multilayer structure. Since the other structure is substantially the same as in the foregoing embodiment, detailed description thereof will be eliminated.

A fabrication process of the aforementioned structure will now be described. After the polycrystalline silicon layer 16 has been formed on the gate insulating film 5, the silicon nitride film 27*aa* is formed, instead of the silicon nitride film 17*aa* in the same manner as in the foregoing embodiment. The silicon nitride film 27*aa* is formed in the same manner as the silicon nitride film 17*aa*. Subsequently, a mixed gas of dichlorosilane and nitrogen monoxide is caused to react at about 800° C. by the LPCVD method, whereby the silicon oxide film 27*ab* is formed on the silicon nitride film 27*aa*.

Subsequently, the silicon nitride film 27*ae* is formed on the silicon oxide film 27*ab* using a mixed gas of dichlorosilane and ammonia. The silicon nitride film 27*ae* has a film thickness equal to or larger than a single atomic layer. Thereafter, the silicon oxide film 27*ad*, high dielectric insulating film 27*b*, silicon oxide film 27*ca* and silicon nitride film 27*cb* are formed on the upper layer of the silicon nitride film 27*ae*. These films are formed in the same manners as the silicon oxide film 17*ad*, high dielectric insulating film 17*b*, silicon oxide film 17*ca* and silicon nitride film 17*cb*. Accordingly, description of the fabrication method will be eliminated.

The leak current suppressing effect is reduced when the silicon nitride film 27*ae* is located excessively near to or away from the floating gate electrode FG. An optimum location of the silicon nitride film 27*ae* depends upon the multilayer structure, film thickness and electric field applied during element operation. Accordingly, the film thickness is preferably adjusted arbitrarily.

Figure 36:
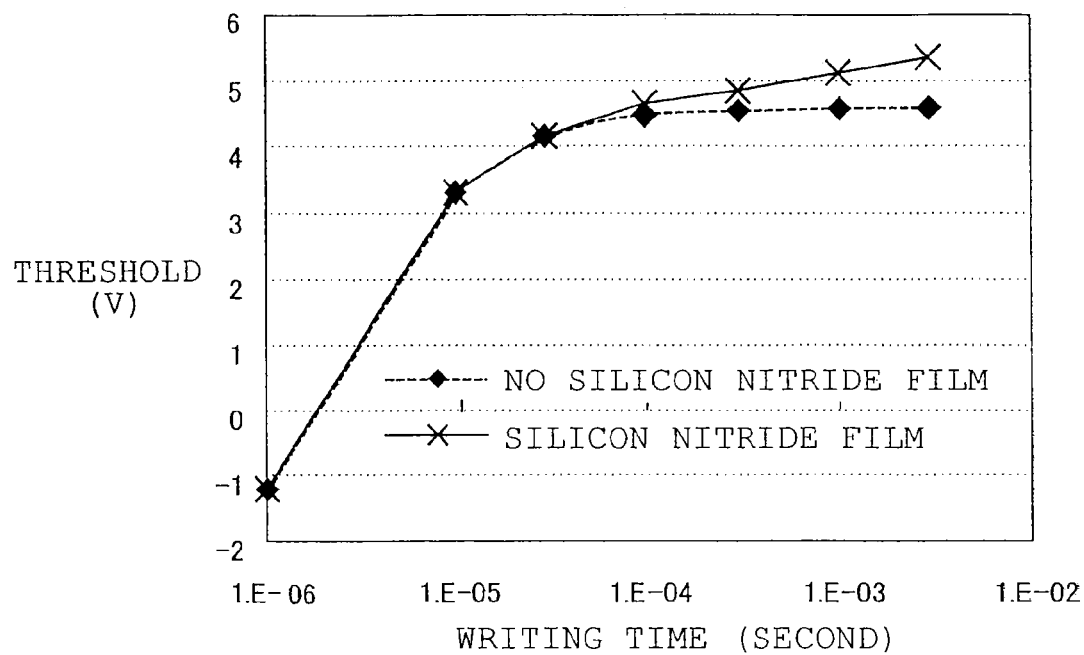
FIG. 36 is a view similar to FIG. 17.

FIG. 36 is a graph showing dependency of threshold voltage on the writing time. As shown, it can be confirmed that the saturated state of the threshold voltage is suppressed such that the saturation voltage is increased when the silicon nitride film 27*ae* is interposed between the silicon oxide films 27*ab* and 27*ad*. In the embodiment, the threshold voltage characteristic during data writing can be improved since the silicon nitride film 27*ae* is formed between the silicon oxide films 27*ab* and 27*ad*.

Figure 37:
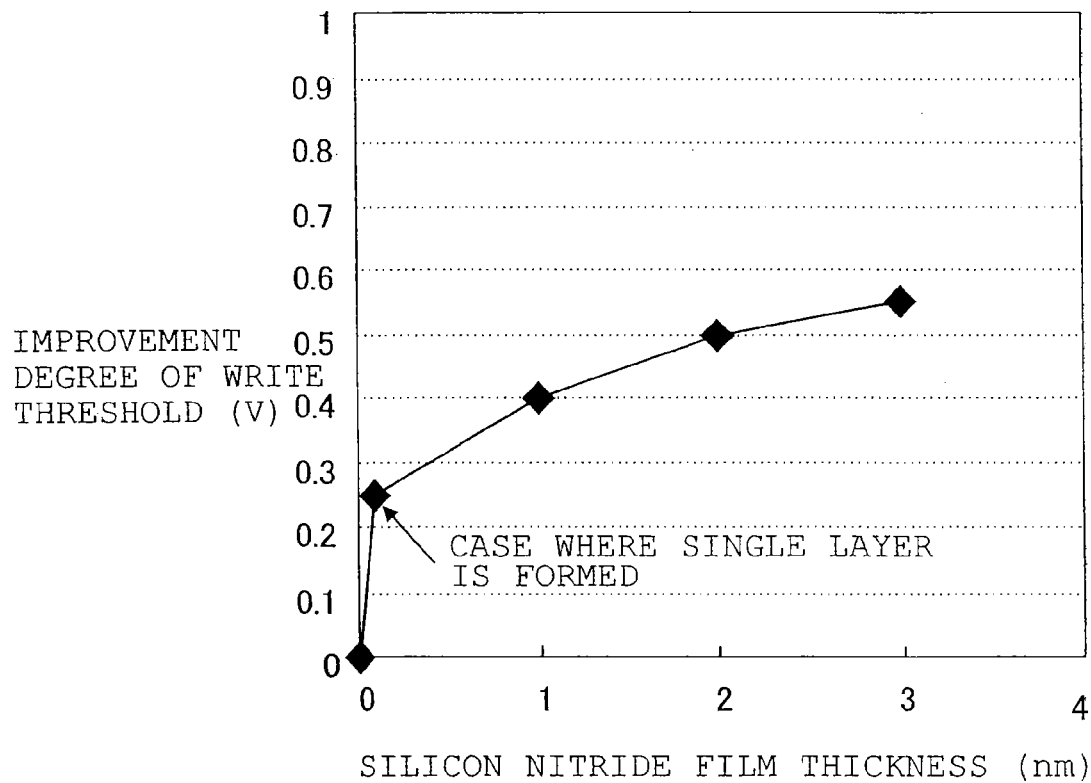
FIG. 37 is a graph showing dependency of writing threshold improvement factor on a film thickness of silicon nitride film.

FIG. 37 shows a degree of improvement in the data writing threshold in the case where a single silicon oxide film 27*ae* is provided in the lower layer insulating film 27*a* of the intergate insulating film 27. As shown, it can be confirmed that the degree of improvement in the data writing threshold becomes higher as the film thickness of the silicon nitride film 27*ae* is large. It can be presumed that the leak current during the application of electric field can be reduced since the lower layer silicon nitride film 27*ae* in the lower layer insulating film 27*a* has a larger barrier height as compared with the high dielectric insulating film 7*b*.

According to the fourth embodiment, the lower layer insulating film 27*a* has a multilayer structure of the silicon nitride film 27*aa*, silicon oxide film 27*ab*, silicon nitride film 27*ae* and silicon oxide film 27*ad*. Consequently, the fourth embodiment can achieve substantially the same effect as the foregoing embodiment.

Figure 38:
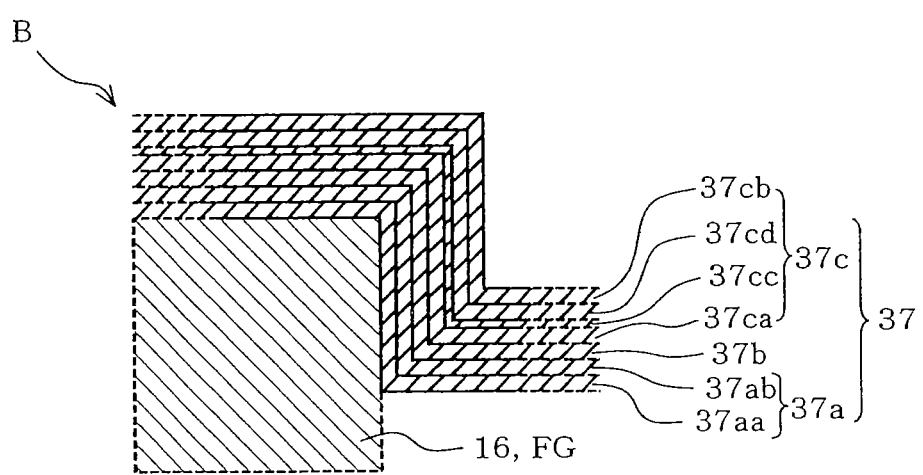
FIG. 38 is a view similar to FIG. 16B, showing a fifth embodiment in accordance with the invention.

FIG. 38 illustrates a fifth embodiment of the invention. The fifth embodiment differs from the third embodiment in that the charge trap layer (the boundary layer 17*ac*) is provided in an insulating film located above the intermediate insulating film (the high dielectric insulating film 17*ab*). In the fifth embodiment, an intergate insulating film is designated by reference numeral "37" instead of the intergate insulating film 17 in the third embodiment. The films designated by numeral "17" with suffix are fabricated in the same manners as described above.

As described in the third embodiment, in the data erasing, the peripheral circuit applies low voltage (0 to 2.5 V, for example) to the word line WL corresponding to data to be erased and high voltage to the p-well 2*b*. As a result, electrons go through the floating gate electrode FG into the p-well 2*b*, whereby data is erased. In this case, since the electrons are injected from the conductive layer 18 into the floating gate electrode FG, there is a possibility that the threshold voltage of the memory cell transistor Trm in the data erasing may be saturated.

In view of the above-described problem, the embodiment provides a layer structure of the intergate insulating film 37 as shown in FIG. 38. The intergate insulating film 37 comprises a lower layer insulating film 37*a*, a high dielectric insulating film 37*b* serving as the intermediate insulating film and an upper layer insulating film 37*c*, all of which are deposited into a depositional structure. The lower insulating film 37*a* comprises a lower layer silicon nitride film 37*aa* and a lower layer silicon oxide film ab, both of which are formed in turn into a multilayer structure. The upper layer insulating film 37*c* comprises an upper layer silicon oxide film 37*ca*, a boundary layer 37*cc*, an upper layer silicon oxide film 37*cd* and an upper layer silicon nitride film 37*cb*, all of which are formed sequentially into a multilayer structure.

The upper layer silicon oxide film 37*cd* is formed from the same material gas and by the same fabrication method as the silicon oxide film 37*ca*. The boundary layer 37*cc* is formed by the same fabrication method as the boundary layer 17*ac*. More specifically, when the upper layer insulating film 37*c* is formed, the single silicon oxide film 37*ca* is formed and thereafter exposed to the atmosphere at normal pressure such that the boundary layer 37*cc* is formed. As a result, the boundary layer 37*cc* can easily be formed as the charge trap layer without any complicated step.

According to the foregoing embodiment, the electron trap efficiency can be improved particularly in the data erasing since the boundary layer 37*cc* is formed between the high dielectric insulating film 37*b* and the control electrode CG. Consequently, the threshold voltage characteristic of the memory cell transistor Trm during data erasing can be improved while the charge holding characteristic is maintained at minimum.

The third to fifth embodiments can be modified or expanded as follows. Although the boundary layer 17ae is provided in the lower layer insulating film 17a in the third embodiment, a plurality of, for example, tow layers of boundary layers 17ac may be formed between the silicon oxide films 17ab and 17ad of the lower layer insulating film 17a.

In forming the boundary layer 17ac in the third embodiment, after the silicon oxide film 17ab has been formed, nitrogen purge may be carried out in a furnace the interior of which is maintained in an evacuated state, so that the silicon oxide film 17ad is formed. This fabrication method can also provide the boundary layer 17ac with an increased carbon content. Thus, the boundary layer 17ac can be formed without exposure to the atmosphere.

In forming the boundary layer 37cc in the fifth embodiment, after the silicon oxide film 37ca has been formed, nitrogen purge may be carried out in a furnace the interior of which is maintained in an evacuated state, so that the silicon oxide film 37cd is formed. This fabrication method can also provide the boundary layer 37cc with an increased carbon content. Thus, the boundary layer 37cc can be formed without exposure to the atmosphere.

A single layer aluminum oxide ($Al_2O_3$) film is used as the high dielectric insulating films 17b, 27b and 37b in the foregoing embodiments. However, each of the insulating films 17b, 27b and 37b may comprise any one of a magnesium oxide (MgO) film having a relative permittivity of about 10, a yttrium oxide ($Y_2O_3$) film having a relative permittivity of about 16, a hafnium oxide ($HfO_2$) film having a relative permittivity of about 22, a zirconium oxide ($ZrO_2$) film and a lanthanum ($La_2O_3$) film. Furthermore, the high dielectric insulating film 7b may be an insulating film comprising a ternary compound, such as a hafnium silicate (HfSiO) film or a hafnium aluminate (HfAlO) film. Additionally, each of the high dielectric insulating films 17b, 27b and 37b may comprise an oxide film or a nitride film including at least any one of silicon (Si), aluminum (Al), magnesium (Mg), yttrium (Y), hafnium (Hf), zirconium (Zr), lanthanum (La), strontium (Sr), scandium (Sc), gadolinium (Gd), samarium (Sm), tantalum (Ta), barium (Ba) and bismuth (Bi). The high dielectric insulating film may comprise any material when having a relative permittivity larger than 7 that is a relative permittivity of a silicon nitride film.

In the third to fifth embodiments, the boundary layers 17ac and 37cc are provided in the lower layer insulating film 17a and the upper layer insulating film 37c respectively. However, the lower and upper layer insulating films 37a and 37c may be combined to the high dielectric insulating films 17b and 37b as lower and upper layers so that the boundary layers 17ac and 37cc are provided in the upper and lower layers of the high dielectric insulating films 17b and 27b, respectively. Consequently, both data writing and erasing characteristics can be improved.

In the third embodiment, the intergate insulating film 17 comprises the multilayer structure of the lower layer insulating film 17a, high dielectric insulating film 17b and upper layer insulating film 17c. The lower layer insulating film 17a comprises the silicon nitride film 17aa, silicon oxide film 17ab, boundary layer 17ac and silicon oxide film 17ad. The upper layer insulating film 17c comprises the silicon oxide film 17ca and silicon nitride film 17cb. However, the intergate insulating film 17 may comprise a multilayer structure of the silicon oxide film 17ab, boundary layer 17ac, silicon oxide film 17ad, high dielectric insulating film 17b and silicon oxide film 17ca, instead. In other words, the multilayer structure may be applied to a configuration having no silicon nitride films 17aa and 17cb.

In the fifth embodiment, the intergate insulating film 37 comprises the multilayer structure of the lower layer insulating film 37a, high dielectric insulating film 37b and upper layer insulating film 37c. The lower layer insulating film 37a comprises the silicon nitride film 37aa and silicon oxide film 37ab. The upper layer insulating film 37c comprises the silicon oxide film 37ca, boundary layer 37cc, silicon oxide film 37cd and silicon nitride film 37cb. However, the intergate insulating film 37 may comprise a multilayer structure of the silicon oxide film 37ab, high dielectric insulating film 37b, silicon oxide film 37ca, boundary layer 37cc and silicon oxide film 37cd, instead. In other words, the multilayer structure may be applied to a configuration having no silicon nitride films 37aa and 37cb.

In the fourth embodiment, the intergate insulating film 27 comprises the multilayer structure of the lower layer insulating film 27a, high dielectric insulating film 27b and upper layer insulating film 27c. The lower layer insulating film 27a comprises the silicon nitride film 27aa, silicon oxide film 27ab, silicon nitride film 27ae and silicon oxide film 27ad. The upper layer insulating film 27c comprises the silicon oxide film 27ca and silicon nitride film 27cb. However, for example, the intergate insulating film 27 may comprise a multilayer structure of the silicon oxide film 27ab, silicon nitride film 27ae, high dielectric insulating film 27b and silicon oxide film 27ad. In other words, the multilayer structure may be applied to a configuration having no silicon nitride films 27aa and 27cb.

In the fourth embodiment, the silicon nitride film 27ac is formed by the CVD method using the mixed gas of dichlorosilane and ammonia. However, a silane gas may be used as a silicon source and may include monosilane, trichlorosilane, tetrachlorosilane, hexachlorosilane and BTBAS. Radical nitrogen may be used as a nitrogen source. Furthermore, the silicon nitride film 7ae may be formed by an atomic layer deposition (ALD) method. A silicon oxide film may be nitrided thermally or radically thereby to be formed into a silicon oxynitride film, instead of the silicon nitride film 27ae.

The invention is applied to the nonvolatile semiconductor memory device 1 provided with the multilayer structure of the floating gate electrode FG, intergate insulating film 17, 27 or 37, control electrode CG. However, the invention may also be applied to other NOR nonvolatile semiconductor memory devices.

FIGS. 39A to 56 illustrate a sixth embodiment of the invention. The sixth embodiment differs from the foregoing embodiments in the multilayer structure of the intergate insulating film. The intergate insulating film described in the foregoing embodiment is designated by reference numeral "47" in the sixth embodiment.

Figure 39A:
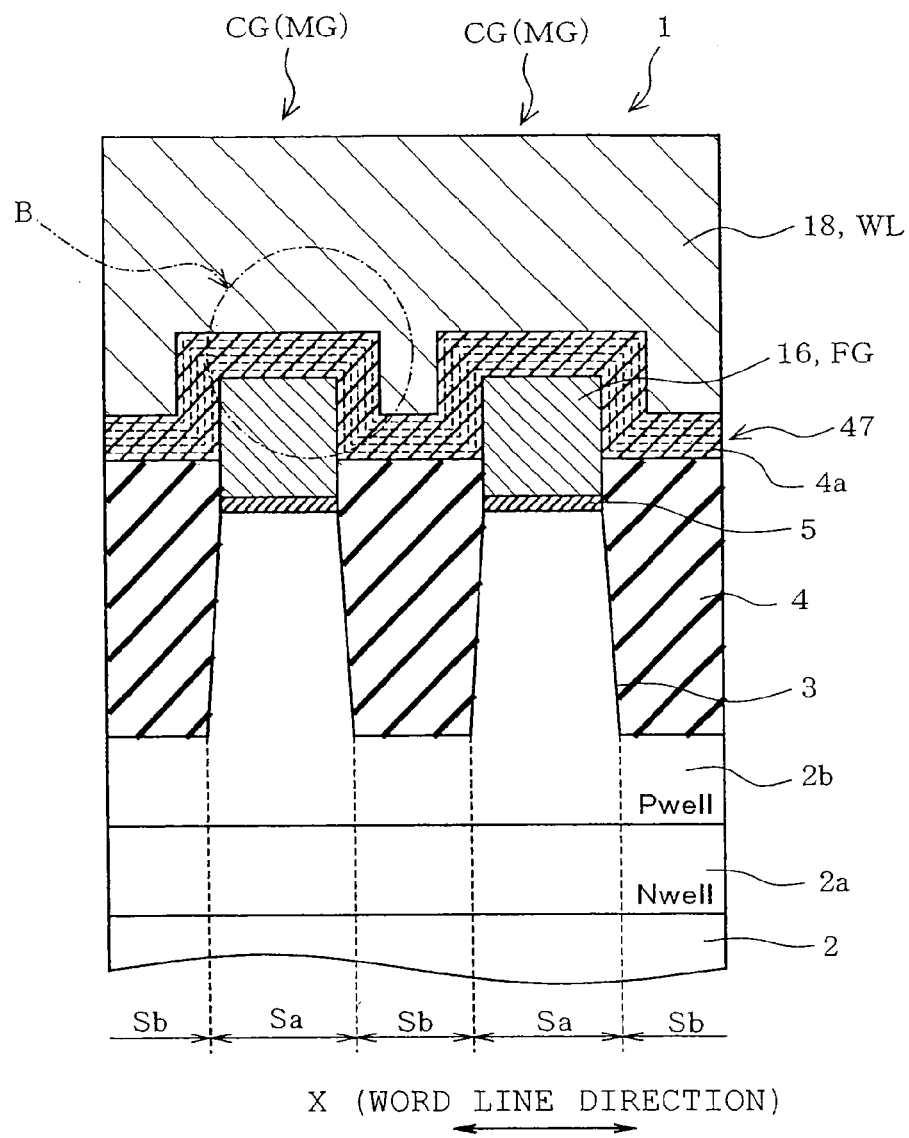
FIG. 39A is a view similar to FIG. 3, showing a sixth embodiment in accordance with the invention.

Referring to FIG. 39A, the intergate insulating film 47 is formed along the upper surface of the element isolation insulating film 4, and the upper side surface and upper surface of the floating gate electrode FG. The intergate insulating film 47 serves as an interpoly insulating film, an interlayer insulating film, an interelectrode insulating film and a second insulation layer. The intergate insulating film 47 comprises a lower layer insulating film 47a, a high dielectric insulating film 47b and an upper layer insulating film 47c all of which are formed sequentially into a multilayer structure. The lower layer insulating film 47a comprises a lower layer silicon nitride film 47aa, a high dielectric insulating film 47ab and a lower layer silicon oxide film 47ac all of which are formed sequentially into a multilayer structure. The upper layer insulating film 47c comprises an upper layer silicon oxide film 47ca and an upper layer silicon nitride film 47cb both of which are formed in turn into a multilayer structure.

The high dielectric insulating film 47b comprises an aluminum oxide ($Al_2O_3$) film and serves as an intermediate insulating film. The aluminum oxide film has a larger dielectric constant than an ONO film (specific dielectric constant: about 5). When an oxide of metal other than transition metals such as aluminum (Al) is applied, trapped charge is prevented from re-discharge, whereupon threshold variations can be suppressed. Furthermore, the lower layer silicon nitride film 47aa can effectively prevent metal elements contained in the high dielectric insulating film 47b from diffusion to the gate insulating film 5 and the element isolation insulating film 4. The lower layer silicon nitride film 47aa can further prevent an oxidizing agent from diffusion to the gate insulating film 5 and the element isolation insulating film 4 during the forming of the silicon oxide films 47ac and 47ca. Additionally, since the upper layer silicon nitride film 47cb is provided, metal elements contained in the high dielectric insulating film 47b and the like can effectively be prevented from upward diffusion.

The conductive layer 18 is formed on the intergate insulating film 47 so as to extend in the word line direction. The conductive layer 18 serves as word lines WL which connect the control electrodes CG of the memory cell transistors Trm to one another. The conductive layer 18 comprises a polycrystalline silicon layer and a silicide layer formed directly on the polycrystalline silicon layer by siliciding any one of tungsten, cobalt, nickel or the like. The gate electrode MG of each memory cell transistor Trm is thus formed on the gate insulating film 5 and comprises the floating gate FG (polycrystalline silicon layer 16), intergate insulating film 47 and control electrode CG all of which are formed sequentially into a multilayer structure.

Figure 39B:
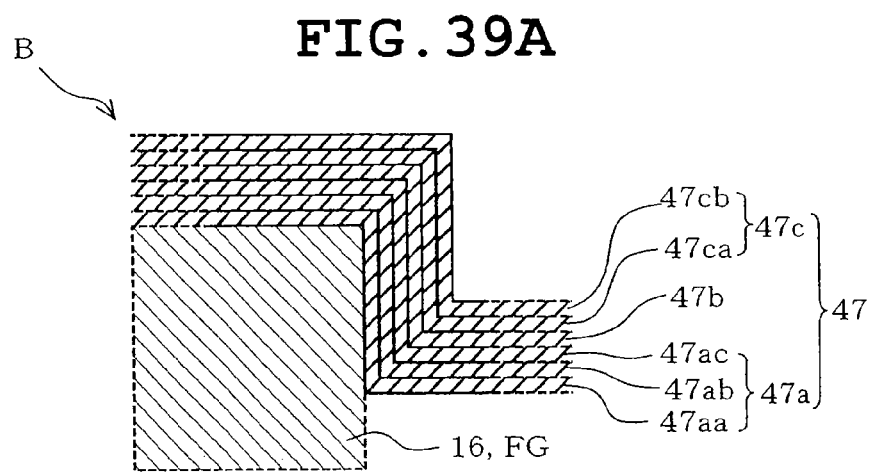
FIG. 39B is an enlarged sectional view of part B as shown in FIG. 39A.
Figure 39C:
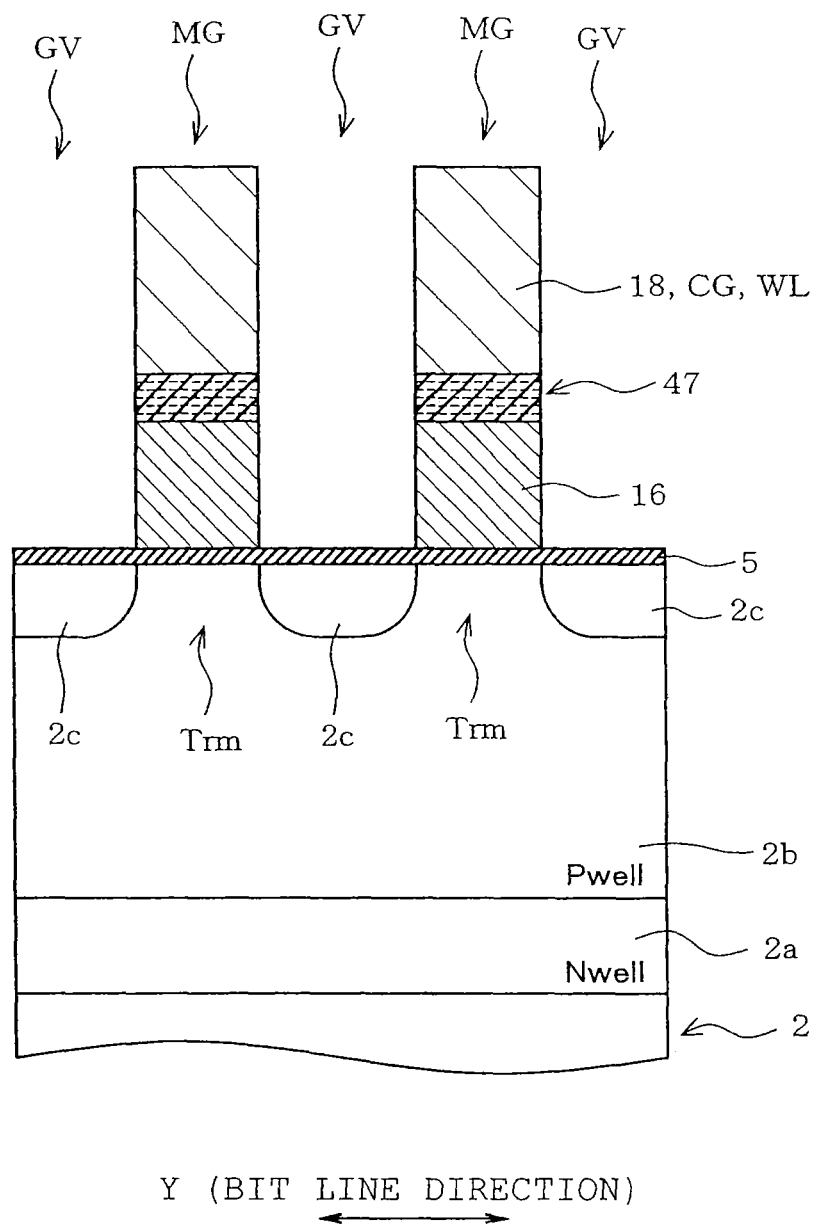
FIG. 39C is a view similar to FIG. 4.

The gate electrodes MG of the memory cell transistors Trm are arranged in the bit line direction as shown in FIG. 39C. The gate electrodes MG are electrically divided by dividing regions GV. Interlayer insulating films and the like are provided in the dividing regions GV although not shown in the drawings. The diffusion layers (source/drain regions) 2c are formed in the surface layer of the silicon substrate 2 so as to be located between lower ends of the adjacent gate electrodes MG. Each memory cell transistor Trm includes the gate insulating film 5, the gate electrode MG and the source/drain region 2c.

The flash memory 1 of the embodiment is writable/erasable when a peripheral circuit (not shown) applies a high electric field between the word line WL and the p-well 2b and a predetermined voltage is applied to each electric element (source/drain). A multivalued memory technique has been developed for the purpose of storing multivalued information by a single memory cell with recent requirement. Multivalued memory is carried out by controlling a threshold of each memory cell transistor Trm in three, four or more multiply distributions. Here, binary memory will be described for simplification of description. In the writing, the peripheral circuit applies high voltage (20 V, for example) to the word line WL selected for the writing and low voltage (0 to intermediate voltage 10 V, for example) to the p-well 2b. As a result, Fowler-Nordheim tunneling current flows through the gate insulating film 5 such that electrons are injected into the charge storage layer FG, whereupon a threshold voltage of the memory cell transistor Trm is shifted in a positive direction. Furthermore, in the erasing, the peripheral circuit applies low voltage (0 to 2.5 V, for example) to the word line WL corresponding to data to be erased and high voltage to the p-well 2b. As a result, electrons go through the charge storage layer FG into the p-well 2b, so that the threshold voltage of the memory cell transistor Trm in a negative direction, whereby data is erased.

In particular, when positive high electric field is applied between the word line WL and the p-well 2b in the writing, leak current results from electrons going from the floating gate electrode FG through intergate insulating film 17 to the word line WL side. As a result, an amount of electrons stored in the floating gate electrode FG is saturated and accordingly, the threshold voltage of the memory cell transistor Trm is also saturated. In view of this, the above-described multilayer structure of intergate insulating film 17 is employed in the embodiment.

Figure 40:
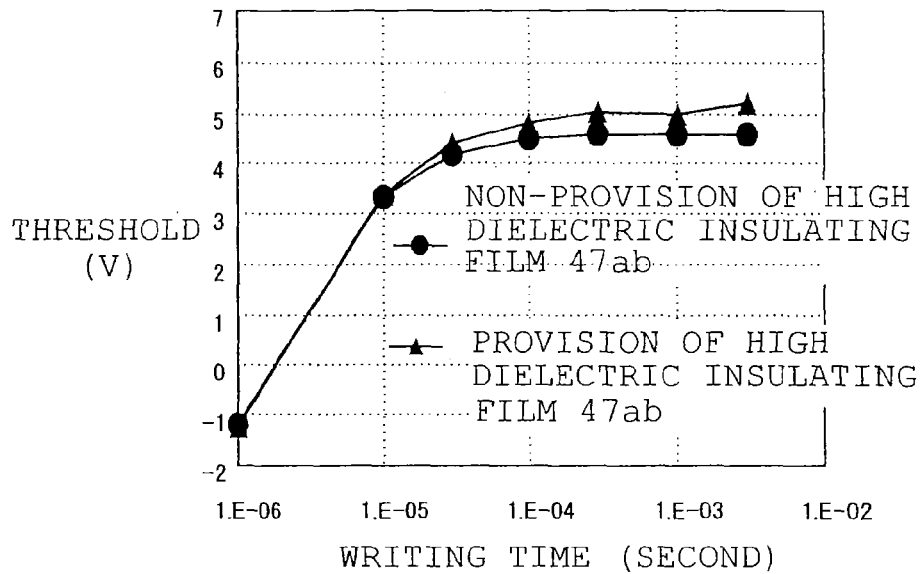
FIG. 40 is a graph showing the dependency of a threshold voltage on a writing time (similar to FIG. 17)

FIG. 40 shows time dependency of the threshold voltage in the writing. As shown, the threshold voltage of each memory cell transistor Trm is increased according to an increase in the writing time. The inventors compared a case where a multilayer structure of the silicon nitride film 47aa and the silicon oxide film 47ac was employed as the lower layer insulating film 4a of the intergate insulating film 47 without provision of the high dielectric insulating film 47ab and a case where a multilayer structure was provided with the high dielectric insulating film 47ab between the silicon nitride film 47aa and the silicon oxide film 47ac. As shown in FIG. 40, in the case where no boundary layer 17ac is provided, the threshold voltage is saturated even when the writing time is increased. However, in the case where the boundary layer 17ac is interposed between the silicon oxide film 17ab and the silicon oxide film 17ad, the saturated condition of the threshold voltage is suppressed when the writing time is increased, whereupon the saturation voltage is increased.

The reason for saturation of threshold voltage is described as follows. When the positive high voltage is applied between the control gate electrode CG and the substrate 2 during the writing, electrons are injected through the gate insulating film 5 into the floating gate electrode FG. When a saturated state has been reached, the electrons flows through the intergate insulating film 47 to the control electrode CG side, whereupon a tunnel current flowing through the gate insulating film 5 is balanced with a leak current flowing through the gate insulating film 47. In this case, the tunnel probability is reduced concerning the electrons flowing from the floating gate electrode FG to the control gate electrode CG side, whereupon the threshold voltage is saturated. When the high dielectric insulating film 47ab is provided, saturation of the threshold voltage cannot be confirmed even if the writing time is increased. The reason for this can be that the high dielectric insulating film 47ab relaxes electric field in the region of the high dielectric insulating film 47ab with increase in the dielectric constant. In this case, the tunnel distance of electrons can be increased as compared with conventional configurations. As a result, the tunnel probability of electrons can be reduced, and an amount of leak current during application of high electric field can be reduced.

Figure 41:
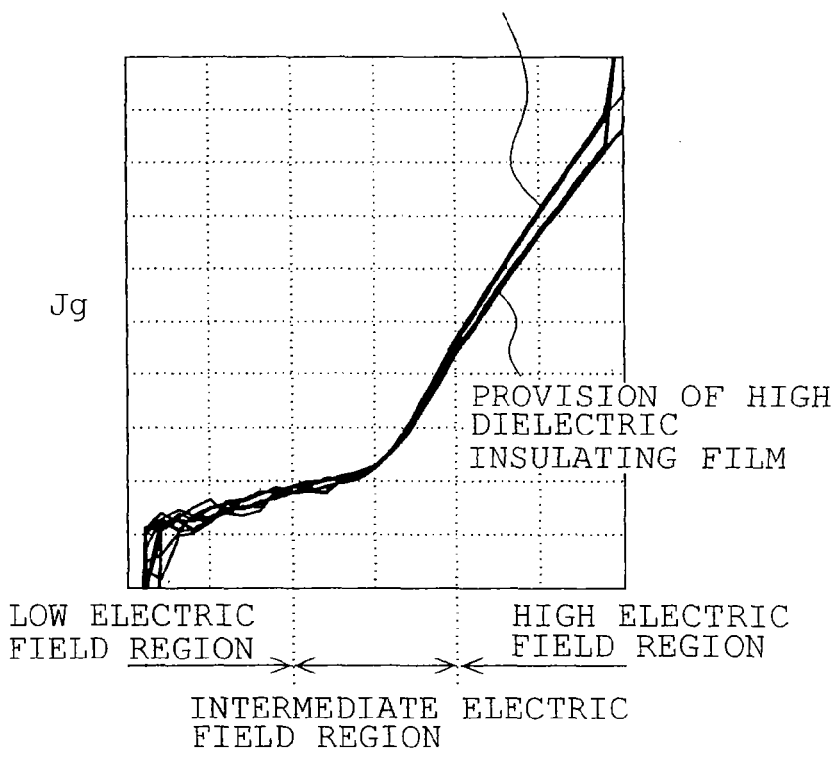
FIG. 41 is a graph showing the dependency of leak current on the applied electric field.

FIG. 41 shows the dependency of leak current flowing into the intergate insulating film upon applied voltage. As shown, the leak current value is substantially the same in the low electric field area. However, the leak current changes from the middle electric field area to the high electric field area. The reason for this is that a physical film thickness is increased as the result of provision of high dielectric insulating film nearer to the floating gate electrode FG side than the intermediate insulating film 47b, whereupon the tunneling distance of electrons is increased. It is confirmed that this effect is remarkable when the high dielectric insulating film 47ab is formed from a material having a higher specific dielectric constant and a larger barrier height.

Figure 42:
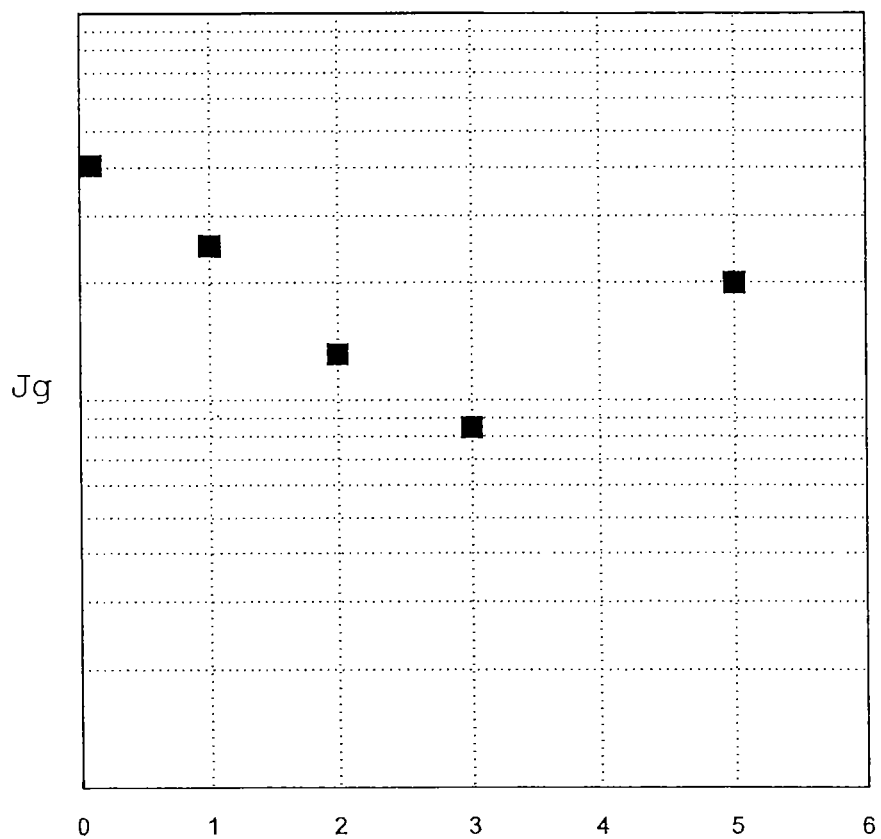
FIG. 42 is a graph showing the dependency of leak current on the film thickness.

Furthermore, FIG. 42 shows the dependency of the leak current value upon the film thickness in the case where electric field of 10 MV/cm is applied to the intergate insulating film. As shown, the leak current is reduced when the film thickness of the high dielectric insulating film 47ab exceeds 0 nm and is not more than 3 nm. However, the leak current is increased when the film thickness of the high dielectric insulating film 47ab is set at 5 nm. Accordingly, the film thickness of the high dielectric insulating film 47ab is preferably set at a value that is not more than 3 nm for the purpose of reduction in the leak current. Thus, the lower limit of the leak current is obtained depending upon the film thickness of the high dielectric insulating film 47ab. The reason for this can be presumed as follows. FIGS. 43A and 43B schematically show band structures near the forbidden band and the conducive band respectively. The height of the silicon oxide film is larger than the height of the aluminum oxide ($Al_2O_3$) film as the barrier height when the intergate insulating film 47 is formed by depositing SiN (the silicon nitride film 47aa), $Al_2O_3$ film (the high dielectric insulating film 47ab) and so on in this sequence so as to extend from the floating gate electrode FG to the control electrode CG side. When the high dielectric insulating film 47ab is set at a suitable film thickness (3 to 4 nm, for example), the silicon oxide film 47ac formed in the upper layer of the high dielectric insulating film 47ab functions as a tunnel insulating film. Accordingly, the intergate insulating film 47 achieves the characteristic of a predetermined tunneling film thickness D1.

However, as shown in FIG. 43B, the silicon oxide film 47ac does not function as the tunnel insulating film when the high dielectric insulating film 47ab has a film thickness larger than a predetermined value (3 to 4 nm, for example). In this case, a tunnel film thickness D2 becomes smaller than the aforesaid tunnel film thickness. Accordingly, it is presumed that a predetermined lower limit of the high dielectric insulating film 47ab is obtained in view of the characteristic of leak current.

The high dielectric insulating film may comprise an oxide film containing yttrium or hafnium other than aluminum. When the electric field of 10 MV/cm is applied to the intergate insulating film 47, an optimum film thickness is about 3 nm in the case where the aluminum oxide film is applied. The optimum film thickness is about 4 nm when the yttrium oxide film is applied. The optimum film thickness is about 8 nm when the hafnium oxide film is applied.

Figure 44:
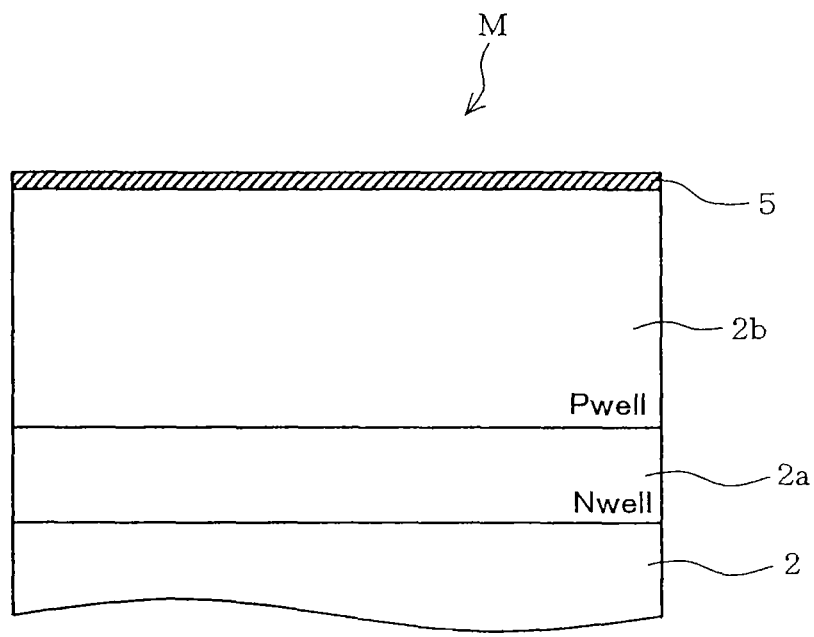
FIGS. 44 to 56 are sectional views of the structure of FIG. 39A in sequential fabrication steps (Nos. 1 to 13)
Figure 45:
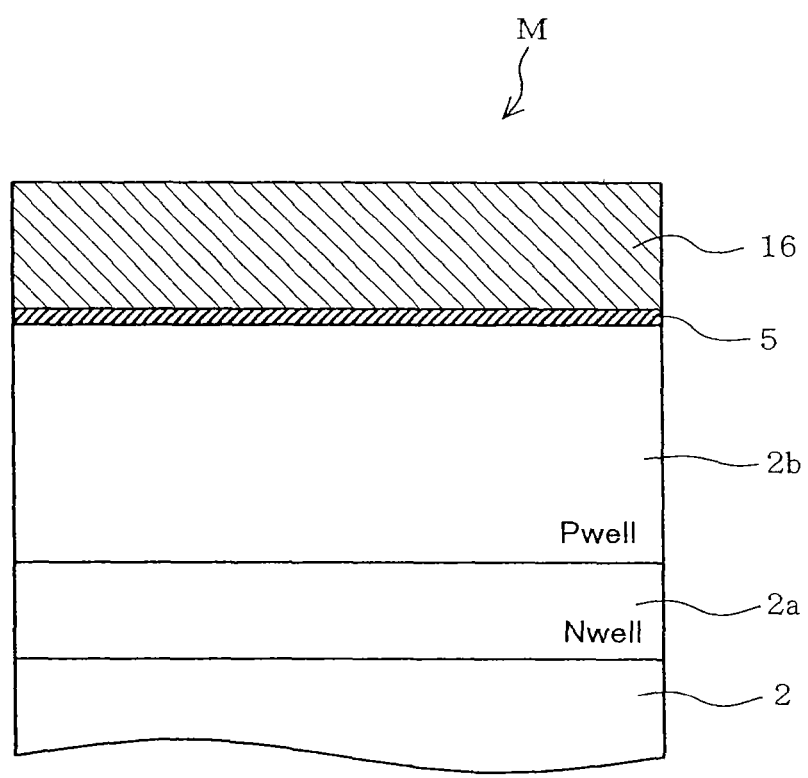
Figure 46:
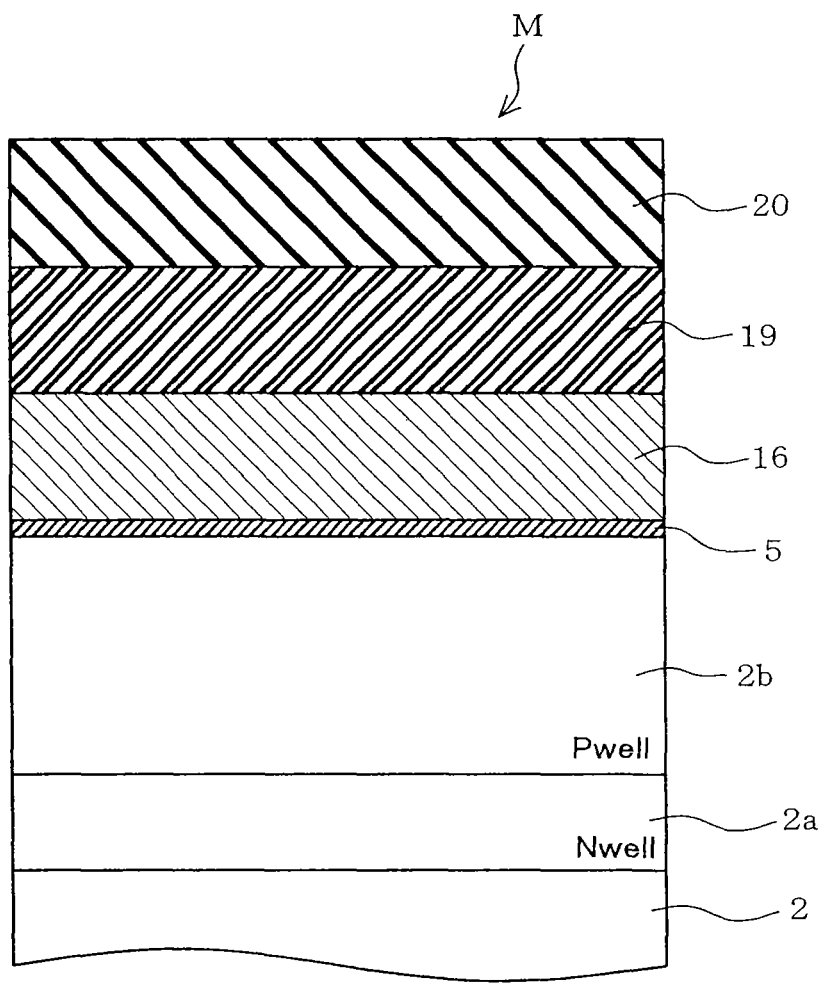
Figure 47:
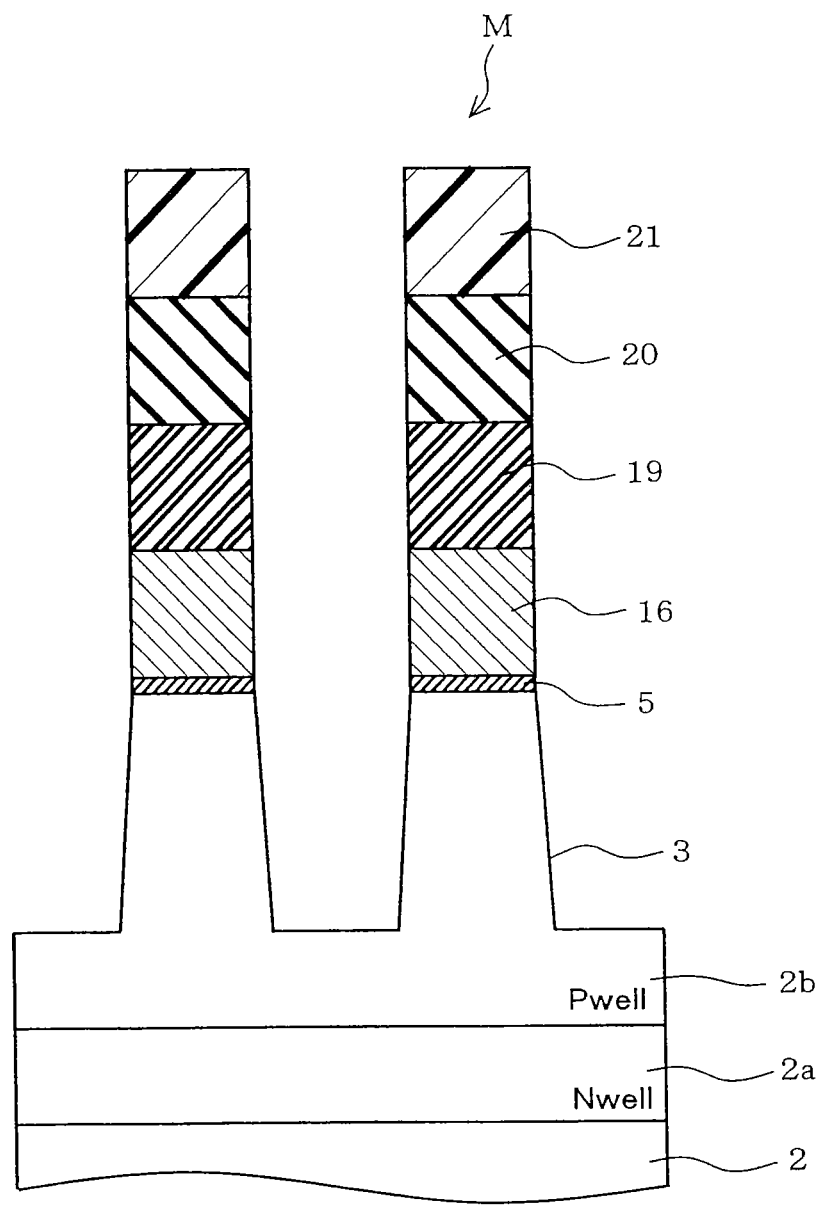

A method of fabricating the nonvolatile flash memory will now be described. The n-wells 2a and p-wells 2b are formed in turn in the surface layer of p-monocrystal silicon substrate 2, and the gate insulating film 5 having a predetermined film thickness ranging from 1 to 15 nm is formed on the silicon substrate 2, as shown in FIG. 44. Subsequently, amorphous silicon is deposited on the gate insulating film 5 by the CVD method so as to have a film thickness ranging from 10 to 200 nm as shown in FIG. 45. The amorphous silicon is converted to a polycrystalline silicon by a subsequent thermal treatment, thereby serving as the conductive layer 16 (the floating gate electrode FG). Subsequently, as shown in FIG. 46, the silicon nitride film 19 is deposited by the CVD method so as to have a film thickness ranging from 50 to 200 nm.

Next, the silicon oxide film 20 is then deposited as a hard mask by the CVD method so as to have a film thickness ranging from 50 to 400 nm.

Subsequently, the photoresist 21 is coated and then patterned by a lithography technique, and an anisotropic etching treatment is carried out for the silicon oxide film 20 by the RIE method with the patterned resist 21 serving as a mask. Subsequently, the photoresist 21 is removed by ashing or the like. Another anisotropic etching treatment is then carried out for the silicon nitride film 19 by the RIE method with the silicon oxide film 20 serving as a mask. The conductive layer 16, gate insulating film 5 and upper part of the silicon substrate 2 are anisotropically etched by the RIE method, whereupon the element isolation trenches 3 are formed in the surface layer of the silicon substrate 2.

Figure 48:
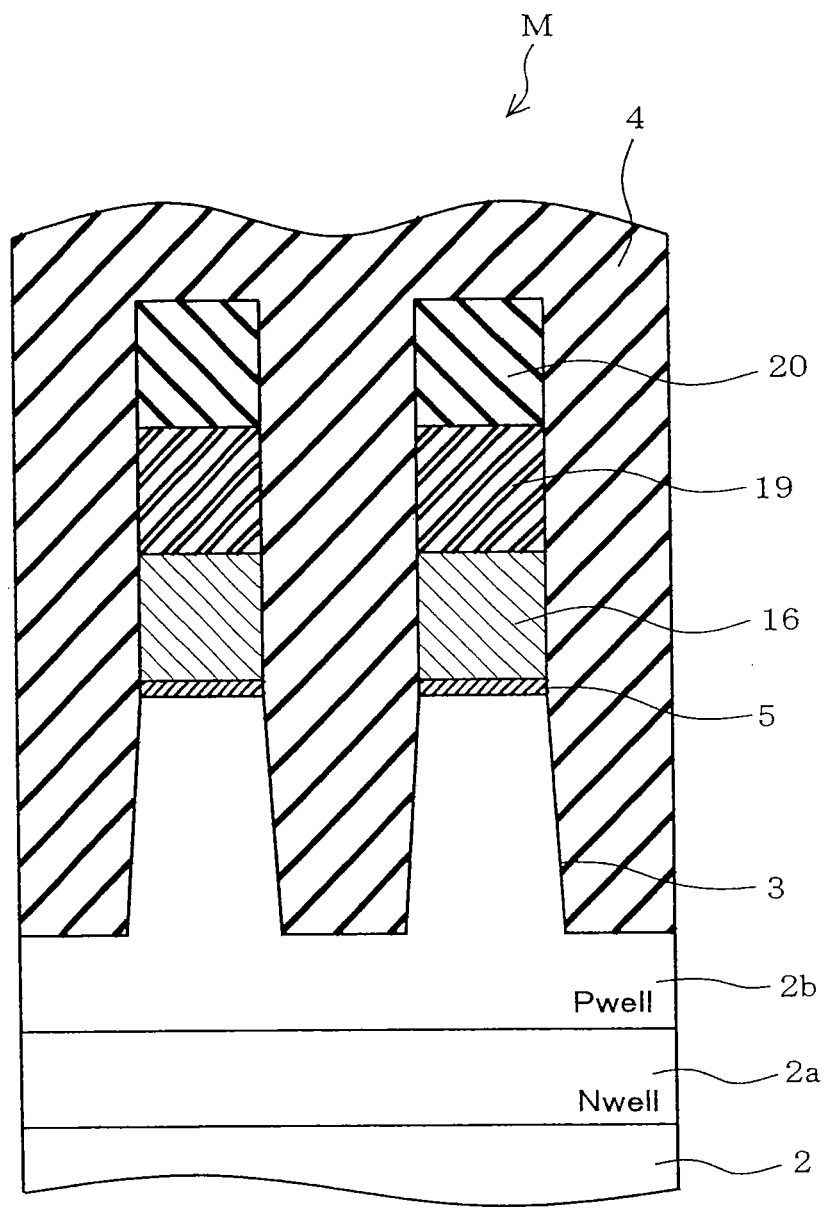

Subsequently, the element isolation insulating films (silicon oxide films) 4 are buried in the element isolation trenches 3 as insulating films using a coating technique and an insulating film forming technique as shown in FIG. 48. Each element insulating film 4 has a film thickness ranging from 200 to 1500 nm. In this case, each element isolation insulating film 4 is formed so that the upper surface thereof is located above the upper surface of the silicon oxide film 20. When the element isolation insulating films 4 are formed by coating a polysilazane solvent is coated by a coating technique, the polysilazane solvent is thermally treated in an oxygen atmosphere or steam atmosphere thereby to be high-densified. As a result, the polysilazane solvent is converted to a coating type insulating film or silicon oxide film thereby to be formed into the element isolation insulating film 4.

Figure 49:
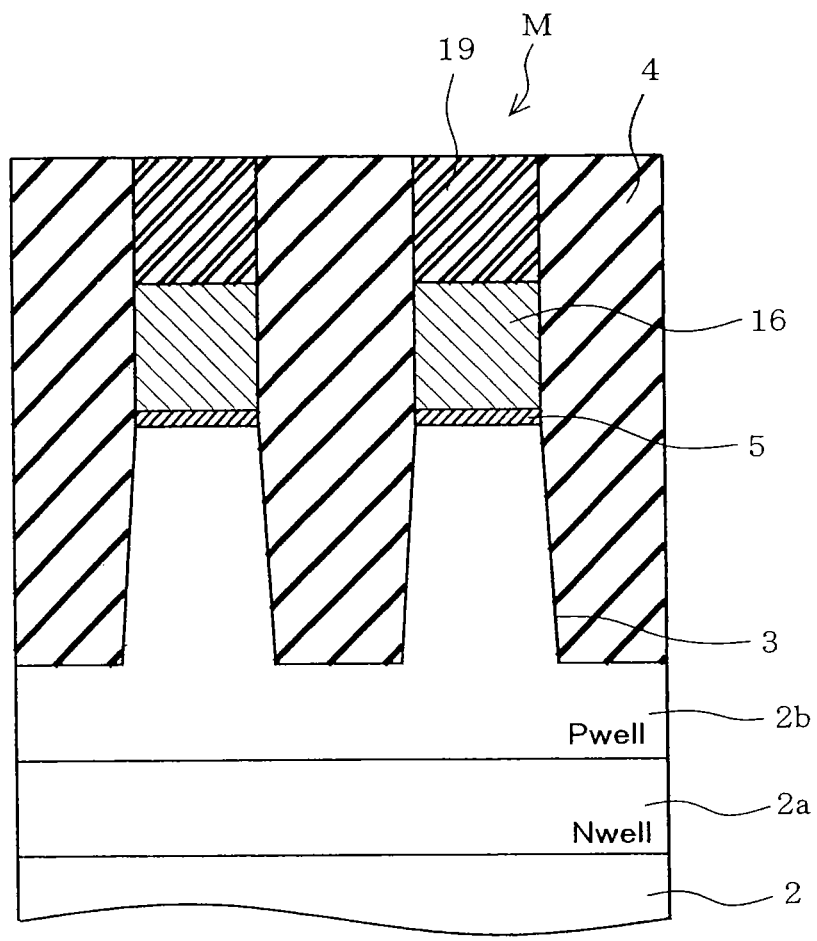
Figure 50:
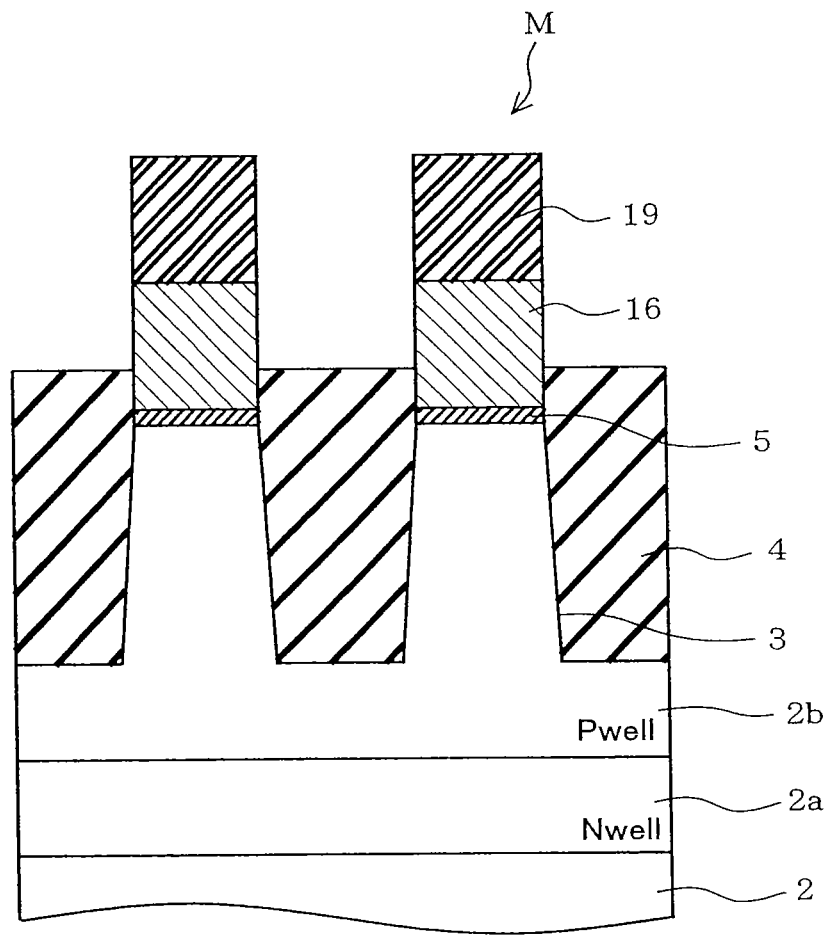
Figure 51:
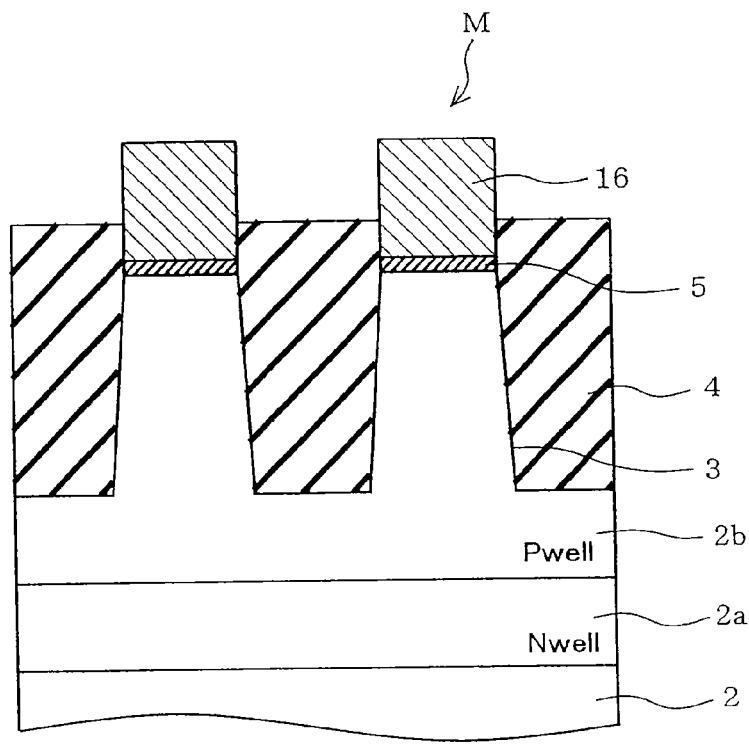

Subsequently, an upper surface of the element isolation insulating film 4 is planarized by the chemical mechanical polishing (CMP) method with the silicon nitride film 19 serving as a stopper as shown in FIG. 49. Next, as shown in FIG. 50, the upper surface of the element isolation insulating film 4 is treated by hydrofluoric acid (HF) under the condition having higher selectivity than the silicon nitride film 19, whereby the upper surface of the element isolation insulating film 4 is removed by an etch-back process so as to be located above an upper surface of the gate insulating film 5 and below an upper surface of the conductive layer 16. Next, the silicon nitride film 19 is removed using a chemical solution so that the upper surface of the polycrystalline silicon layer 16 is exposed.

Figure 52:
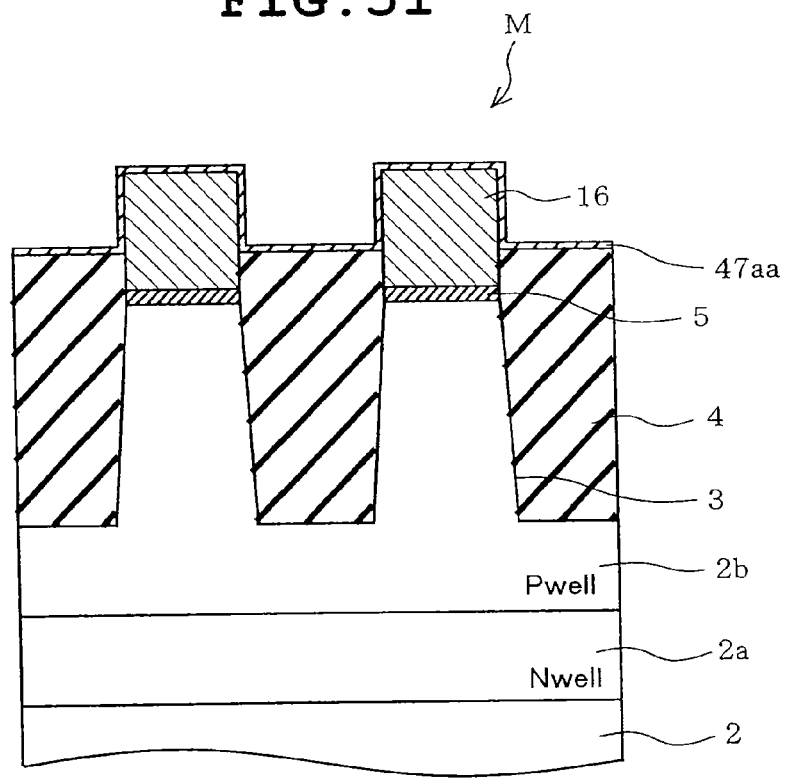
Figure 53:
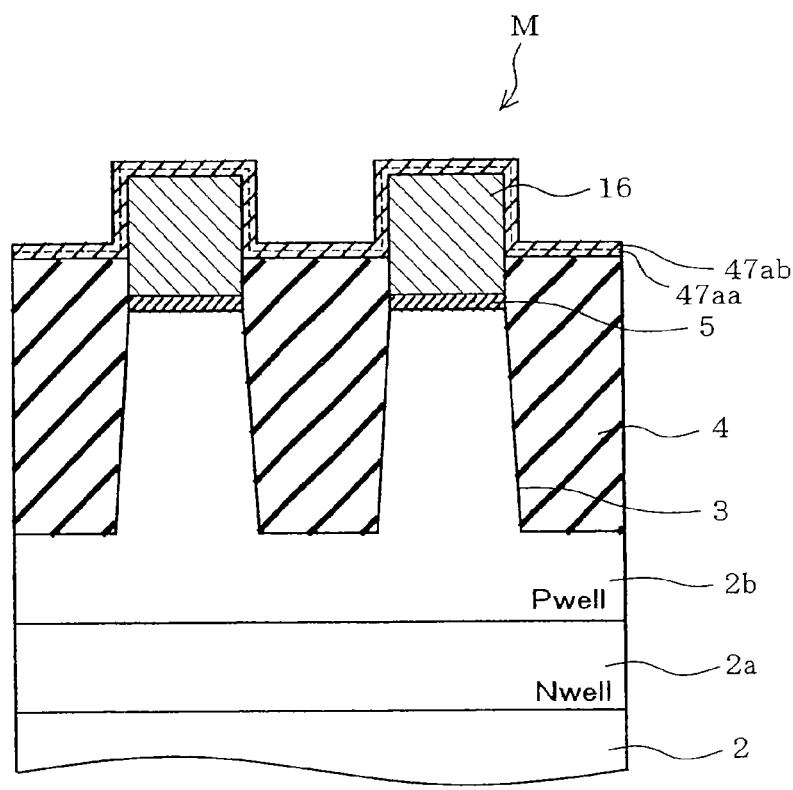
Figure 54:
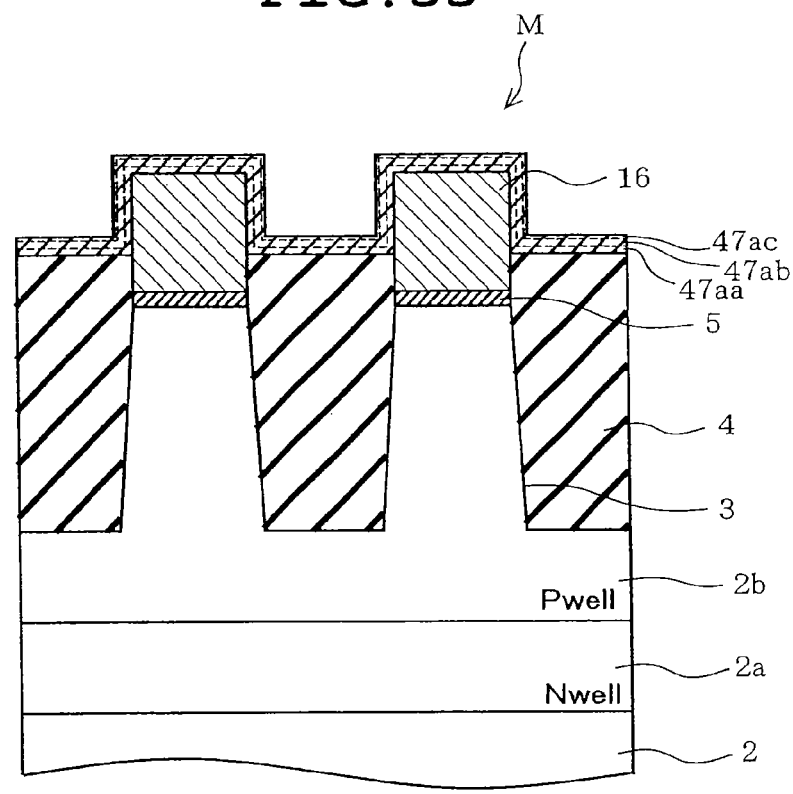

Subsequently, the silicon nitride film 47aa is formed at about 800° C. by the LPCVD method so as to have a predetermined film thickness ranging from 1 to 5 nm, as shown in FIG. 52. The silicon nitride film 47aa is formed along the upper surface of the element isolation insulating film 4 and the upper side surface and upper surface of the polycrystalline silicon layer 16. Alternatively, the silicon nitride film 47aa may be formed by plasma nitridation (radical nitridation). Next, the high dielectric insulating film 47ab is formed by an atomic layer deposition (ALD) method so as to have a film thickness equal to or smaller than the aforesaid predetermined film thickness (3 nm, for example), as shown in FIG. 53. Next, as shown in FIG. 54, dichlorosilane and nitrogen monoxide ($N_2O$) are caused to react with each other at about 800° C. by the LPCVD method so that the silicon oxide film 47ac is deposited on the dielectric insulating film 47ab so as to have a film thickness ranging from 1 to 10 nm, for example.

Figure 55:
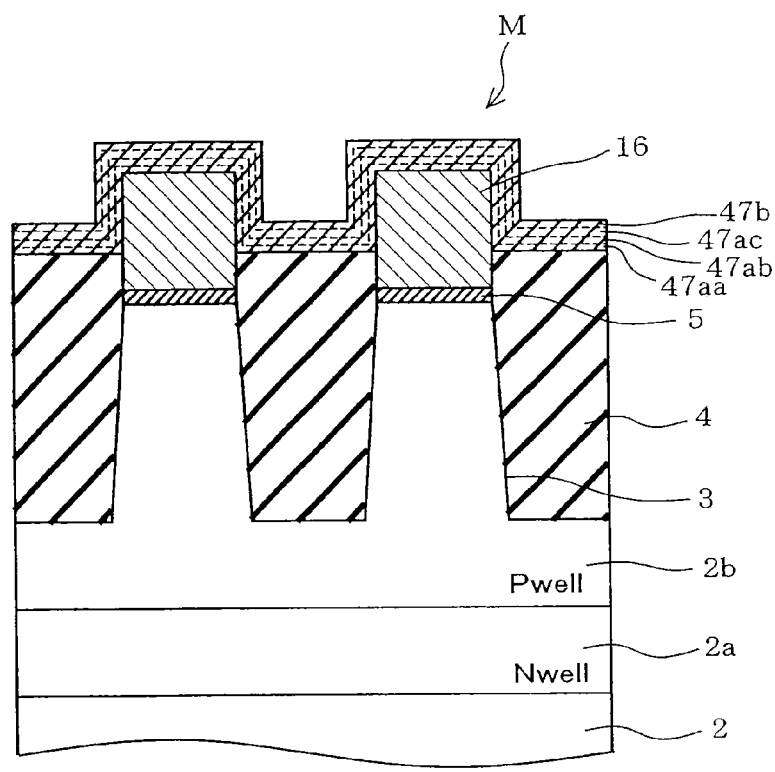
Figure 56:
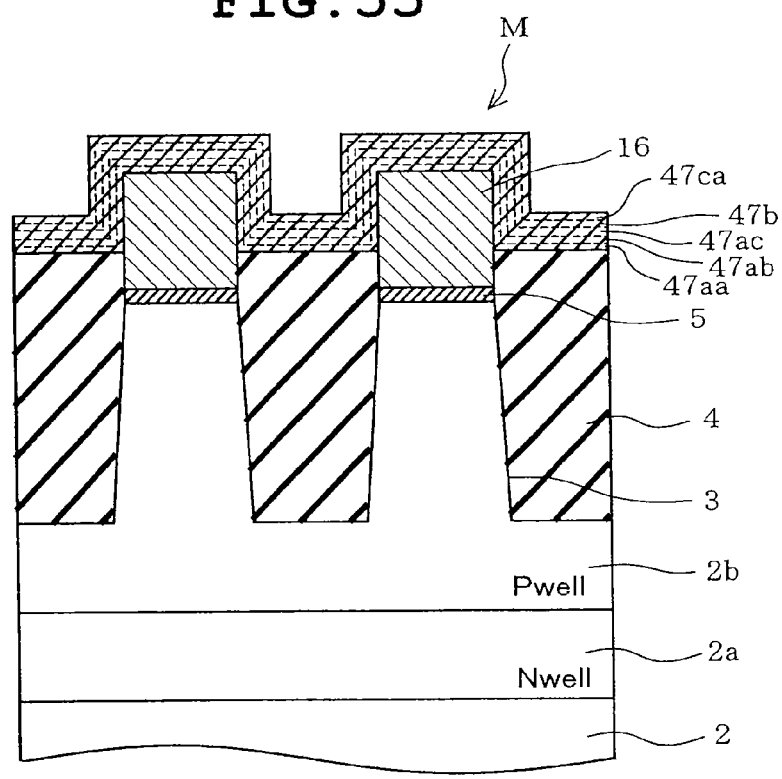

Subsequently, the high dielectric insulating film 47b is formed on the silicon oxide film 47ac by the ALD method so as to have a film thickness ranging from 1 to 20 nm, as shown in FIG. 55. The high dielectric insulating film 47b may be formed by the CVD method or by sputtering, instead of the ALD method. The aluminum oxide film 47b has a relative dielectric constant higher than about 7 that is a relative dielectric constant of a silicon nitride film. Subsequently, as shown in FIG. 56, dichlorosilane and nitrogen monoxide ($N_2O$) are caused to react with each other at about 800° C. by the LPCVD method so that the silicon oxide film 47ca is deposited on the high dielectric insulating film 47b by the CVD method so as to have a film thickness ranging from 1 to 10 nm, for example.

Subsequently, the silicon nitride film 47cb is deposited at about 800° C. by the LPCVD method so as to have a film thickness ranging from 1 to 5 nm, and the conductive layer 18 is formed on the silicon nitride film 47cb, as shown in FIGS. 39A and 39B. The silicon nitride film 47cb may be formed by the plasma nitridation (radical nitridation). Next, a mask pattern (not shown) is formed on the conductive layer 18, and the conductive layer 18, intergate insulating film 47 and polycrystalline silicon layer 16 are etched along the direction parallel to the figure of FIG. 39A by the anisotropic etching process such as the RIE method and are then divided in the direction perpendicular to the figure of FIG. 39A. As a result, the dividing regions GV are provided so as to divide the gate electrode MG.

Subsequently, impurities are ion-implanted so that the source/drain regions 2c are formed in the surface layer of the silicon substrate 2 by way of the dividing regions GV as shown in FIG. 39C. Thereafter, interlayer insulating films are deposited in the dividing regions GV so that various wiring contacts are formed in the interlayer insulating films. Upper layer wiring is formed in wiring fabricating steps. However, detailed description of these steps will be eliminated since the steps have no direct relation with the features of the embodiment. The conductive layer 18 comprises a silicon layer and a silicide of a metal formed on an upper part of the silicon layer. In this case, the silicon layer is deposited before the forming of the dividing regions GV. However, the aforesaid siliciding step may be carried out before or after dividing the gate electrodes MG by dividing regions GV according to a metal material to be applied.

According to the foregoing embodiment, the intergate insulating film 47 is provided between the floating gate electrode FG and the control electrode CG and comprises the silicon nitride film 47aa, high dielectric insulating film 47ab, silicon oxide film 47ac, high dielectric insulating film 47b, silicon oxide film 47ca and silicon nitride film 47cb all of which are formed sequentially into the multilayer structure. Consequently, the leak current can be suppressed.

The high dielectric insulating film 47ab is formed from an oxide film of aluminum (Al) that is a nontransition metal. Accordingly, electric charge trapped by the high dielectric insulating film 47b can be prevented from re-discharge, whereupon threshold variations can be suppressed. Furthermore, since the high dielectric insulating film 47ab is formed between the silicon nitride film 47aa and the silicon oxide film 47ac, leak current particularly during the data writing can be suppressed.

Figure 57:
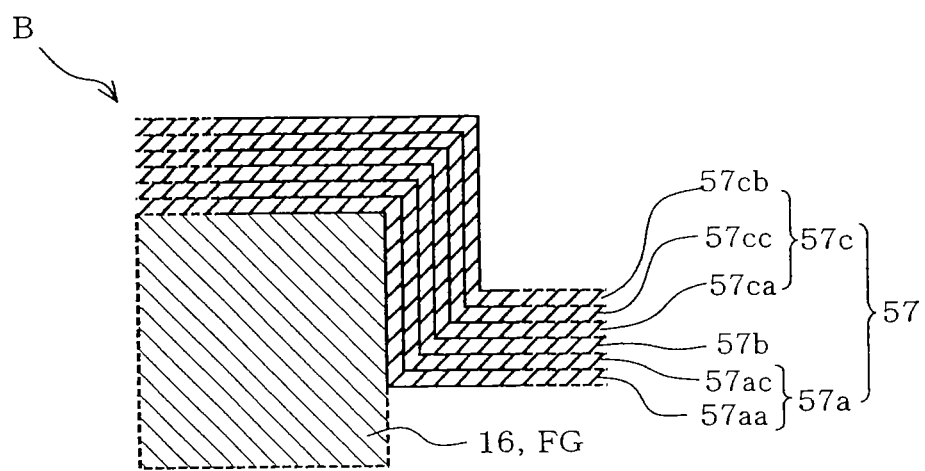
FIG. 57 is a view similar to FIG. 39B, showing a seventh embodiment in accordance with the invention.

FIG. 57 illustrates a seventh embodiment of the invention. The seventh embodiment differs from the sixth embodiment in a multilayer structure of the intergate insulating film. As described in the foregoing embodiment, the peripheral circuit applies a low voltage (0 to 2.5 V, for example) to the word line to be erased in the data erasing of each memory cell and a high voltage to the p-well 2b. As a result, electrons go from the floating gate electrode FG to the p-well 2b such that data is erased. In this case, there is a possibility that the threshold voltage of the memory cell transistor Trm in the data erasing may be saturated. In view of the problem, the embodiment employs a layer structure of the intergate insulating film 57 as shown in FIG. 57, which schematically shows a section employed instead of one shown in FIG. 39B. The intergate insulating film 57 used instead of the intergate insulating film 47 comprises a lower layer insulating film 57a, high dielectric insulating film 57b, upper layer insulating film 57c, instead of the lower layer insulating film 47a, high dielectric insulating film 47b, upper layer insulating film 47c respectively.

More specifically, the intergate insulating film 57 comprises a silicon nitride film 57aa, silicon oxide film 57ac, high dielectric insulating film 57b, silicon oxide film 57ca, high dielectric insulating film 57cc and silicon nitride film 57cb all of which are formed sequentially into a multilayer structure. The lower layer insulating film 57a comprises a silicon nitride film 57aa, silicon oxide film 57ac and silicon oxide film 57ac all of which are formed sequentially into a multilayer structure, but no high dielectric insulating film 57ab is provided.

The upper layer insulating film 57c comprises a silicon oxide film 57ca, high dielectric insulating film 57cc, silicon nitride film 57cb all of which are formed sequentially into a multilayer structure. The high dielectric insulating film 57cc is formed between the silicon nitride film 57cc and the silicon oxide film 57ca both composing the upper layer insulating film 57c. The high dielectric insulating film 57cc is formed from an oxide film of a nontransition element such as aluminum oxide ($Al_2O_3$) into the same configuration as the high dielectric insulating film 47ab used in the foregoing embodiment. The nonvolatile semiconductor memory device of the seventh embodiment has the same configuration as the previous embodiment in the other respects.

In fabricating the above-described intergate insulating film 57, the silicon nitride film 57aa, silicon oxide film 57ac and high dielectric insulating film 57b are formed in the same manners and have the same film thicknesses as the silicon nitride film 47aa, silicon oxide film 47ac and high dielectric insulating film 47b in the sixth embodiment respectively. Also, the silicon oxide film 57ca, high dielectric insulating film 57cc and silicon nitride film 57cb are formed in the same manners and have the same film thicknesses as the silicon oxide film 47ca, high dielectric insulating film 47ab and silicon nitride film 57cb in the sixth embodiment respectively. The high dielectric insulating film 57cc is preferably formed by the ALD method so as to have the predetermined film thickness (3 nm or below, for example).

In the foregoing embodiment, the intergate insulating film 57 is provided between the floating gate electrode FG and the control electrode CG and comprises the silicon nitride film 57aa, silicon oxide film 57ac, high dielectric insulating film 57b, silicon oxide film 57ca, high dielectric insulating film 57cc and silicon nitride film 57cb all of which are formed sequentially into the multilayer structure. Consequently, the leak current flowing through intergate insulating film 57 can be suppressed.

In particular, the high dielectric insulating film 57cc is formed between the silicon nitride film 57cb and the silicon oxide film 57ca. Accordingly, leak current flowing through the intergate insulating film 57 during data erasing can be suppressed. Furthermore, since the high dielectric insulating film 57cc is formed from an oxide film of aluminum (Al) that is a nontransition metal, electric charge trapped by the high dielectric insulating film 47b can be prevented from re-discharge, whereupon threshold variations can be suppressed.

In the foregoing sixth or seventh embodiment, the invention is applied to the nonvolatile semiconductor memory device provided with the multilayer structure of the floating gate electrode FG, intergate insulating film 47 or 57 and control electrode CG. However, the invention may be applied to other NOR nonvolatile semiconductor memory devices. Furthermore, the invention may be applied to a nonvolatile semiconductor memory device provided with a charge trap cell structure (MONOS or SONOS) in which a silicon nitride film is applied as the charge trap layer, instead of the floating gate electrode.

The aluminum oxide ($Al_2O_3$) film is used as the high dielectric insulating film 47b or 57b in the foregoing sixth or seventh embodiment. However, an insulating film having a higher relative permittivity than a silicon nitride film is preferably used. For example, the high dielectric insulating film 47b or 57b may comprise any one of oxides or nitrides including strontium (Sr), aluminum (Al), magnesium (Mg), scandium (Sc), gadolinium (Gd), yttrium (Y), samarium (Sm), hafnium (Hf), zirconium (Zr), tantalum (Ta), lanthanum (La), barium (Ba) and bismuth (Bi). Or, a composite film made by depositing some of the above-mentioned films. For example, the high dielectric insulating film may comprise a silicon nitride ($Si_3N_4$) film having a relative permittivity of about 7, a magnesium oxide (MgO) film having a relative permittivity of about 10, a yttrium oxide ($Y_2O_3$) film having a relative permittivity of about 16, a hafnium oxide ($HfO_2$) film having a relative permittivity of about 22, a zirconium oxide ($ZrO_2$) film and a lanthanum ($La_2O_3$) film. Furthermore, the high dielectric insulating film 7b may be an oxide or nitride film including at least any one of silicon (Si), aluminum (Al), magnesium (Mg), yttrium (Y), hafnium (Hf), zirconium (Zr) and lanthanum (La).

Each of the high dielectric insulating films 47b and 57b may comprise a film having a charge trap comprising a ternary compound including a hafnium oxide ($HfO_2$) film, a zirconium oxide ($ZrO_2$), a hafnium silicate (HfSiO) film, a hafnium aluminate (HfAlO) film, a zirconium aluminate (ZrAlO) film and a zirconium silicate (ZrSiO) film. A metal oxide film comprising a transition metal having a large electron trap amount and accordingly has a high electric field relaxing effect. Consequently, since the tunnel distance is increased by the electric field relaxing effect, a high electric field leak current can be reduced.

Furthermore, an insulating film having a higher relative permittivity than a silicon nitride film is preferably applied to the high dielectric insulating film 47ab or 57ab. For example, the high dielectric insulating film 47ab or 57ab may comprise a single layer film of a nontransition metal oxide including magnesium (Mg), strontium (Sr), barium (Ba) and bismuth (Bi). When such a single layer film of the nontransition metal oxide is applied to the high dielectric insulating film 47ab or 57ab, a trap amount can be rendered smaller as compared with the high dielectric insulating film 47b or 57b. Consequently, electric charge trapped by the high dielectric insulating film 47b or 57b can be prevented from re-discharge to the control electrode CG or floating gate electrode FG, and accordingly, threshold variations can be suppressed.

The multilayer structure of the intergate insulating film 47 or 57 may be modified or expanded as follows. For example, a silicon oxide film may be used instead of the silicon nitride film 47aa in the sixth embodiment. In this case, the silicon oxide film may be formed without provision of the silicon nitride film 47cb in the upper layer insulating film 47c. More specifically, the intergate insulating film 47 may comprise a multilayer structure of a silicon oxide film located at the lower layer side, the high dielectric insulating film 47ab, the silicon oxide film 47ac, the high dielectric insulating film 47b and the silicon oxide film 47ca located at the upper layer side. Furthermore, the intergate insulating film 47 may comprise a multilayer structure of the high dielectric insulating film 47ab, the silicon oxide film 47ac and the high dielectric insulating film 47b or a multilayer structure of the high dielectric insulating film 47b, the silicon oxide film 47aca and the high dielectric insulating film 47ab.

The high dielectric insulating film 47ab or 57cc is provided in the lower layer insulating film 47a or the upper layer insulating film 57c in the sixth or seventh embodiment. However, the high dielectric insulating film 47ab may be provided in both upper and lower layers of the high dielectric insulating film 47b by combining the structure of the lower layer insulating film 47a with the structure of the upper layer. Also, the high dielectric insulating film 57cc may be provided in both upper and lower layers of the high dielectric insulating film 57b by combining the structure of the upper layer insulating film 57c with the structure of the lower layer. More specifically, the intergate insulating film 47 may comprise a multilayer structure including the silicon nitride film 47aa, high dielectric insulating film 47ab, silicon oxide film 47ac, high dielectric insulating film 47b, silicon oxide film 47ca, high dielectric insulating film 57cc and silicon nitride film 47cb. Furthermore, a silicon oxide film may be provided between the silicon nitride film 47aa and the floating gate electrode FG, if necessary. In this case, both writing and erasing characteristics can be improved.

Furthermore, the intergate insulating film 47 may comprise a multilayer structure including a silicon oxide film located at the lower layer side, the silicon nitride film 47aa, high dielectric insulating film 47ab, silicon oxide film 47ac, high dielectric insulating film 47b, silicon oxide film 47ca and silicon nitride film 47cb located at the upper layer side. Also, the intergate insulating film 57 may comprise a multilayer structure including a silicon oxide film located at the lower layer side, the silicon nitride film 57aa, silicon oxide film 57ac, high dielectric insulating film 57b, silicon oxide film 57ca, high dielectric insulating film 57cc and silicon nitride film 57cb located at the upper layer side. In other words, the silicon oxide film with a film thickness of about 1 nm may be provided at the lower layer side of the silicon nitride film 47aa or 57aa.

In the aforesaid case, the silicon nitride film 47aa or 57aa formed directly on the floating gate electrode FG is effective particularly when variations in the threshold or increase in the interface state is in admissible. More specifically, an increase in the fixed charge can be suppressed by the provision of the silicon oxide film at the lower layer side of the silicon nitride film 47aa or 57aa.

Figure 58A:
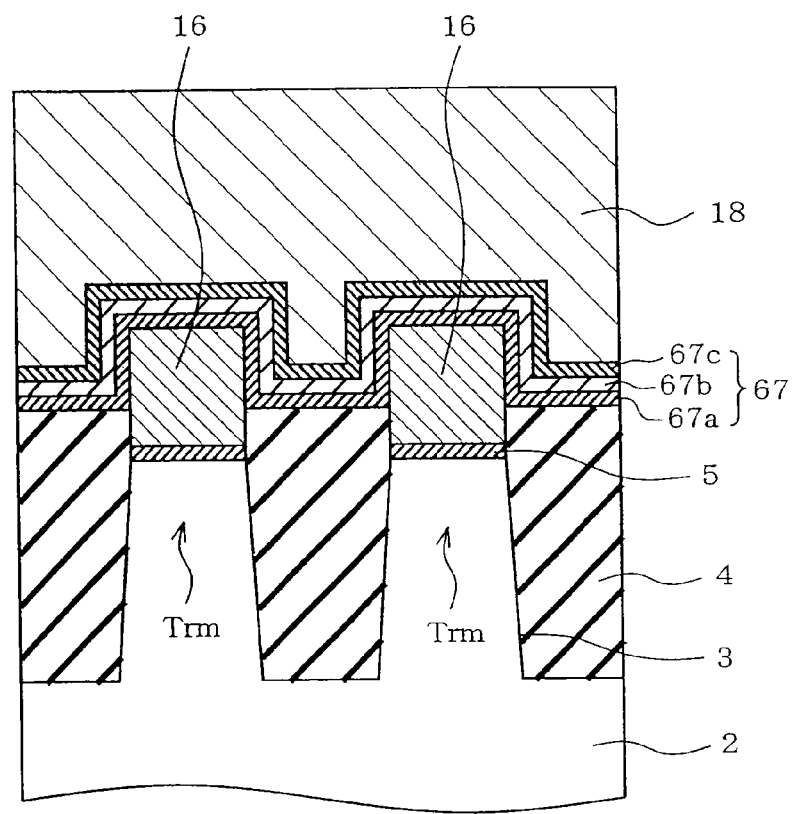
FIG. 58A is a view similar to FIG. 3, showing an eighth embodiment.
Figure 58B:
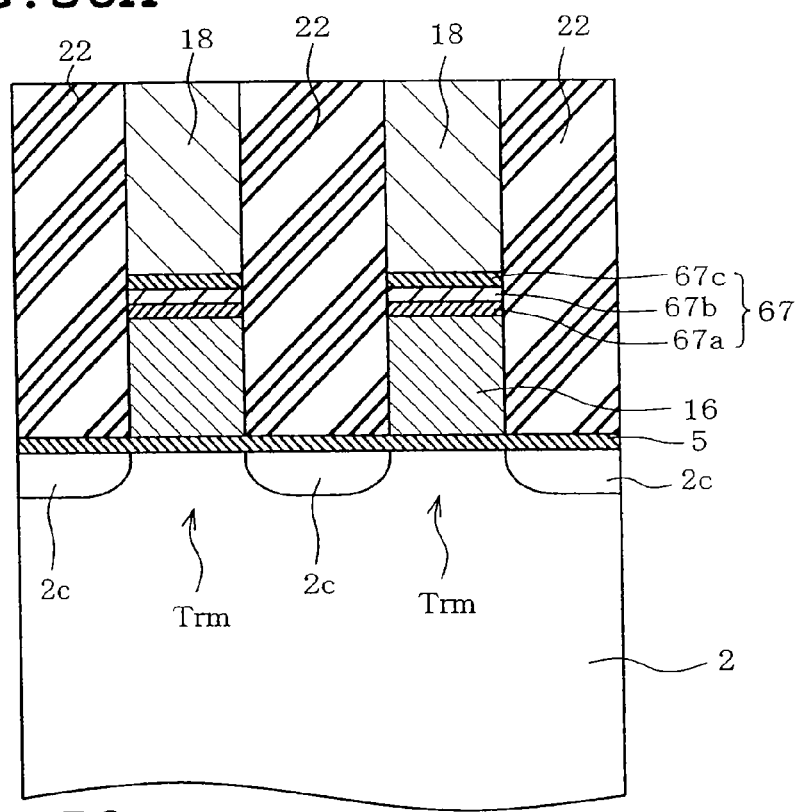
FIG. 58B is a view similar to FIG. 4.

FIGS. 58A to 65 illustrate an eighth embodiment of the invention. FIG. 58A schematically shows a section taken in the word line direction (channel width direction). FIG. 58B schematically shows a section taken in the bit line direction (channel width direction). As shown in FIGS. 58A and 58B, the memory cell transistor Trm includes source/drain regions 2c formed in the silicon substrate 2, the gate insulating film 5 formed on the channel region between the source/drain regions 2c and serving as a first insulation layer, the floating gate electrodes FG formed on the gate insulating film 5 from the conductive layers 16, a second insulation layer comprising a multilayer film of lower and high relative permittivity insulating film formed on the conductive layer 16, an intergate insulating film 67 serving as an interelectrode insulating film and a double layer gate structure with a conductive layer 18 formed on the intergate insulating film 67 as a control electrode CG. In the embodiment, the intergate insulating film 67 comprises a multilayer film as the intergate insulating film 67. The multilayer film includes the silicon oxide film 67a added with nitrogen, the high permittivity insulating film 67b serving as the intermediate insulating film and the silicon oxide film 67c.

Figure 59:
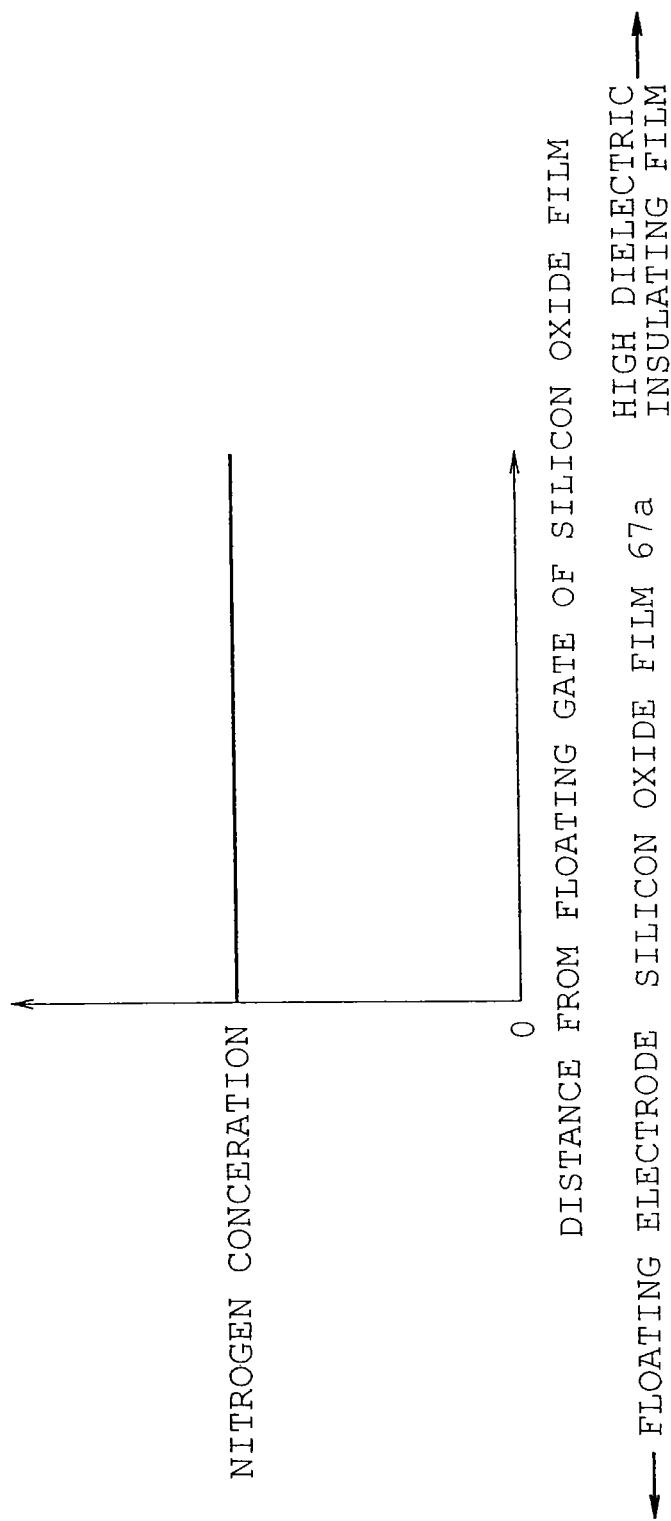
FIG. 59 is a graph showing a depth-direction distribution of nitride concentration of the silicon oxide film.

In the embodiment, a method of fabricating an element will be described in the case where the writing characteristic of the element is improved. Nitrogen is added into the silicon oxide film 67a constituting a lower layer of the intergate insulating film 67 for the purpose of improving the writing characteristic. In this case, nitrogen is added so that the content thereof becomes substantially uniform in the silicon oxide film 67a as shown in FIG. 59. When nitrogen is added into the silicon oxide film 67a, the characteristic is improved in the case where high electric field is applied during the data writing.

When the silicon oxide film 67a is added with no nitrogen, electrons injected through the gate insulating film 5 into the conductive layer 16, a rate at which electrons gets out of the intergate insulating film 67 is increased. The threshold voltage is saturated when the leak current of the gate insulating film 5 equilibrates with the leak current of the intergate insulating film 67. On the other hand, when the silicon oxide film 67a is added with nitrogen, the relative permittivity of the silicon oxide film 67a is increased such that high electric field is suppressed during the data writing. Furthermore, the physical film thickness can be increased by increasing the relative permittivity of the intergate insulating film 67 without any increase in the electric film thickness. Accordingly, physical properties of the film thickness can be increased by increasing the relative permittivity of the intergate insulating film 67 without increase in electrical properties of the film thickness. As a result, the tunnel probability can be reduced concerning the electrons flowing from the floating gate electrode FG to the conductive layer 18 serving as the control gate electrode CG, which can increase the threshold voltage at which data is written. Furthermore, the breakdown voltage can be improved since nitrogen is introduced into the silicon oxide film 67a.

For example, when the high permittivity insulating film 67b contains carbon, carbon is diffused into the element isolation insulating films 4 in a thermal process or oxidation process subsequent to the forming of the high permittivity insulating film 67b. The threshold voltage of the memory cell transistor Trm then varies. Since the lower layer silicon oxide film 67a contains carbon, diffusion of impurities can be suppressed. The case where nitrogen is substantially uniform in the silicon oxide film 67a is described in the embodiment. However, since nitrogen is introduced over the whole silicon oxide film, high electric field leak current can effectively suppressed by the aforesaid method. Accordingly, the method of the embodiment is particularly effective when specifications for data writing are strict, that is, when the writing process is desired to be carried out until a high threshold voltage is reached.

Figure 61:
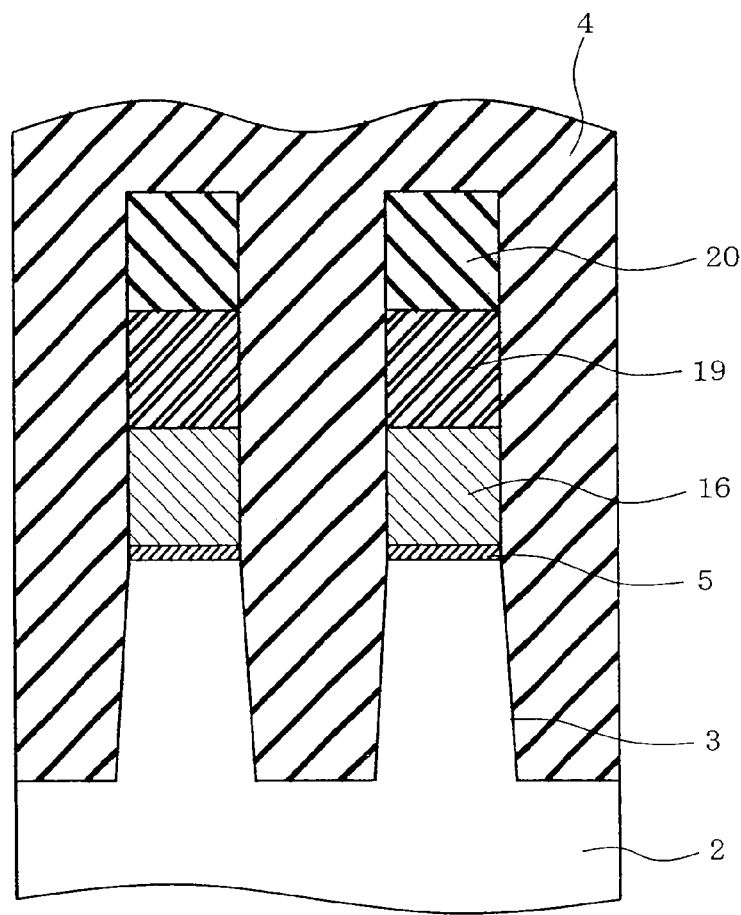
FIGS. 61 to 65 are sectional views of the structure of FIG. 58A in sequential fabrication steps (Nos. 1 to 5)

A method of fabricating the nonvolatile semiconductor memory device will now be described with reference to FIGS. 61 to 65. As shown in FIG. 61, the gate insulating film 5 is formed on the p-silicon substrate 2 or an n-silicon substrate on which p-wells are formed. The gate insulating film 5 is formed so as to have a predetermined film thickness ranging from 1 nm to 15 nm. Subsequently, the conductive layer 16 (polycrystalline silicon layer or floating gate electrode FG) is formed on the gate insulating film 5 by the CVD method so as to have a film thickness ranging from 10 nm to 200 nm. The conductive layer 16 serves as an electric charge storage layer.

Subsequently, the silicon nitride film 19 is formed by the CVD method so as to have a film thickness ranging from 50 nm to 200 nm. The silicon oxide film 20 is further formed by the CVD method so as to have a film thickness ranging from 50 nm to 400 nm. After the silicon oxide film 20 has been formed so as to have the film thickness of about 50 to about 400 nm, photoresist (not shown) is coated onto the silicon oxide film 20 and then patterned by the photolithography technique. After the photoresist has been patterned, the silicon oxide film 29 is anisotropically etched with the photoresist serving as a etch-resistant mask. The photoresist is removed after the etching process, and the silicon nitride film 19 is etched with the silicon oxide film 20 serving as a mask. The conductive layer 16, gate insulating film 5 and silicon substrate 2 are also etched so that the element isolation trenches 3 are formed.

Figure 62:
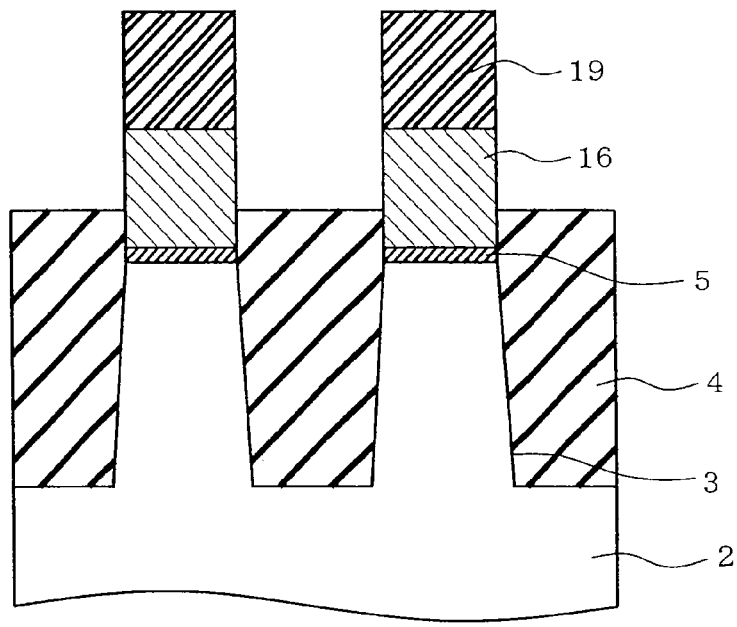

Subsequently, the element isolation insulating film 4 is formed by a coating technique so as to have a film thickness ranging from 200 nm to 1500 nm and buried in the element isolation trenches 3, whereupon the section as shown in FIG. 61 is obtained. Next, the obtained structure is processed in an atmosphere of oxygen or steam, thereby being high-densified. Subsequently, a planarizing process is carried out by the CMP method with the silicon nitride film 19 serving as a stopper. Next, only the element isolation insulating film 4 is etched back under an etching condition having higher selectivity for the silicon nitride film, whereupon the structure as shown as the section in FIG. 62 is obtained.

Figure 63:
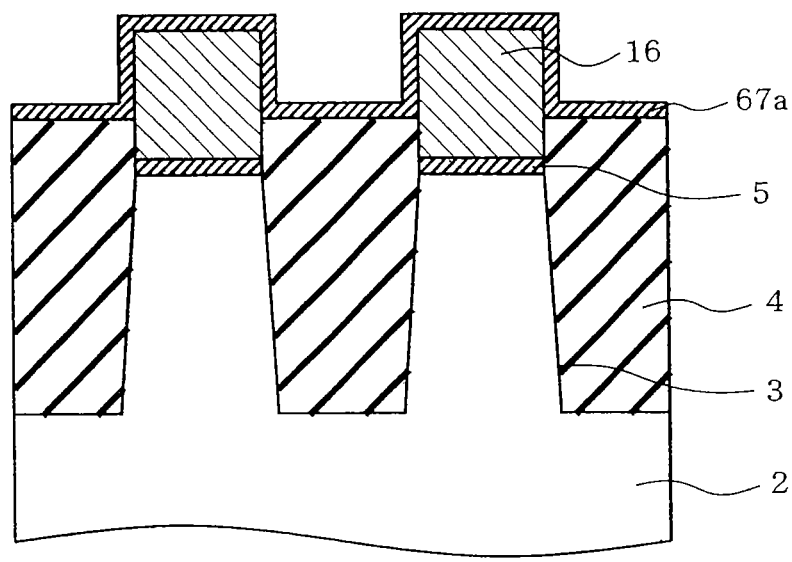

Subsequently, the sectional structure as shown in FIG. 63 is obtained by the ALD method. In this case, silicon is made from aminosilane, and oxygen is obtained from steam or ozone. Nitrogen is obtained from ammonia. Si, O and N each of which has an amount of not less than one atomic layer are deposited alternately at a temperature ranging from 300° C. to 700° C. by the ALD method, whereby the silicon oxide film 67a added with nitrogen is formed. As a result, the sectional structure as shown in FIG. 63 is obtained. The silicon oxide film 67a added with nitrogen has a predetermined film thickness ranging from 1 to 5 nm.

In the foregoing embodiment, an amount of nitrogen contained in the silicon oxide film 67a can be controlled precisely by adjustment of conditions of the material for nitrogen. An amount of nitrogen added to the silicon oxide film 67a depends upon a multilayer structure of film, a film thickness and electric field during operation of an element. When the band structure is considered in view of the aforesaid conditions, a film thickness of the insulating film needs to be smaller than a film thickness which is a condition for a conductive band of the insulating film to intersect the location of a conductive band of silicon during application of operating electric field to the element. Addition of nitrogen increases the relative permittivity of the film such that electron tunneling distance is increased during data writing. However, when an amount of nitrogen is excessively large, the barrier height is reduced such that the electron tunneling distance is reduced.

Figure 60:
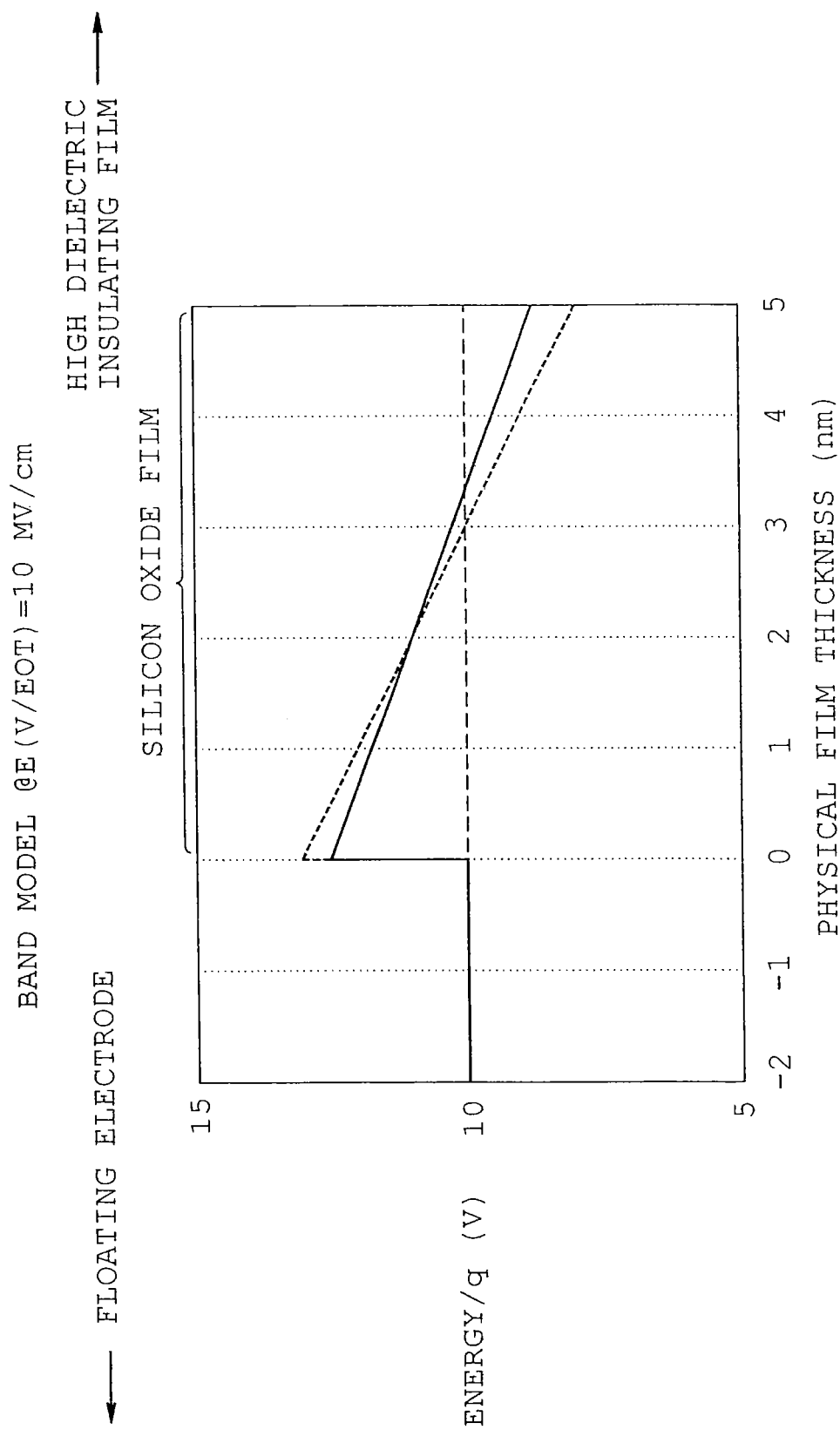
FIG. 60 schematically shows a band model of the silicon oxide film in the intergate insulating film.

For example, FIG. 60 shows the case where the silicon oxide film has a relative permittivity of 3.9, the electric field applied to the intergate insulating film 67 is 10 MV/cm and the barrier height of the silicon oxide film ($SiO_2$) relative to the conductive band is 3 eV. When an amount of nitrogen added to the silicon nitride film ($Si_3N_4$) under these conditions is represented as a composition ratio of the silicon nitride film ($Si_3N_4$) to the silicon oxide film ($SiO_2$), the effect of reducing leak current can be obtained in a range below 90% (corresponding to the relative permittivity of about 6.7). A most effective composition is obtained when the aforesaid composition ratio is about 45% (corresponding to the relative permittivity of about 5.1). Furthermore, when the film structure at the injection side includes a silicon oxide film with a film thickness of 1 nm, a silicon nitride film with a film thickness of 1 nm (in the case of relative permittivity of 7) and a silicon oxide film with a film thickness of 5 nm, the effect of reducing leak current can be obtained in a range below 20% (corresponding to the relative permittivity of about 5.1). An optimum amount of nitrogen to be added is determined from the usage of the element, the above-described charge retention characteristic and the like.

Furthermore, a charge trapping amount of the nitrogen-containing silicon oxide film can be increased by increasing a concentration of nitrogen in the silicon oxide film 67a. The charge trapping amount of the nitrogen-containing silicon oxide film can also be increased when a composition ratio of silicon to nitrogen is increased. The leak current can be reduced during application of high electric field by either one of the above-described manners or by the combination of both manners. The reason for the reduction in the leak current is that charge trapping would result from nitrogen contained in the silicon oxide film resulting in bonding mismatch in the silicon oxide film or oxygen defect or silicon dangling bond formed in the film or the like. Leak current between the adjacent cells is increased when an amount of trapped charge is excessively large. Accordingly, it is preferable that the charge trapping should be set to a suitable amount. A suitable amount of trapped charge differs depending upon the usage of the element including the distance between adjacent cells, cell structure and electric charge applied between the adjacent cells.

Figure 64:
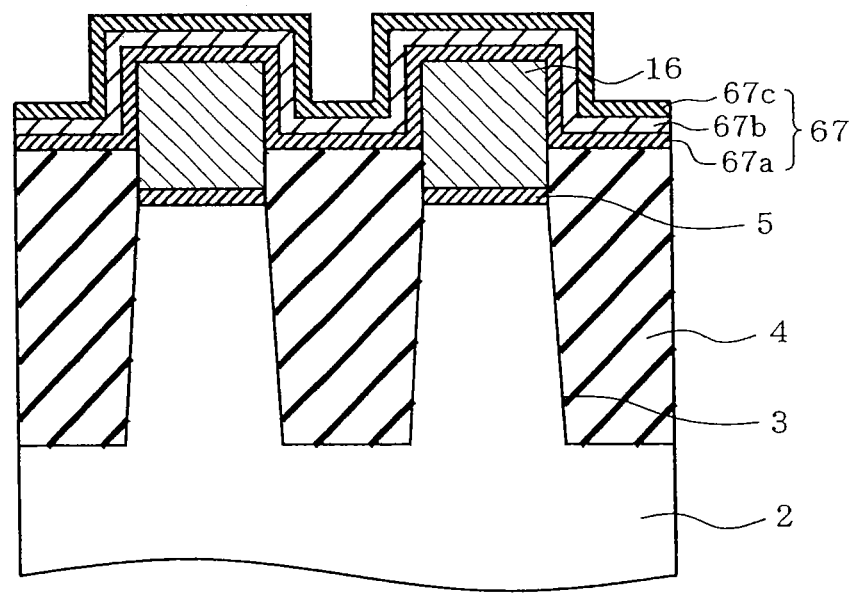
Figure 65:
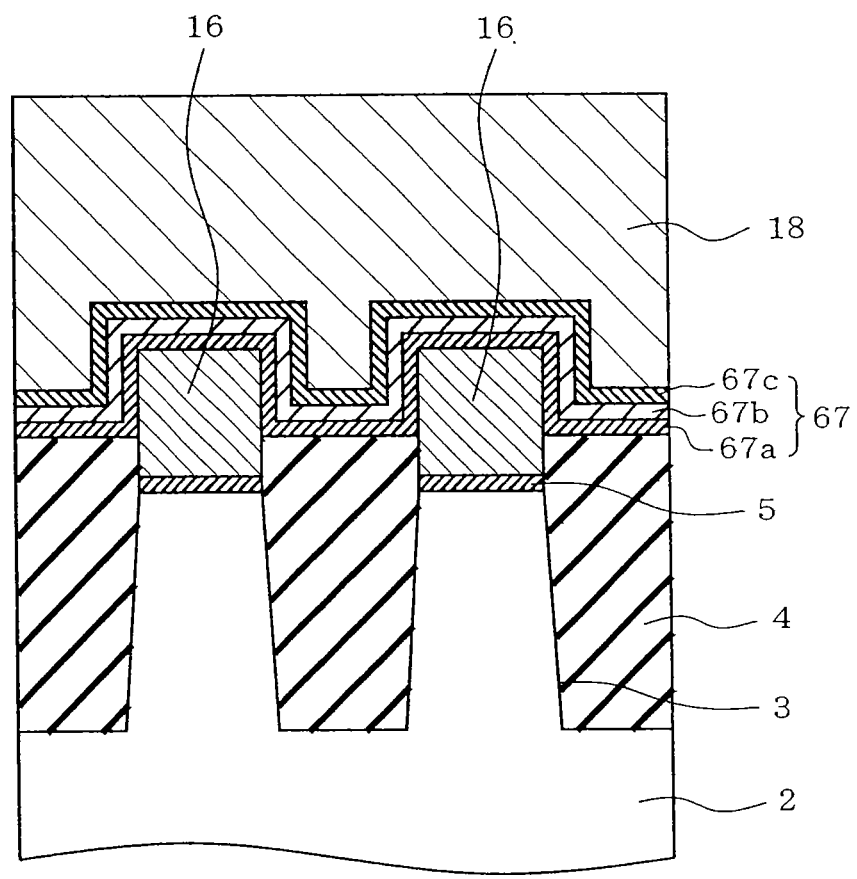

Subsequently, as shown in FIG. 64, the high dielectric insulating film 67b is formed on the nitrogen-added silicon oxide film 67a so as to have a film thickness ranging from about 1 to about 20 nm. The high dielectric insulating film 67b is a metal oxide having a high relative permittivity. The silicon oxide film 67c is then formed on the high dielectric insulating film 67b so as to have a film thickness ranging from about 1 to about 10 nm, whereby the intergate insulating film 67 is formed. Subsequently, the conductive layer 18 is formed on the intergate insulating film 67 as shown in FIG. 65. The conductive layer is formed into the control electrode CG. The control electrode CG is patterned by pattern exposure and thereafter, the memory cell structure of the flash memory (the nonvolatile semiconductor memory device) is obtained through a normal post process.

Modified forms of the eighth embodiment will now be described. The LPCVD method may be carried out for the fabrication of the silicon oxide film 67a, instead of the ALD method. In this case, dichlorosilane, nitrous oxide ($N_2O$) and ammonia ($NH_3$) serving as a nitrogen source may be caused to react sequentially at about 800° C. thereby to be formed into the nitrogen-added silicon oxide film 67a. Since the silicon oxide film 67a contains chloride in this case, leak current is reduced by electron trap during application of high electric field. Furthermore, the same effect can be achieved by a multilayer structure of an extremely thin layer of the silicon oxide film and the silicon nitride film by the CVD method. Additionally, the silicon oxide film 67a may be formed by thermally treating a coating silicon material containing nitrogen. An amount of nitrogen remaining in the film is determined by the conditions of thermal treatment in the method using the coating silicon material.

Furthermore, a nitridation treatment may be carried out after the forming of the silicon oxide film 67a. The nitridation treatment includes a thermal nitridation treatment, a radical nitridation treatment, an implantation treatment and the like. In this case, however, the film thickness of the silicon oxide film is limited by the conditions of the nitridation treatment. More specifically, a film thickness at which nitrogen can be added uniformly to the silicon oxide film is determined by the conditions of the nitridation process. Furthermore, the nitrogen-added silicon oxide film formed by each of the above-described methods is thermally treated so that nitrogen contained in the film is further uniformed. At the same time, the film quality and accordingly, the electrical characteristics can be improved. Additionally, when the thermal treatment is applied to the film to which the nitridation treatment has been applied is thermally treated, the film thickness at which nitrogen can uniformly be added to the silicon oxide film can further be estimated to be thicker.

Figure 66A:
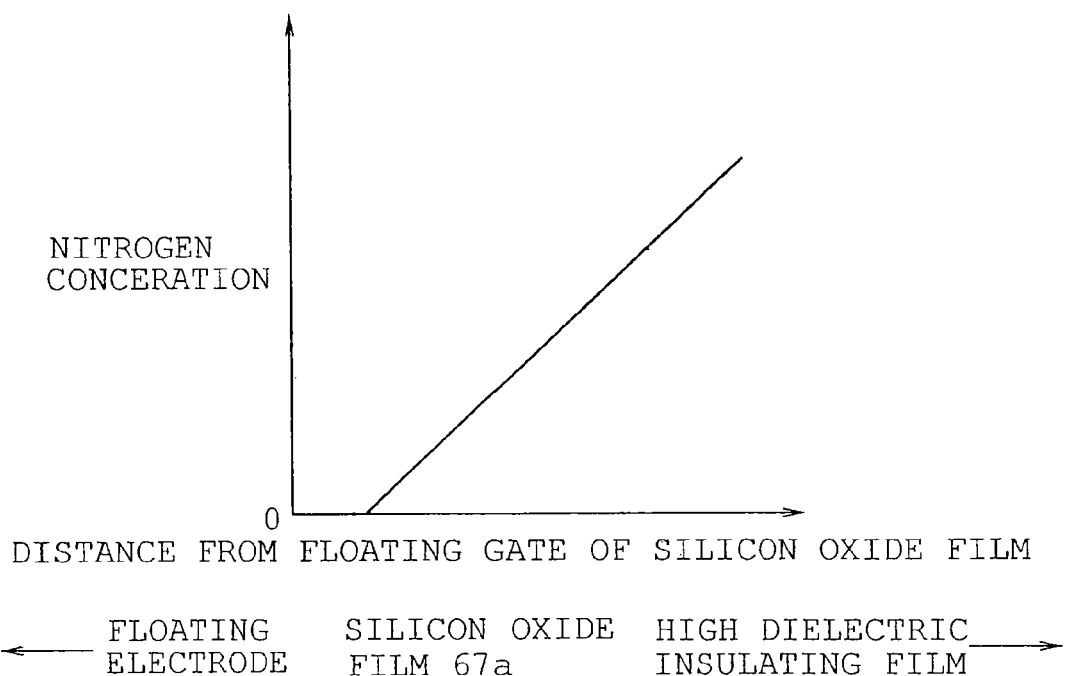
FIG. 66A is a view similar to FIG. 59, showing a ninth embodiment in accordance with the invention (No. 1)
Figure 66B:
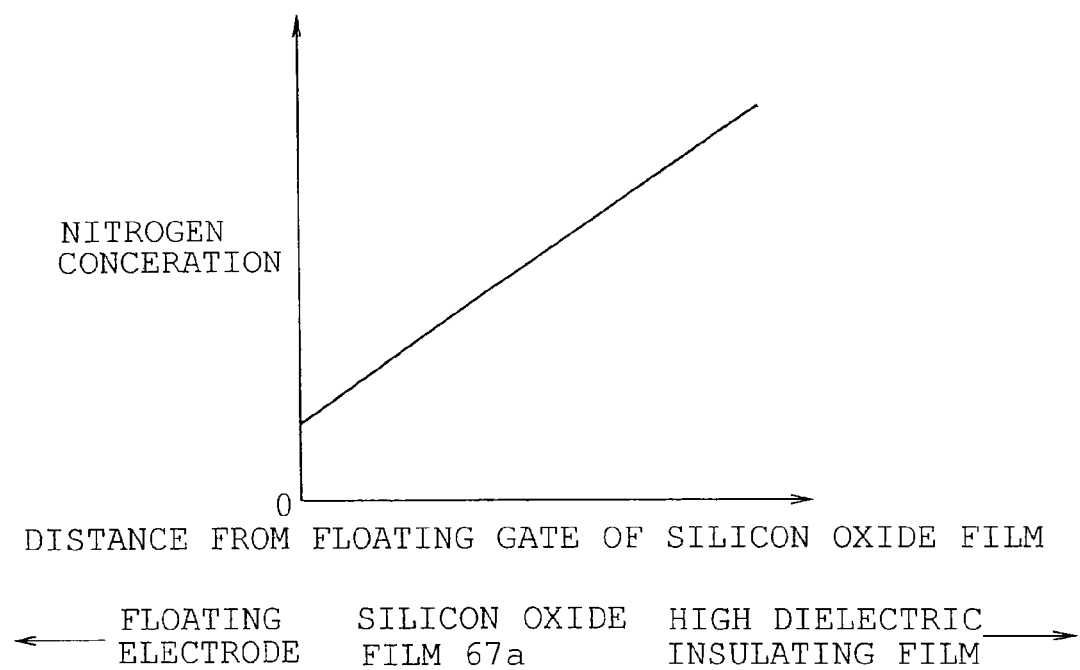
FIG. 66B is a view similar to FIG. 59 (No. 2)
Figure 67:
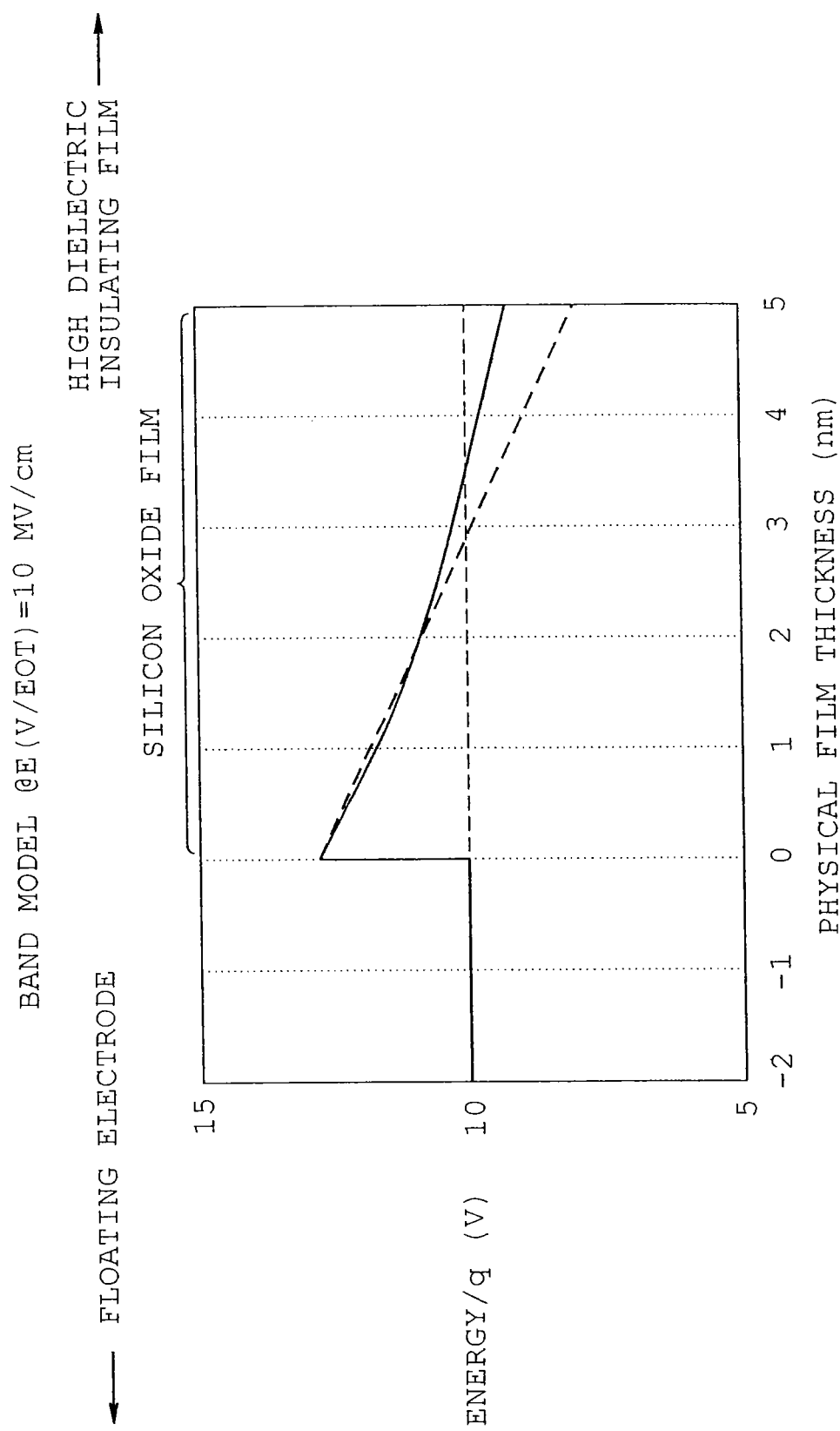
FIG. 67 is a view similar to FIG. 60.

FIGS. 66A to 67 illustrate a ninth embodiment of the invention. The ninth embodiment differs from the eighth embodiment in the concentration of nitrogen contained in the silicon oxide film 67a. In the ninth embodiment, nitrogen is added into the lower layer silicon oxide film 67a of the intergate insulating film 67 for improvement in the data write characteristic in the same manner as in the eighth embodiment. An amount of nitrogen to be added is gradually increased toward a boundary between the silicon oxide film 67a and the high dielectric insulating film 67b.

FIGS. 66A and 66B show distribution of a composition ratio of nitrogen in the depth direction. FIG. 66A shows the case where no nitrogen is added to the boundary at the floating gate electrode FG side and addition of nitrogen is started at a predetermined location in the film and an amount of nitrogen added is gradually increased toward the boundary location at the high dielectric insulating film 67b side. FIG. 66B shows the case where nitrogen is added to the boundary at the floating gate FG side and an amount of nitrogen added is gradually increased toward the boundary at the high dielectric insulating film 67b side.

In the case as shown in FIG. 66A, leak of low electric filed can be suppressed during the electric charge retention since the silicon oxide film 67a with a high barrier height remains at the floating gate electrode FG side. On the other hand, FIG. 66B corresponds to a case where nitrogen with higher concentration is added as compared with FIG. 66A and is suitable for the case where an effect of reducing leak current is obtained during application of high electric field. In order that high electric field leak current may be reduced during the data writing, an amount of nitrogen to be added is gradually increased from the floating gate electrode FG side toward the high dielectric insulating film 67b. However, in order that the high electric field leak current may be reduced during data erasing, an amount of nitrogen to be added to the silicon oxide film 67c is gradually reduced from the boundary between the silicon oxide film 67a and the high dielectric insulating film 67b toward the control electrode CG side.

When nitrogen is added to the silicon oxide film 67a, the relative permittivity of the silicon oxide film 67a is increased, whereupon high electric field in the silicon oxide film 67a is suppressed during data writing. Furthermore, when the relative permittivity is increased, a physical film thickness can be increased without increase in an electrical film thickness. As a result, the tunnel probability can be reduced concerning the electrons flowing from the floating gate electrode FG to the conductive layer 18 serving as the control gate electrode CG. Accordingly, the threshold voltage at which data is written can be prevented from being easily saturated even when the data writing time is increased.

Furthermore, other advantages can be achieved by the introduction of nitrogen. The breakdown voltage can be improved as the result of introduction of nitrogen into the silicon oxide film 67a. Furthermore, diffusion of impurities can be suppressed by the introduction of nitrogen. When the high dielectric insulating film 67b contains carbon, carbon is diffused in the element isolation insulating films in a thermal process subsequent to the forming of the high dielectric insulating film 67b or in an oxidation process, which results in variations in the threshold voltage of each memory cell transistor Trm. However, an amount of diffusion of the impurities can be suppressed since the lower layer side silicon oxide film 67a contains nitrogen. FIG. 67 shows a band model in the case where the concentration distribution of nitrogen contained in the silicon oxide film 67a is shown by FIG. 66A.

According to the ninth embodiment, introduction of high-concentration nitrogen is limited to the vicinity of the boundary of the high dielectric insulating film 67b. Accordingly, the contribution of the silicon oxide film 67a is increased regarding the barrier height at the floating gate electrode FG side. Consequently, the barrier height can effectively be increased and accordingly, the tunnel probability of charge retention can be reduced.

Furthermore, the silicon oxide film 67a is provided so that the nitrogen concentration is gradually increased from the floating gate electrode FG side toward the high dielectric insulating film 67b side. Accordingly, the relative permittivity is increased at the high dielectric insulating film 67b side, whereupon influence of the electric field can be reduced during application of high electric field, and leak of high electric field can effectively be suppressed. The method of the embodiment is effective when leak of high electric field is desired to be reduced.

The film thickness of the nitrogen-added silicon oxide film 67a is set to the range from 1 to 5 nm. An amount of nitrogen contained in the film and a distribution tendency of nitrogen in the depth direction can be adjusted by adjustment of the condition under which the nitrogen is introduced and the order in which the materials of silicon (S), oxygen (O) and nitrogen (N) are caused to flow. For example, assume now the case where the silicon oxide film has a relative permittivity of 3.9, the electric field applied to the intergate insulating film 67 is 10 MV/cm and the barrier height of the silicon oxide film ($SiO_2$) relative to the conductive band is 3 eV. A film thickness of the silicon oxide film is about 3 nm under the aforementioned conditions and further under the condition for a conductive band of the insulating film to intersect the location of a conductive band of silicon during application of operating electric field to the element. Accordingly, the addition of nitrogen is preferably started at a location that is not more than 3 nm away from the floating gate electrode FG, and an amount of nitrogen to be added is preferably increased gradually toward the high dielectric insulating film 67b side so that the silicon oxide film 67a is formed.

It is preferable that an amount of nitrogen to be added reaches 100% at the boundary between the silicon oxide film 67a and the high dielectric insulating film 67b. More specifically, the silicon nitride film is preferably applied to the boundary between the silicon oxide film 67a and the high dielectric insulating film 67b. Furthermore, under the aforesaid prerequisite, the location where to start addition of nitrogen falls into a range about 3.6 nm away from the conductive layer 16 serving as the floating gate electrode FG when a multilayer structure applied to the film structure at the injection side includes a silicon oxide film with a film thickness of 1 nm, a silicon nitride film with a film thickness of 1 nm (in the case of relative permittivity of 7) and a silicon oxide film with a film thickness of 5 nm.

An amount of nitrogen to be added can be controlled by a flow rate of ammonia. A nitrogen-added silicon oxide film may be formed by the CVD method by simultaneous distribution of a silicon material (dichlorosilane ($SiH_2Cl_2$)), an oxygen material (nitrous oxide ($N_2O$)) and a nitrogen material (ammonia) to be added. In another method, a silicon oxide film and an ultrathin silicon nitride film may be deposited alternately. This method can achieve the same effect as the aforesaid CVD method.

The silicon oxide film can be formed by gradually changing a ratio of the film thickness of the silicon oxide film to the film thickness of the silicon nitride film while an amount of nitrogen to be added is controlled. Since the silicon oxide film formed by the aforesaid method contains chloride, leak current during high electric field application is further reduced by electron trap, whereupon electrical characteristics can be improved.

Furthermore, the silicon oxide film 67a may be formed by further another method. In this method, a nitriding treatment is carried out after the forming of the silicon oxide film, so that nitrogen is added to the film. The nitriding treatment may include a thermal nitriding, plasma nitriding or the like. In this case, an amount of nitrogen in the silicon oxide film can be controlled depending upon nitriding conditions. In each of the above-described methods, the film quality can be improved by the thermal treatment applied after the forming of the silicon oxide film added with nitrogen, which can further improve the electrical characteristics.

The eighth and ninth embodiments describe the multilayer structure of the silicon oxide film 67a, high dielectric insulating film 67b and silicon oxide film 67c as the multilayer structure of the intergate insulating film 67. However, the effect achieved by each of the eighth and ninth embodiments can also be achieved by another multilayer structure. For example, a multilayer structure may include a lower-layer side silicon nitride film, silicon oxide film, high dielectric insulating film, silicon oxide film and silicon nitride film. Alternatively, another multilayer structure may include a lower-layer side silicon nitride film, silicon oxide film, silicon nitride film, silicon oxide film and silicon nitride film.

The high dielectric insulating film 67b in the intergate insulating film 67 will now be described. As the high dielectric insulating film 67b can be used a single layer film of a silicon nitride ($Si_3N_4$) film having a relative permittivity of about 7, an aluminum oxide ($Al_2O_3$) film having a relative permittivity of about 8, a magnesium oxide (MgO) film having a relative permittivity of about 10, a yttrium oxide ($Y_2O_3$) film having a relative permittivity of about 16, a hafnium oxide ($HfO_2$) film having a relative permittivity of about 22, a zirconium oxide ($ZrO_2$) film or a lanthanum oxide ($La_2O_3$) film. Furthermore, the high dielectric insulating film 67b may be an insulating film comprising a ternary compound, such as a hafnium silicate (HfSiO) film or a hafnium aluminate (HfAlO) film. Additionally, the high dielectric insulating film 67b may comprise an oxide or nitride film including at least any one of silicon (Si), aluminum (Al), magnesium (Mg), yttrium (Y), hafnium (Hf), zirconium (Zr) and lanthanum (La).

In the case where a lower layer of the nitrogen-added silicon oxide film is a silicon nitride film, the surface of the lower-layer silicon nitride film is re-nitrided when the nitrogen-added silicon oxide film is formed. Consequently, the silicon nitride film from which nitrogen has outgassed can be compensated for. For example, when a nitrogen material such as ammonia is previously introduced in starting the forming of a nitrogen-added silicon oxide film, the lower-layer silicon nitride film from which nitrogen has outgassed can be compensated for. Consequently, the film quality of the silicon nitride film can be improved, and the relative permittivity can also be improved, whereupon the electrical characteristics of the intergate insulating film 67 can be improved.

The embodiment may be applied to a flash memory (nonvolatile semiconductor memory device) which is generally known as a metal-oxide-nitride-oxide-silicon (MONOS) in which trap is provided in an insulating film. For example, the embodiment can be applied to a block insulating film formed in an upper layer of a charge storage layer, whereupon the effectiveness of the embodiment can be achieved.

When an element necessitates an improvement in an erasing characteristic, the characteristic configuration of the eighth embodiment may be applied to the control electrode CG side silicon oxide film 67c. Consequently, a desired improvement can be achieved in the erasing characteristic. Furthermore, when the characteristic configuration of the ninth embodiment is applied to the upper and lower silicon oxide films 67a and 67c, both writing and erasing characteristics can be improved.

Although the invention is applied to the flash memory provided with the floating gate electrode FG in the foregoing embodiment, the invention may be applied to a nonvolatile semiconductor memory device having another configuration and including an element having the similar multilayer structure. Consequently, the same effect can be achieved from the device as described above.

The invention should not be limited by the foregoing embodiments. The embodiments may be modified or expanded as follows. Although the invention is applied to the NAND flash memory in the foregoing embodiments, the invention may be applied to various nonvolatile semiconductor memory devices each comprising a memory cell array which includes a plurality of memory cell columns which are arranged in rows and each of which is composed of a plurality of memory cell transistors arranged in columns. The invention may also be applied to various devices of multivalued memory such as three-valued, four-valued or other valued memories.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A nonvolatile semiconductor memory device comprising:
    a semiconductor portion;
    a first oxygen-containing portion provided on the semiconductor substrate;
    a silicon-containing portion provided on the first oxygen-containing portion;
    a first film provided on the silicon-containing portion and including a lamination of a first portion containing silicon and oxygen and a second portion containing silicon and nitrogen;
    a first high dielectric insulating portion provided on the first film and having an oxide-containing yttrium, hafnium or aluminum;
    a second oxygen-containing portion provided on the first high dielectric insulating portion;
    a second high dielectric insulating portion provided on the second oxygen-containing portion and having an oxide-containing yttrium, hafnium or aluminum;
    a third oxygen-containing portion provided on the second high dielectric insulating portion; and
    a second film provided on the third oxygen-containing portion.

2. The device according to claim 1, wherein the second film contains a metal.

* * * * *